(12) United States Patent
Hirota et al.

(10) Patent No.: US 12,429,534 B2
(45) Date of Patent: Sep. 30, 2025

(54) DISPLACEMENT DETECTION APPARATUS, DISPLACEMENT DETECTION SYSTEM, PARK LOCK SYSTEM, AND PEDAL SYSTEM

(71) Applicant: TDK CORPORATION, Tokyo (JP)

(72) Inventors: Yohei Hirota, Tokyo (JP); Naoki Ohta, Tokyo (JP)

(73) Assignee: TDK CORPORATION, Tokyo (JP)

( * ) Notice: Subject to any disclaimer, the term of this patent is extended or adjusted under 35 U.S.C. 154(b) by 396 days.

(21) Appl. No.: 17/886,980

(22) Filed: Aug. 12, 2022

(65) Prior Publication Data

US 2023/0112733 A1    Apr. 13, 2023

(30) Foreign Application Priority Data

Sep. 24, 2021   (JP) ................................ 2021-156073

(51) Int. Cl.
| | |
|---|---|
| *G01R 33/07* | (2006.01) |
| *G01B 7/00* | (2006.01) |
| *G01B 7/30* | (2006.01) |
| *G01D 5/14* | (2006.01) |

(52) U.S. Cl.
CPC ........... *G01R 33/072* (2013.01); *G01B 7/003* (2013.01); *G01D 5/145* (2013.01); *G01B 7/30* (2013.01)

(58) Field of Classification Search
CPC ........ G01R 33/072; G01B 7/003; G01B 7/30; G01D 5/145
See application file for complete search history.

(56) References Cited

U.S. PATENT DOCUMENTS

| | | | |
|---|---|---|---|
| 10,252,747 B2 | 4/2019 | Shiino | |
| 11,333,717 B2 * | 5/2022 | Nagata | ............... G01R 33/0005 |
| 11,359,908 B2 | 6/2022 | Cai et al. | |
| 2017/0261342 A1 * | 9/2017 | Nagata | ................... G01D 5/145 |
| 2021/0288557 A1 * | 9/2021 | Komasaki | .......... G01R 33/1292 |

FOREIGN PATENT DOCUMENTS

| | | |
|---|---|---|
| JP | 2000-74615 A | 3/2000 |
| JP | 2002-194317 A | 7/2002 |
| JP | 2016-114524 A | 6/2016 |
| JP | 2020-46278 A | 3/2020 |

* cited by examiner

*Primary Examiner* — Reena Aurora
(74) *Attorney, Agent, or Firm* — Oliff PLC

(57) ABSTRACT

A displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body entirely overlaps the first portion in the first direction. The second soft magnetic body entirely overlaps the second portion in the first direction. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction.

25 Claims, 32 Drawing Sheets

DISPLACEMENT DETECTION APPARATUS, DISPLACEMENT DETECTION SYSTEM, PARK LOCK SYSTEM, AND PEDAL SYSTEM

CROSS-REFERENCE TO RELATED APPLICATIONS

This application claims priority from Japanese Patent Application No. 2021-156073 filed on Sep. 24, 2021, the entire contents of which are incorporated herein by reference.

BACKGROUND

The technology relates to a displacement detection apparatus, a displacement detection system, a park lock system, and a pedal system that each include a magnetic detection element.

Displacement detection apparatuses, including angle sensors, that detect changes in angle of an object to be detected have been widely used in various applications including detection of a rotational position of a steering wheel or a power steering motor in an automobile. Reference is made to, for example, Japanese Unexamined Patent Application Publication No. 2020-046278.

SUMMARY

A displacement detection apparatus according to one embodiment of the technology includes a magnetic field generator, a first soft magnetic body, a second soft magnetic body, and a magnetic detection element. The magnetic field generator extends along a plane orthogonal to a first direction and includes a first portion and a second portion. The first soft magnetic body is disposed to entirely overlap the first portion in the first direction. The second soft magnetic body is disposed to entirely overlap the second portion in the first direction. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction.

A displacement detection system according to one embodiment of the technology includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is disposed to entirely overlap the first portion in the first direction. The second soft magnetic body is disposed to entirely overlap the second portion in the first direction. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first support supports the magnetic field generator. The second support supports the magnetic detection element.

A park lock system according to one embodiment of the technology includes a displacement detection system. The displacement detection system includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is disposed to entirely overlap the first portion in the first direction. The second soft magnetic body is disposed to entirely overlap the second portion in the first direction. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first support supports the magnetic field generator. The second support supports the magnetic detection element.

A pedal system according to one embodiment of the technology includes a displacement detection system. The displacement detection system includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is disposed to entirely overlap the first portion in the first direction. The second soft magnetic body is disposed to entirely overlap the second portion in the first direction. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first support supports the magnetic field generator. The second support supports the magnetic detection element.

A displacement detection apparatus according to one embodiment of the technology includes a magnetic field generator, a first soft magnetic body, a second soft magnetic body, and a magnetic detection element. The magnetic field generator extends along a plane orthogonal to a first direction and includes a first portion and a second portion. The first soft magnetic body is magnetically coupled to the first portion. The second soft magnetic body is magnetically coupled to the second portion. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first soft magnetic body includes a first opposed surface opposed to the second soft magnetic body in a second direction orthogonal to the first direction. The first opposed surface includes a first endpoint and a second endpoint located at opposite ends of the first opposed surface in a third direction orthogonal to both the first direction and the second direction. A first central angle formed by the first endpoint, the rotation axis, and the second endpoint is greater than or equal to 90 degrees and less than 180 degrees. The second soft magnetic body includes a second opposed surface opposed to the first soft magnetic body in the second direction. The second opposed surface includes a third endpoint and a fourth endpoint located at opposite ends of the second opposed surface in the third direction. A second central angle formed by the third endpoint, the rotation axis, and the fourth endpoint is greater than or equal to 90 degrees and less than 180 degrees.

A displacement detection system according to one embodiment of the technology includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is magnetically coupled to the first portion. The second soft magnetic body is magnetically coupled to the second portion. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first soft magnetic body includes a first opposed surface opposed to the second soft magnetic body in a second direction orthogonal to the first direction. The first opposed surface includes a first endpoint and a second endpoint located at opposite ends of the first opposed surface in a third direction orthogonal to both the first direction and the second direction. A first central angle formed by the first endpoint, the rotation axis, and the second endpoint is greater than or equal to 90 degrees and less than 180 degrees. The second soft magnetic body includes a second opposed surface opposed to the first soft magnetic body in the second direction. The second opposed surface includes a third endpoint and a fourth endpoint located at opposite ends of the second opposed surface in the third direction. A second central angle formed by the third endpoint, the rotation axis, and the fourth endpoint is greater than or equal to 90 degrees and less than 180 degrees. The first support supports the magnetic field generator. The second support supports the magnetic detection element.

A park lock system according to one embodiment of the technology includes a displacement detection system. The displacement detection system includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is magnetically coupled to the first portion. The second soft magnetic body is magnetically coupled to the second portion. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first soft magnetic body includes a first opposed surface opposed to the second soft magnetic body in a second direction orthogonal to the first direction. The first opposed surface includes a first endpoint and a second endpoint located at opposite ends of the first opposed surface in a third direction orthogonal to both the first direction and the second direction. A first central angle formed by the first endpoint, the rotation axis, and the second endpoint is greater than or equal to 90 degrees and less than 180 degrees. The second soft magnetic body includes a second opposed surface opposed to the first soft magnetic body in the second direction. The second opposed surface includes a third endpoint and a fourth endpoint located at opposite ends of the second opposed surface in the third direction. A second central angle formed by the third endpoint, the rotation axis, and the fourth endpoint is greater than or equal to 90 degrees and less than 180 degrees. The first support supports the magnetic field generator. The second support supports the magnetic detection element.

A pedal system according to one embodiment of the technology includes a displacement detection system. The displacement detection system includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is magnetically coupled to the first portion. The second soft magnetic body is magnetically coupled to the second portion. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first soft magnetic body includes a first opposed surface opposed to the second soft magnetic body in a second direction orthogonal to the first direction. The first opposed surface includes a first endpoint and a second endpoint located at opposite ends of the first opposed surface in a third direction orthogonal to both the first direction and the second direction. A first central angle formed by the first endpoint, the rotation axis, and the second endpoint is greater than or equal to 90 degrees and less than 180 degrees. The second soft magnetic body includes a second opposed surface opposed to the first soft magnetic body in the second direction. The second opposed surface includes a third endpoint and a fourth endpoint located at opposite ends of the second opposed surface in the third direction. A second central angle formed by the third endpoint, the rotation axis, and the fourth endpoint is greater than or equal to 90 degrees and less than 180 degrees. The first support supports the magnetic field generator. The second support supports the magnetic detection element.

A displacement detection apparatus according to one embodiment of the technology includes a magnetic field generator, a first soft magnetic body, a second soft magnetic body, and a magnetic detection element. The magnetic field generator extends along a plane orthogonal to a first direction and includes a first portion and a second portion. The first soft magnetic body is magnetically coupled to the first portion. The second soft magnetic body is magnetically coupled to the second portion. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first soft magnetic body includes a first opposed surface opposed to the second soft magnetic body in a second direction orthogonal to the first direction. The second soft magnetic body includes a second opposed surface opposed to the first soft magnetic body in the second direction. The first opposed surface and the second opposed surface are curved to protrude toward each other, or curved to be recessed away from each other.

A displacement detection system according to one embodiment of the technology includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is magnetically coupled to the first portion. The second soft magnetic body is magnetically coupled to the second portion. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first soft magnetic body includes a first opposed surface opposed to the second soft magnetic body in a second direction orthogonal to the first direction. The second soft magnetic body includes a second opposed surface opposed to the first soft magnetic body in the second direction. The first opposed surface and the second opposed surface are curved to protrude toward each other, or curved to be recessed away from each other. The first support supports the magnetic field generator. The second support supports the magnetic detection element.

A park lock system according to one embodiment of the technology includes a displacement detection system. The displacement detection system includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is magnetically coupled to the first portion. The second soft magnetic body is magnetically coupled to the second portion. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first soft magnetic body includes a first opposed surface opposed to the second soft magnetic body in a second direction orthogonal to the first direction. The second soft magnetic body includes a second opposed surface opposed to the first soft magnetic body in the second direction. The first opposed surface and the second opposed surface are curved to protrude toward each other, or curved to be recessed away from each other. The first support supports the magnetic field generator. The second support supports the magnetic detection element.

A pedal system according to one embodiment of the technology includes a displacement detection system. The displacement detection system includes a displacement detection apparatus, a first support, and a second support. The displacement detection apparatus includes a magnetic field generator, a first soft magnetic body, a second soft magnetic body, and a magnetic detection element. The magnetic field generator extends along a plane orthogonal to a first direction and includes a first portion and a second portion. The first soft magnetic body is magnetically coupled to the first portion. The second soft magnetic body is magnetically coupled to the second portion. The magnetic detection element is disposed in a region between the first soft magnetic body and the second soft magnetic body, and is configured to be subjected to a magnetic field generated by the magnetic field generator. The magnetic field generator, the first soft magnetic body, and the second soft magnetic body are provided to be integrally rotatable, with respect to the magnetic detection element, around a rotation axis extending in the first direction. The first soft magnetic body includes a first opposed surface opposed to the second soft magnetic body in a second direction orthogonal to the first direction. The second soft magnetic body includes a second opposed surface opposed to the first soft magnetic body in the second direction. The first opposed surface and the second opposed surface are curved to protrude toward each other, or curved to be recessed away from each other. The first support supports the magnetic field generator. The second support supports the magnetic detection element.

According to the displacement detection apparatus, the displacement detection system, the park lock system, and the pedal system in one embodiment of the technology, the entire first soft magnetic body and the entire second soft magnetic body overlap the magnetic field generator in the first direction, and the magnetic detection element is disposed in the region between the first soft magnetic body and the second soft magnetic body. In another embodiment, the first central angle formed by the first and second endpoints of the first opposed surface of the first soft magnetic body and the rotation axis is greater than or equal to 90 degrees and less than 180 degrees, and the second central angle formed by the third and fourth endpoints of the second opposed surface of the second soft magnetic body and the rotation axis is greater than or equal to 90 degrees and less than 180 degrees. In still another embodiment, the first opposed surface of the first soft magnetic body and the second opposed surface of the second soft magnetic body are curved to protrude toward each other, or curved to be recessed away from each other. Such configurations each reduce an influence of placement positions of the magnetic field generator and the magnetic detection element on a detection error of the magnetic detection element.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
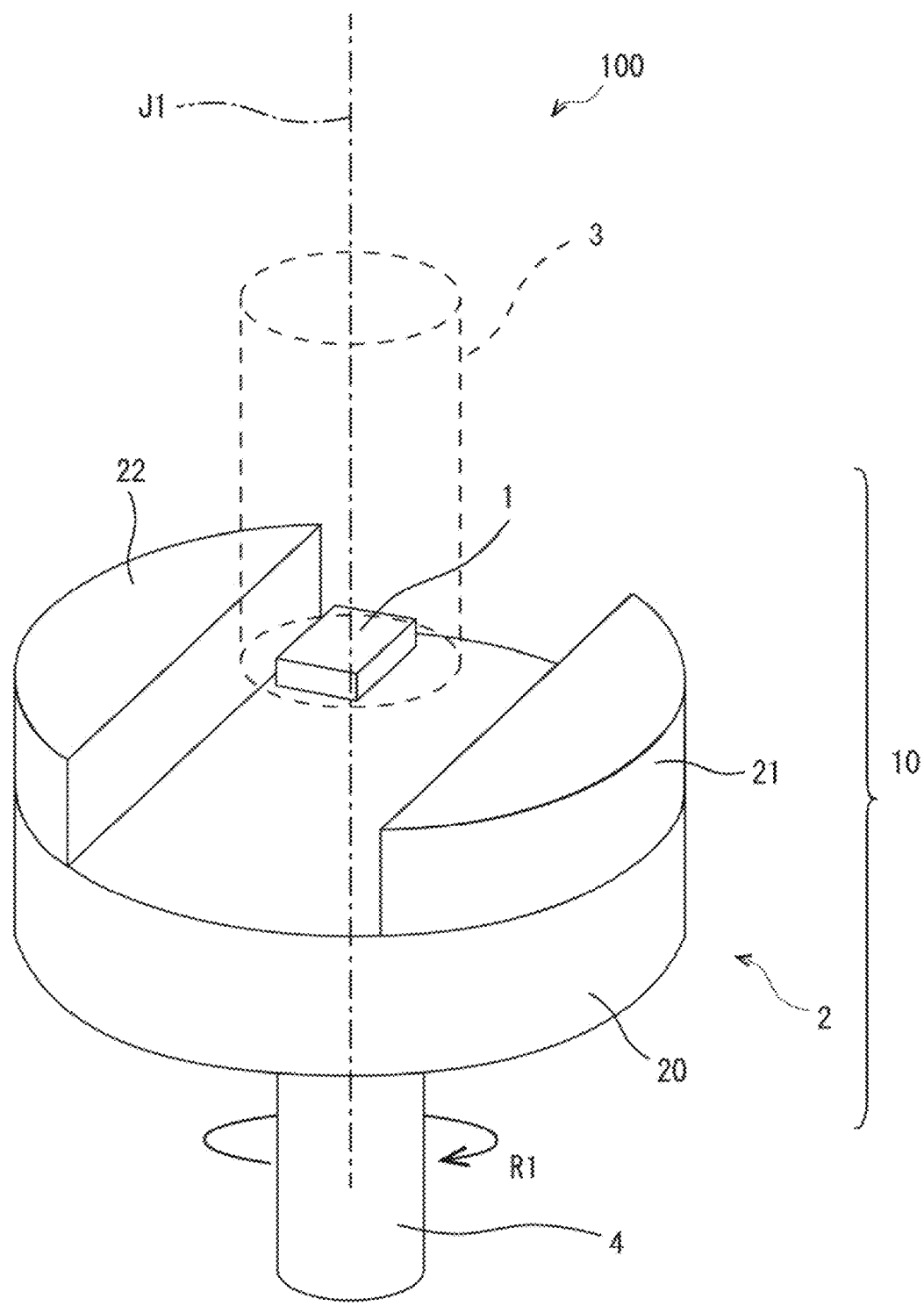
FIG. 1 is a schematic perspective diagram illustrating an overall configuration example of an angle detection system according to one example embodiment of the technology.

A further improvement in detection accuracy is demanded of a displacement detection apparatus, a displacement detection system, a park lock system, and a pedal system.

It is desirable to provide a displacement detection apparatus, a displacement detection system, a park lock system, and a pedal system that each achieve high detection accuracy.

In the following, some example embodiments of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

1. Example Embodiment
2. Examples
3. Application Examples
4. Other Modification Examples

1. EXAMPLE EMBODIMENT

[Configuration of Angle Detection System 100]

Figure 2:
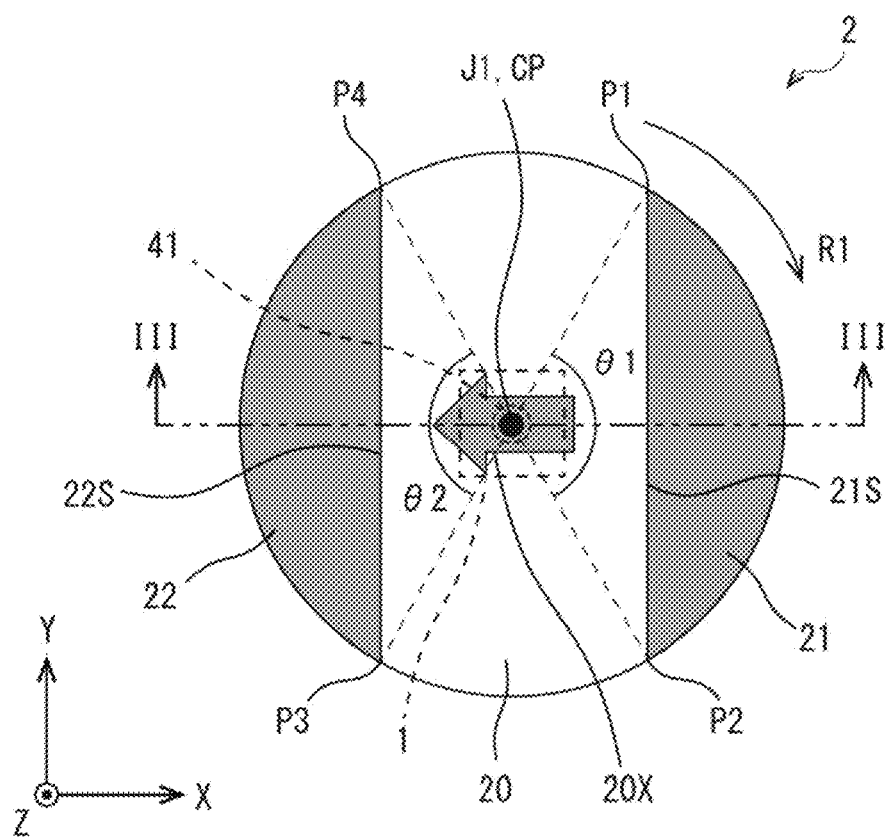
FIG. 2 is a schematic plan view of a magnetic field generation module of an angle detection apparatus illustrated in FIG. 1.
Figure 3:
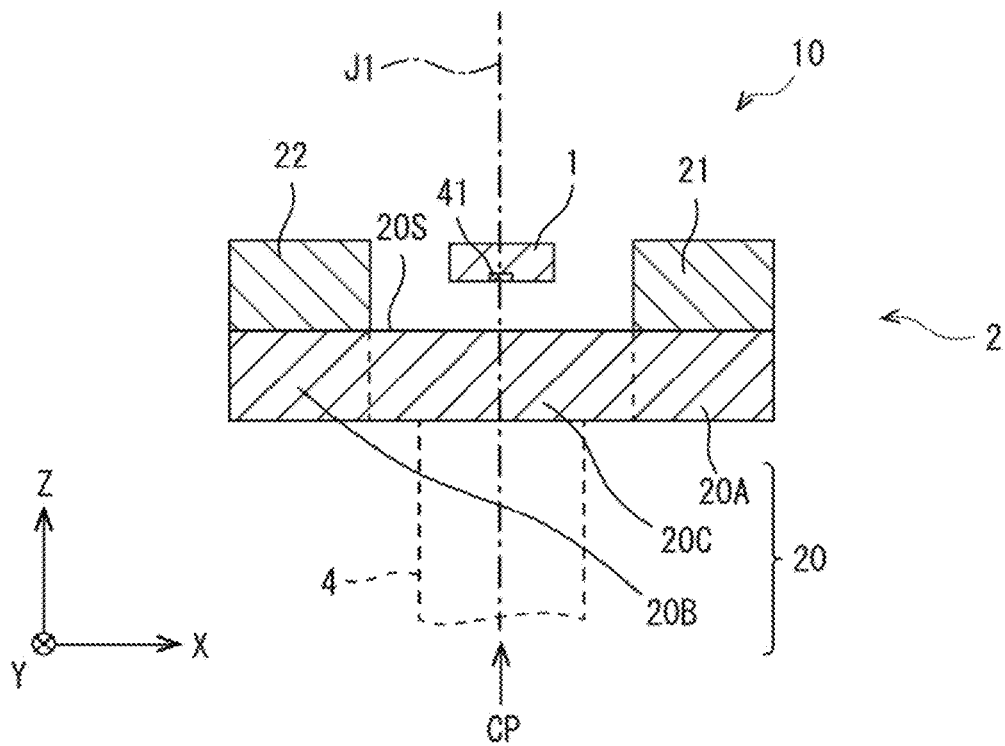
FIG. 3 is a cross-sectional view of the angle detection apparatus illustrated in FIG. 1.

First, with reference to FIGS. 1 to 3, a description is given of an angle detection system 100 according to one example embodiment of the technology.

The angle detection system 100 may correspond to a specific but non-limiting example of a "displacement detection system" according to one embodiment of the technology.

FIG. 1 is a perspective diagram illustrating an overall configuration example of the angle detection system 100. As illustrated in FIG. 1, the angle detection system 100 includes, for example, an angle detection apparatus 10, a support 3, and a support 4. The angle detection apparatus 10 may include a sensor module 1 and a magnetic field generation module 2, for example. The sensor module 1 may be supported by the support 3, for example. The magnetic field generation module 2 may be supported by the support 4, for example. In the angle detection system 100, the sensor module 1 and the magnetic field generation module 2 may be disposed adjacent to each other in a Z-axis direction. In the present example embodiment, the Z-axis direction is a direction along a rotation axis J1 of the magnetic field generation module 2. The magnetic field generation module 2 may be provided to be rotatable with respect to the sensor module 1 in a rotation direction R1 around the rotation axis J1, for example.

FIG. 2 is a schematic plan view of the magnetic field generation module 2 of the angle detection apparatus 10 illustrated in FIG. 1. FIG. 2 illustrates a positional relationship between components of the magnetic field generation module 2 in a plane orthogonal to the rotation axis J1 along the Z-axis direction. Note that in FIG. 2, the sensor module 1 is also illustrated in broken lines. FIG. 3 is a cross-sectional view of the angle detection apparatus 10. Note that in FIG. 3, the support 4 is also illustrated in broken lines. FIG. 3 illustrates a cross section along line III-III in FIG. 2 as viewed in the direction of the arrows. It is to be noted that, as used herein, the term "orthogonal" encompasses not only being completely orthogonal, i.e., intersecting at 90°, but also being substantially orthogonal, i.e., intersecting at 90°±about 5°, for example. The schematic plan view illustrated in FIG. 2 may therefore represent a plane at an angle slightly different from 90° with respect to the rotation axis J1. FIG. 2 illustrates the magnetic field generation module 2 as viewed from the sensor module 1. Note that in FIG. 2, an outline of a magnetic detection element 41 included in the sensor module 1 is also depicted in a broken line. The magnetic field generation module 2 is provided to be rotatable, with respect to the magnetic detection element 41, around the rotation axis J1 extending along the Z-axis direction. The angle detection system 100 may be a system detecting, for example, a rotation angle of a rotary member that rotates, and may be applicable as a throttle position sensor that detects a throttle valve position of an internal combustion engine to be installed in a vehicle such as an automobile, for example.

[Magnetic Field Generation Module 2]

As illustrated in FIGS. 1 to 3, the magnetic field generation module 2 may include a magnet 20 as a magnetic field generator, a first yoke 21, and a second yoke 22, for example. The first yoke 21 and the second yoke 22 may be spaced from each other along an XY plane orthogonal to the Z-axis. In the present example embodiment, the first yoke 21 and the second yoke 22 are opposed to each other in an X-axis direction. Further, in the present example embodiment, a first opposed surface 21S and a second opposed surface 22S, both described later, may be parallel to each other and extend in a Y-axis direction. The X-axis direction, the Y-axis direction, and the Z-axis direction are orthogonal to each other. The magnet 20 may constitute a magnetic field generator that generates a magnetic field to be detected, which will hereinafter be referred to as a "detection-target magnetic field", that the sensor module 1 is to detect. Examples of a material of the magnet 20 may include a neodymium-based magnet material such as NdFeB and a rare-earth magnet material such as SmCo. The magnet 20 may be a circular plate-shaped ferromagnetic body extending along the XY plane orthogonal to the Z-axis direction. The magnet 20 may have a substantially circular outer edge in a plan view as viewed from the sensor module 1, for example. As illustrated in FIG. 3, the magnet 20 may include a first portion 20A, a second portion 20B, and a third portion 20C, for example. The first yoke 21 may be provided on a top surface 20S of the first portion 20A. The second yoke 22 may be provided on the top surface 20S of the second portion 20B. The third portion 20C may be an intermediate portion between the first portion 20A and the second portion 20B. The magnetic detection element 41 of the sensor module 1 may be positioned to overlap the third portion 20C in the Z-axis direction. The magnet 20 may be magnetized, for example, entirely in the X-axis direction along the XY plane. An arrow 20X in FIG. 2 indicates the magnetizing direction of the magnet 20. The magnet 20 may be supported by the support 4, and may be rotatable with respect to the sensor module 1 in the rotation direction R1 (see FIGS. 1 and 2) around the rotation axis J1, for example.

The first yoke 21 is disposed to entirely overlap the first portion 20A in the Z-axis direction. The second yoke 22 is disposed to entirely overlap the second portion 20B in the Z-axis direction. The first yoke 21 and the second yoke 22 may each include, for example, a soft ferromagnetic material such as permalloy (NiFe).

The first yoke 21 may correspond to a specific but non-limiting example of a "first soft magnetic body" according to one embodiment of the technology. The second yoke 22 may correspond to a specific but non-limiting example of a "second soft magnetic body" according to one embodiment of the technology.

The first yoke 21 includes the first opposed surface 21S opposed to the second yoke 22. The second yoke 22 includes the second opposed surface 22S opposed to the first yoke 21.

The Z-axis direction in the present example embodiment may correspond to a specific but non-limiting example of a "first direction" according to one embodiment of the technology. The X-axis direction in the present example embodiment may correspond to a specific but non-limiting example of a "second direction" according to one embodiment of the technology. The Y-axis direction in the present example embodiment may correspond to a specific but non-limiting example of a "third direction" according to one embodiment of the technology.

The first opposed surface 21S includes a first endpoint P1 and a second endpoint P2 located at opposite ends of the first opposed surface 21S in the Y-axis direction. FIG. 2 illustrates an example in which the first endpoint P1 and the second endpoint P2 coincide with the outer edge of the magnet 20 in the Z-axis direction. However, the first endpoint P1 and the second endpoint P2 do not have to coincide with the outer edge of the magnet 20 in the Z-axis direction. A first central angle θ1 formed by the first endpoint P1, a center position CP of the magnet 20 in the XY plane orthogonal to the rotation axis J1, and the second endpoint P2 is greater than or equal to 90 degrees and less than 180 degrees, for example. In some embodiments, the first central angle θ1 may be greater than or equal to 110 degrees and less than 180 degrees. The center position CP of the magnet 20 may coincide with the rotation axis J1, for example.

The second opposed surface 22S includes a third endpoint P3 and a fourth endpoint P4 located at opposite ends of the second opposed surface 22S in the Y-axis direction. In the example illustrated in FIG. 2, the third endpoint P3 and the fourth endpoint P4 coincide with the outer edge of the magnet 20 in the Z-axis direction. However, the third endpoint P3 and the fourth endpoint P4 do not have to coincide with the outer edge of the magnet 20 in the Z-axis direction. A second central angle θ2 formed by the third endpoint P3, the center position CP of the magnet 20, and the fourth endpoint P4 is greater than or equal to 90 degrees and less than 180 degrees, for example. In some embodiments, the second central angle θ2 may be greater than or equal to 110 degrees and less than 180 degrees. Note that the first central angle θ1 and the second central angle θ2 may be substantially equal. As used therein, the wording "substantially equal" is meant to allow for a difference on the order of $\pm 1°$ resulting from a manufacturing error, for example.

The first yoke 21 and the second yoke 22 may be disposed around the rotation axis J1 and spaced from each other. For example, a distance between the first yoke 21 and the rotation axis J1 and a distance between the second yoke 22 and the rotation axis J1 may be equal. The "distance between the first yoke 21 and the rotation axis J1" and the "distance between the second yoke 22 and the rotation axis J1" may respectively refer to, as illustrated in FIG. 2, for example, a distance between the first opposed surface 21S and the rotation axis J1 and a distance between the second opposed surface 22S and the rotation axis J1 in the XY plane orthogonal to the rotation axis J1, for example. Further, the first yoke 21 and the second yoke 22 may be substantially identical in material, shape, and size. This makes it easier for an orientation of the detection-target magnetic field at and near the sensor module 1 to be aligned in the X-axis direction, and as a result, an error of a rotation angle of the magnetic field generation module 2 to be detected by the sensor module 1 is reduced even in a case where the sensor module 1 is at a position deviated from the rotation axis J1. In one example, the first yoke 21 and the second yoke 22 may be provided at rotationally symmetrical positions with respect to the rotation axis J1 so as to be opposed to each other with the rotation axis J1 therebetween, for example. Note that in some embodiments of the technology, the first yoke 21 and the second yoke 22 may be different from each other in at least one of material, shape, or size.

As described above, the first yoke 21 is positioned to entirely overlap the first portion 20A of the magnet 20 in the Z-axis direction. Likewise, the second yoke 22 is positioned to entirely overlap the second portion 20B of the magnet 20 in the Z-axis direction. In addition, the first yoke 21 and the second yoke 22 may each be fixed to be in contact with the top surface 20S of the magnet 20. Note that the first yoke 21 and the second yoke 22 may each be spaced from the top surface 20S of the magnet 20. In one example embodiment, the first yoke 21 and the second yoke 22 are each magnetically coupled to the magnet 20.

[Sensor Module 1]

The sensor module 1 may be disposed on the rotation axis J1, for example. A center position of the sensor module 1 in a plane orthogonal to the rotation axis J1 may coincide with the rotation axis J1. The sensor module 1 may include at least one magnetic detection element 41. The magnetic detection element 41 is provided in a region between the first yoke 21 and the second yoke 22 in the X-axis direction. In one example, the magnetic detection element 41 may be disposed in a region overlapping the third portion 20C of the magnet 20 in the Z-axis direction. The magnetic detection element 41 is thus configured to be subjected to the detection-target magnetic field generated by the magnet 20. The magnetic detection element 41 may further be positioned to overlap both the first yoke 21 and the second yoke 22 in the X-axis direction. Alternatively, the magnetic detection element 41 may be positioned to overlap neither the first yoke 21 nor the second yoke 22 in the X-axis direction. However, if the magnetic detection element 41 is positioned to overlap the first yoke 21 and the second yoke 22 in the X-axis direction, it is possible to further enhance a magnetic flux density to be exerted on the magnetic detection element 41. In addition, it becomes easier to block a magnetic flux of an unwanted magnetic field coming from outside. Note that the magnetic detection element 41 may be positioned to be spaced from all of the magnet 20, the first yoke 21, and the second yoke 22.

The first yoke 21 and the second yoke 22 are provided to be rotatable integrally with the magnet 20 around the rotation axis J1. In other words, the magnet 20, the first yoke 21, and the second yoke 22 are provided to be integrally rotatable around the rotation axis J1 with respect to the magnetic detection element 41.

The magnetic detection element 41 may be an element that changes in resistance or output in accordance with an intensity and/or a direction, at the position of the magnetic detection element 41, of the detection-target magnetic field generated by the magnetic field generation module 2, for example. Examples of the magnetic detection element 41 include a magnetoresistive effect element and a Hall element. In a case where the magnetic detection element 41 is a magnetoresistive effect element, the resistance of the magnetic detection element 41 changes in accordance with the intensity and the direction of the detection-target magnetic field in the XY plane orthogonal to the rotation axis J1. In a case where the magnetic detection element 41 is a Hall element, the output of the magnetic detection element 41 changes in accordance with the intensity of the detection-target magnetic field in the direction of the rotation axis J1. The magnetic detection element 41 may be placed to have a sensitive axis along the XY plane orthogonal to the rotation axis J1, for example. The position of the magnetic detection element 41 in the XY plane orthogonal to the rotation axis J1 may coincide with the center position CP of the magnet 20 in the XY plane orthogonal to the rotation axis J1.

[Supports 3 and 4]

The support 3 may support the sensor module 1, and the support 4 may support the magnet 20. The supports 3 and 4 may both have a substantially cylindrical shape, for example. In a case where the angle detection system 100 is applied as the throttle position sensor described above, the support 4 may be coupled to, for example, a rotary shaft of the throttle valve which is a rotating body, and the support 3 may be fixed to a component such as a frame of the internal combustion engine, for example. The first yoke 21 and the second yoke 22 may be directly or indirectly fixed to the magnet 20. The magnet 20, the first yoke 21, and the second yoke 22 may be provided to be rotatable integrally with the support 4 in the rotation direction R1.

[Operation of Angle Detection System 100]

In the angle detection system 100, when a rotating body (e.g., the rotary shaft of the throttle valve) to which the support 4 is attached rotates, the support 4 and the magnetic field generation module 2 rotate integrally in the rotation direction R1. This causes the orientation of the detection-target magnetic field (magnetic flux) passing through the sensor module 1 to change periodically. As a result, the resistance or output of the magnetic detection element 41 of the sensor module 1 changes in accordance with the rotation angle of the magnetic field generation module 2. It is thus possible to determine, from the resistance value or the output value of the magnetic detection element 41, the rotation angle of the rotating body to which the magnetic field generation module 2 is fixed.

[Workings and Effects of Angle Detection System 100]

The angle detection apparatus 10 of the angle detection system 100 according to the present example embodiment described above may include the sensor module 1 and the magnetic field generation module 2. The sensor module 1 includes the magnetic detection element 41. The magnetic field generation module 2 includes the magnet 20, the first yoke 21, and the second yoke 22. The magnet 20 generates a magnetic field to be applied to the magnetic detection element 41. The first yoke 21 entirely overlaps the first portion 20A of the magnet 20 in the Z-axis direction. The second yoke 22 entirely overlaps the second portion 20B of the magnet 20 in the Z-axis direction. The magnetic detection element 41 is disposed in the region between the first yoke 21 and the second yoke 22.

As described above, in the angle detection apparatus 10, the first yoke 21 and the second yoke 22 each entirely overlap the magnet 20 in the Z-axis direction, and the magnetic detection element 41 is disposed in the region between the first yoke 21 and the second yoke 22. In this case, even if relative positions of the magnet 20 and the magnetic detection element 41 become somewhat misaligned with respect to each other, the detection-target magnetic field is effectively guided in the X-axis direction by the first yoke 21 and the second yoke 22. Accordingly, an influence of placement positions of the magnet 20 and the magnetic detection element 41 on a detection error of the magnetic detection element 41 is reduced as compared with a case without the first yoke 21 and the second yoke 22.

Consequently, with the angle detection system 100, accuracy of angle detection is less affected even if some misalignment occurs between the relative positions of the magnet 20 and the magnetic detection element 41 with respect to each other. In other words, the angle detection system 100 is able to achieve high accuracy of angle detection even if the accuracy of placement positions of the sensor module 1 and the magnetic field generation module 2 deteriorates.

Further, the provision of the first yoke 21 and the second yoke 22 makes it possible to block a disturbance magnetic field including a magnetic field component along the XY plane, and to thereby reduce the disturbance magnetic field to be exerted on the magnetic detection element 41. In other words, the first yoke 21 and the second yoke 22 each serve as a magnetic shield to protect the magnetic detection element 41. Accordingly, it is possible to reduce an influence of the disturbance magnetic field on the detection angle error as compared with the case without the first yoke 21 and the second yoke 22.

In the present example embodiment, in particular, the magnetic detection element 41 may be positioned to overlap both the first yoke 21 and the second yoke 22 in the X-axis direction. This makes it possible to further reduce the influence of the disturbance magnetic field on the detection angle error.

2. EXAMPLES

The angle detection apparatus 10 according to the foregoing example embodiment illustrated in FIG. 1 was examined for a relationship between the angle of a disturbance magnetic field with respect to the magnetizing direction of the magnet and the detection angle error.

Example 1-1

Figure 4A:
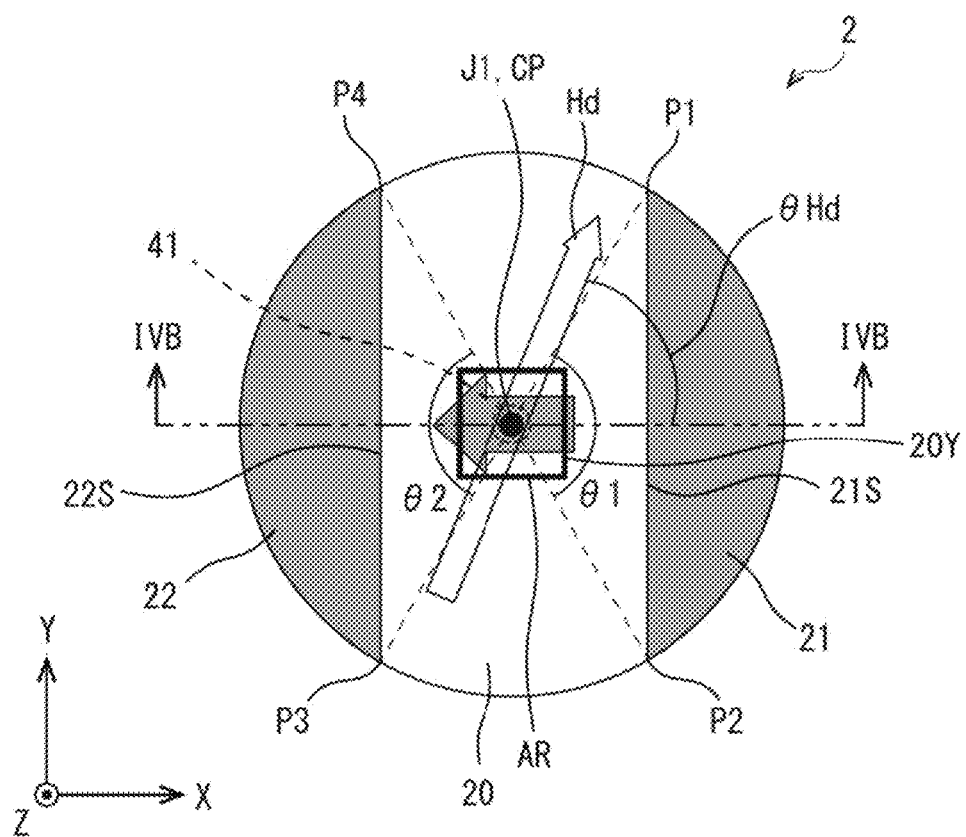
FIG. 4A is an explanatory diagram describing a direction of application of a disturbance magnetic field to an angle detection apparatus of Example.
Figure 4B:
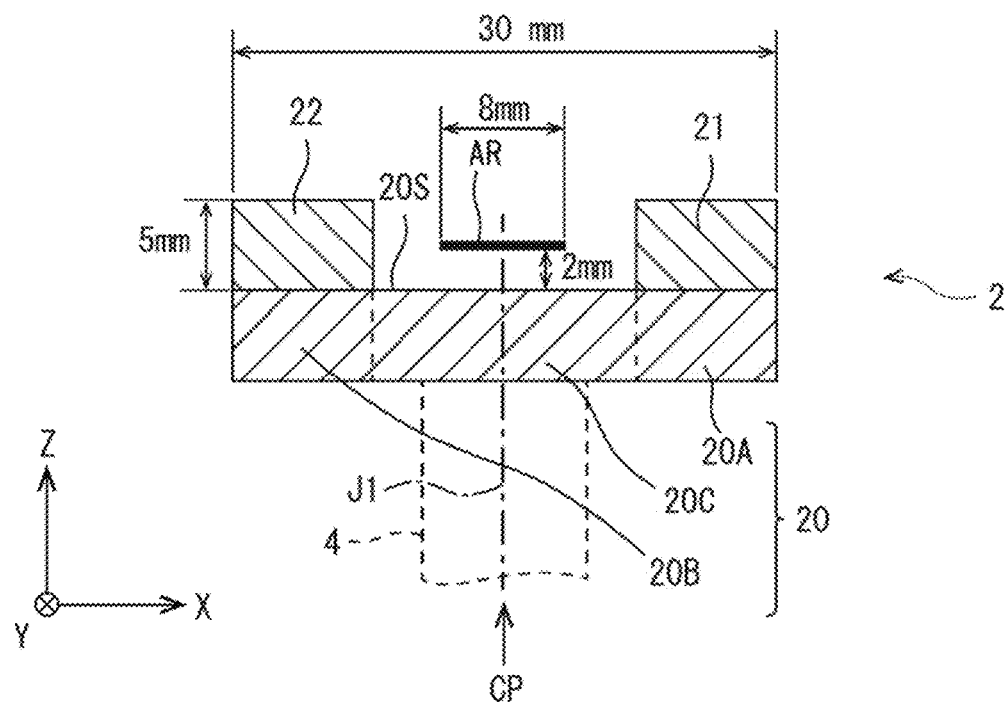
FIG. 4B is a cross-sectional view of the angle detection apparatus of Example.

Here, as illustrated in FIG. 4A, determined by simulation were an in-plane magnetic flux density and an applied magnetic field direction in a calculation-target region AR in a case of applying a disturbance magnetic field Hd to the angle detection apparatus 10 of the foregoing example embodiment. As illustrated in FIGS. 4A and 4B, the calculation-target region AR was a region centered around the center position CP and having a size of 8 mm×8 mm. In this example, the in-plane magnetic flux density and the applied magnetic field direction at a position 2 mm away from top surface 20S of the magnet 20 in a +Z direction were calculated. Note that FIG. 4B illustrates a cross section along line IVB-IVB in FIG. 4A as viewed in the direction of the arrows. As illustrated in FIG. 4A, the direction of application of the disturbance magnetic field Hd was set at an angle θHd with respect to the X-axis serving as a reference direction. The magnetizing direction of the magnet 20 was set to the X-axis direction. Specifically, the disturbance magnetic field Hd was applied at angles θHd of five levels: 0, 30, 45, 60, and 90 degrees, and the in-plane magnetic flux density and the applied magnetic field direction at each angle θHd were calculated. The first central angle θ1 and the second central angle θ2 (FIG. 4A) were both set to 90 degrees. Thicknesses of the first yoke 21 and the second yoke 22 were both set to 5 mm (FIG. 4B).

The in-plane magnetic flux density in the calculation-target region AR was determined in accordance with Expression 1 below after determining a magnetic flux density Bx in the X-axis direction and a magnetic flux density By in the Y-axis direction at each of coordinates along the XY plane.

$$\{(Bx)^2+(By)^2\}^{0.5} \quad \text{(Expression 1)}$$

The applied magnetic field direction in the calculation-target region AR was determined in accordance with Expression 2 below. The applied magnetic field direction given by Expression 2 represents an angle with respect to an ideal reference direction, i.e., the X-axis direction which is the magnetizing direction of the magnet 20, and can therefore be said to be an angle error.

$$\arctan(By/Bx) \quad \text{(Expression 2)}$$

Example 1-2

The first central angle θ1 and the second central angle θ2 (FIG. 4A) were both set to 120 degrees. The angle detection apparatus 10 similar to that of Example 1-1 except for this difference was prepared to calculate the in-plane magnetic flux density and the applied magnetic field direction in the calculation-target region AR in the case of applying the disturbance magnetic field Hd similar to that in Example 1-1 to this angle detection apparatus 10.

Comparative Example 1-1

The angle detection apparatus 10 similar to that of Example 1-1 except that the magnetic field generation module 2 included neither the first yoke 21 nor the second yoke 22 was prepared to calculate the in-plane magnetic flux density and the applied magnetic field direction in the calculation-target region AR in the case of applying the disturbance magnetic field Hd similar to that in Example 1-1 to this angle detection apparatus 10.

[Comparison of In-Plane Magnetic Flux Density Distribution]

Figure 5A:
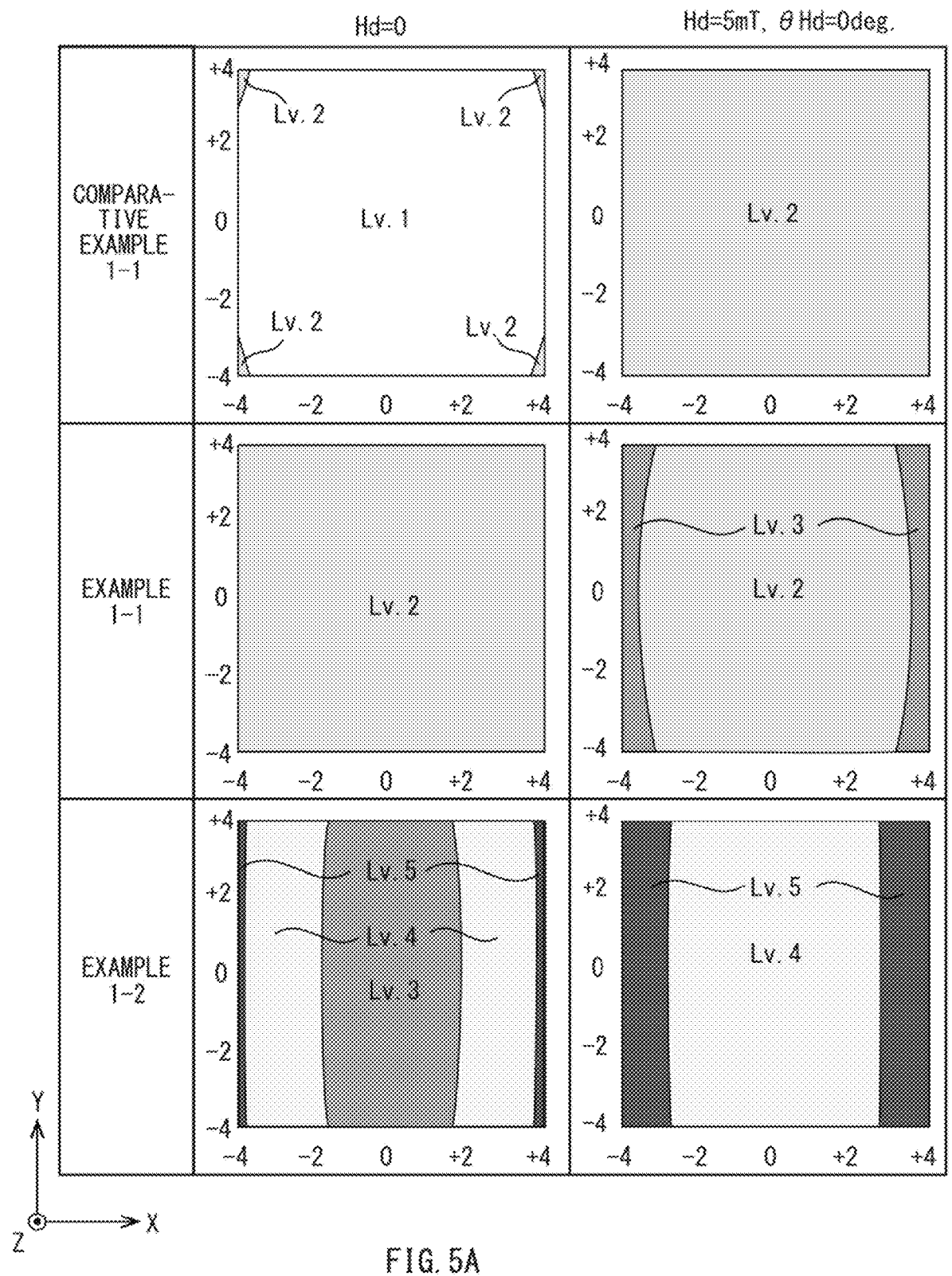
FIG. 5A is a first characteristic diagram illustrating in-plane magnetic flux density distributions of angle detection apparatuses of Examples.
Figure 5B:
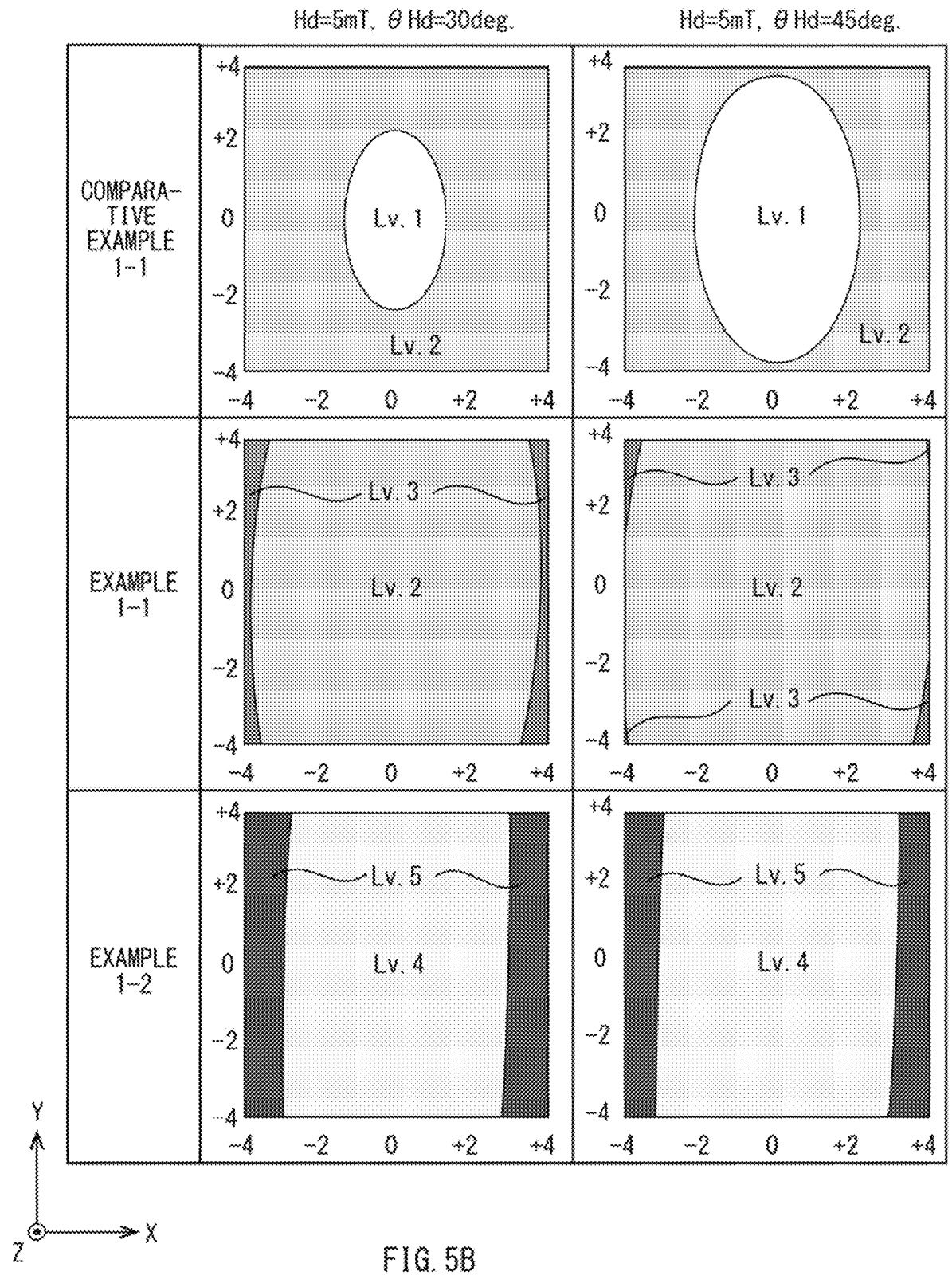
FIG. 5B is a second characteristic diagram illustrating the in-plane magnetic flux density distributions of the angle detection apparatuses of Examples.
Figure 5C:
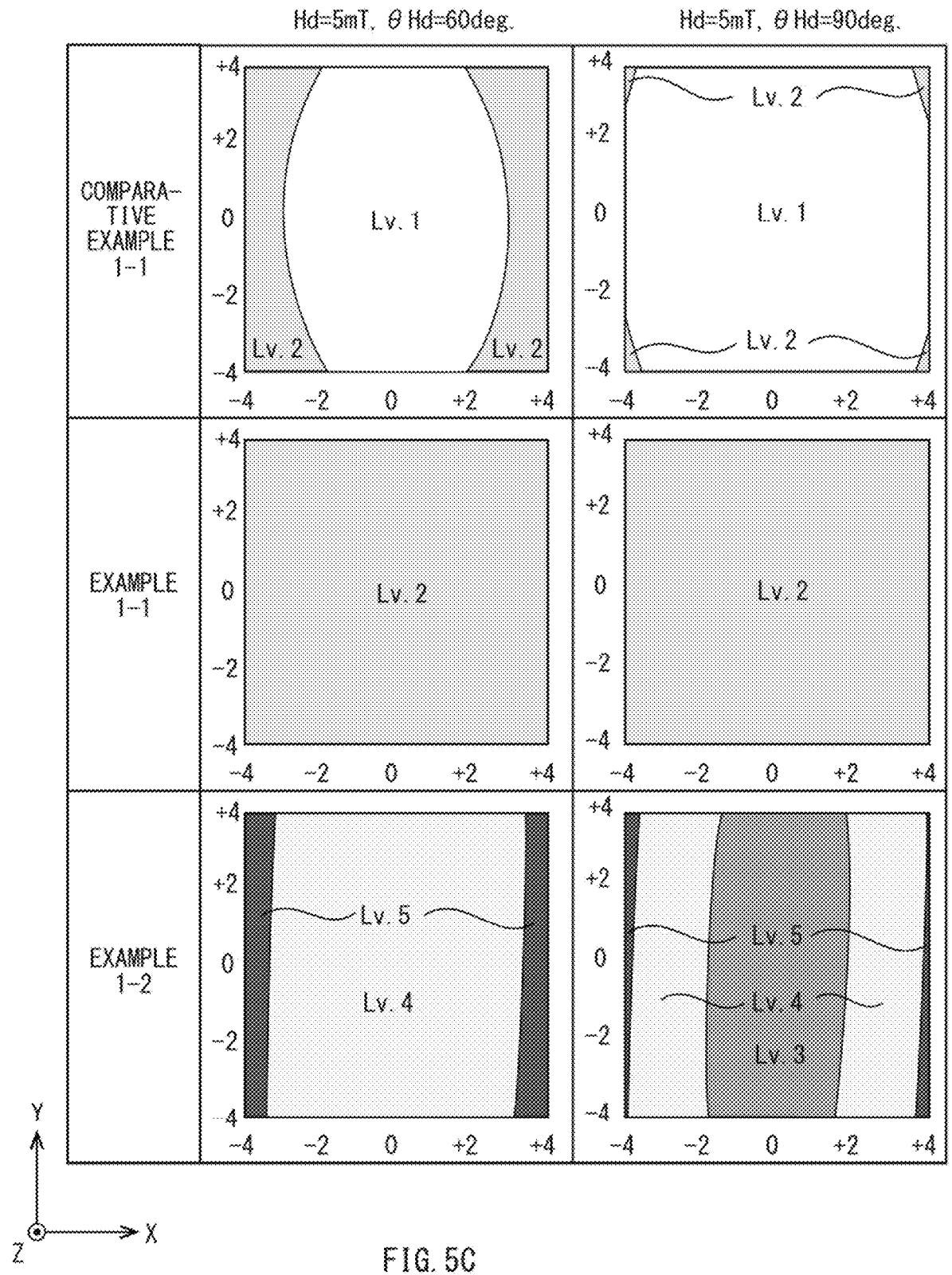
FIG. 5C is a third characteristic diagram illustrating the in-plane magnetic flux density distributions of the angle detection apparatuses of Examples.

In FIGS. 5A to 5C, distributions of the in-plane magnetic flux density in the calculation-target region AR calculated for Examples 1-1 and 1-2 and Comparative Example 1-1 are illustrated in two-dimensional maps for each angle θHd of the disturbance magnetic field Hd. Here, cases where the disturbance magnetic field Hd was not applied are also illustrated as a reference. In FIGS. 5A to 5C, the in-plane magnetic flux density distributions are illustrated in five levels, i.e., Lv1 to Lv5 in ascending order of the value of the in-plane magnetic flux density in increments of 10 mT.

As indicated in FIGS. 5A to 5C, Examples 1-1 and 1-2 each exhibited a higher in-plane magnetic flux density than that of Comparative Example 1-1, irrespective of the presence or absence of the disturbance magnetic field Hd and irrespective of the angle θHd of the disturbance magnetic field Hd. Further, irrespective of the angle θHd of the disturbance magnetic field Hd, the in-plane magnetic flux densities in Examples 1-1 and 1-2 were high over larger areas in the calculation-target region AR. This is presumably by virtue of the presence of the first yoke 21 and the second yoke 22 producing an effect of enhancing, toward a desired direction, the intensity of the detection-target magnetic field. Accordingly, it can be said that Examples 1-1 and 1-2 are higher in immunity to the disturbance magnetic field and are thus less susceptible to the disturbance magnetic field than Comparative Example 1-1.

Further, Example 1-2 was higher in in-plane magnetic flux density over the entire calculation-target region AR than Example 1-1, irrespective of the presence or absence of the disturbance magnetic field Hd, and irrespective of the angle θHd of the disturbance magnetic field Hd. This is presumably because Example 1-2 was greater in occupancy area of the first yoke 21 and the second yoke 22 than Example 1-1. Accordingly, it can be said that Example 1-2 is higher in immunity to the disturbance magnetic field and is thus less susceptible to the disturbance magnetic field than Example 1-1. It is thus possible to reduce costs and increase the flexibility of design by, for example, employing an inexpensive magnet having a relatively low coercivity as the magnetic field generator.

[Comparison of Angle Error Distribution]

Figure 6A:
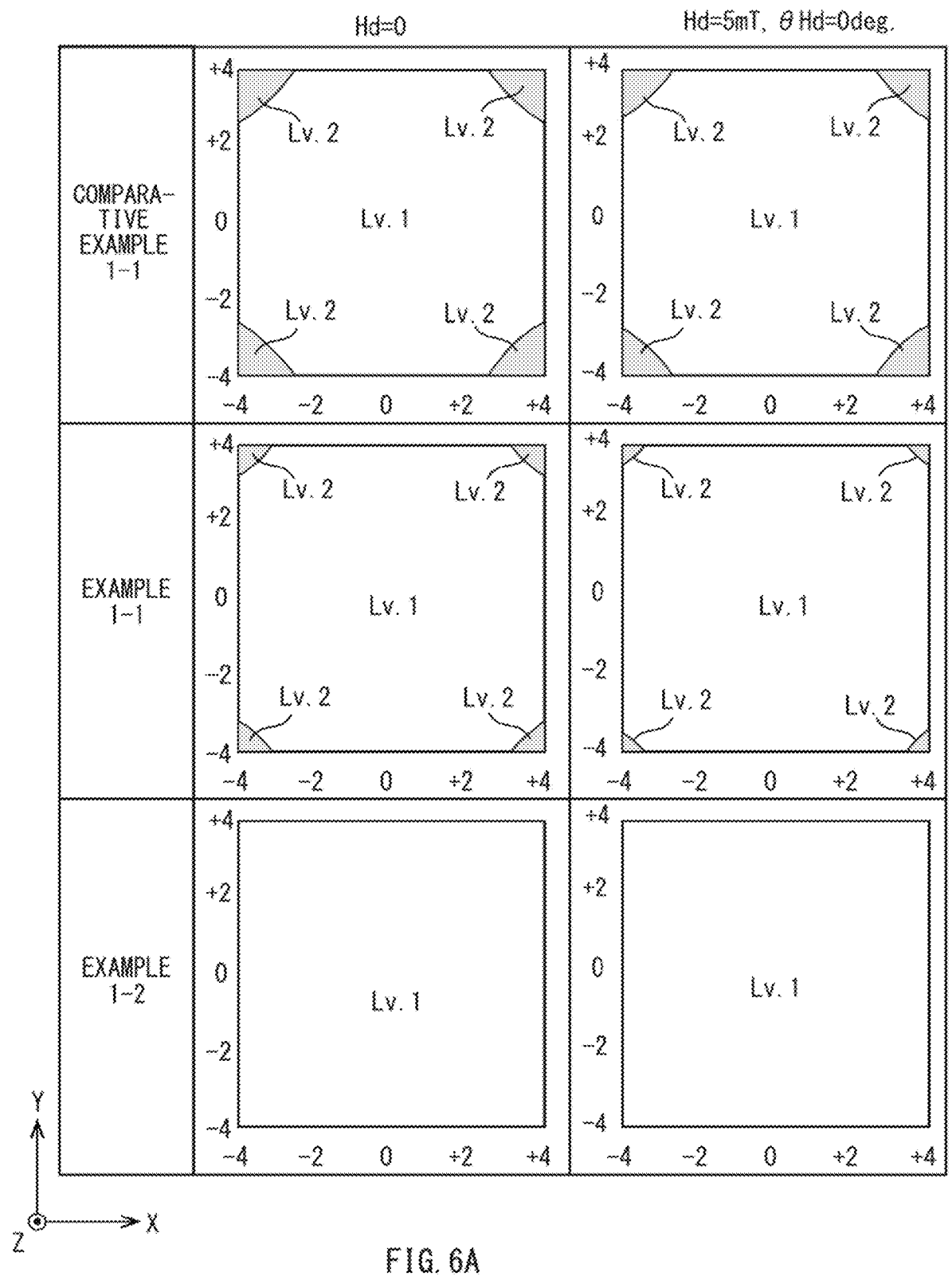
FIG. 6A is a first characteristic diagram illustrating angle error distributions of the angle detection apparatuses of Examples.
Figure 6B:
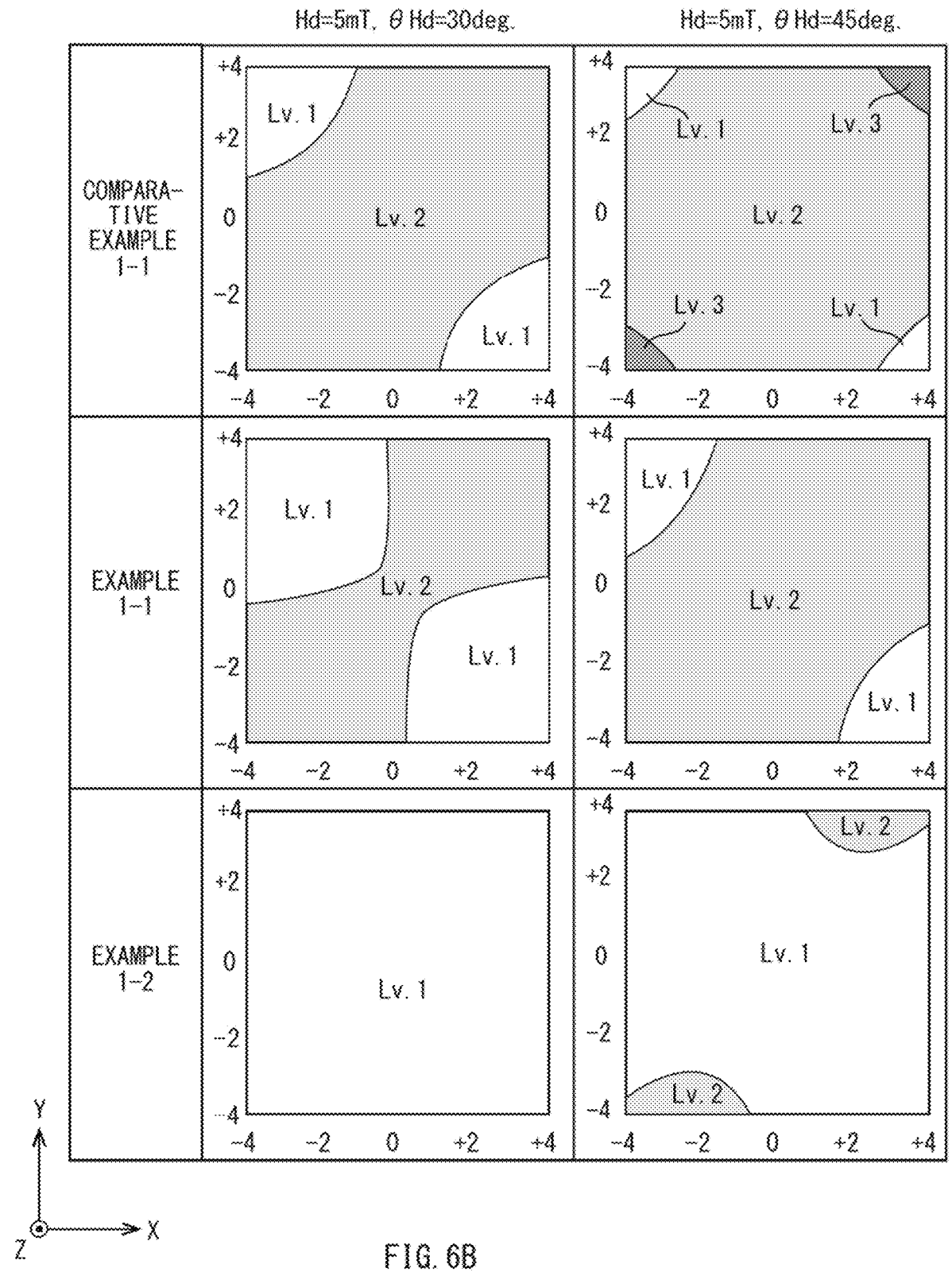
FIG. 6B is a second characteristic diagram illustrating the angle error distributions of the angle detection apparatuses of Examples.
Figure 6C:
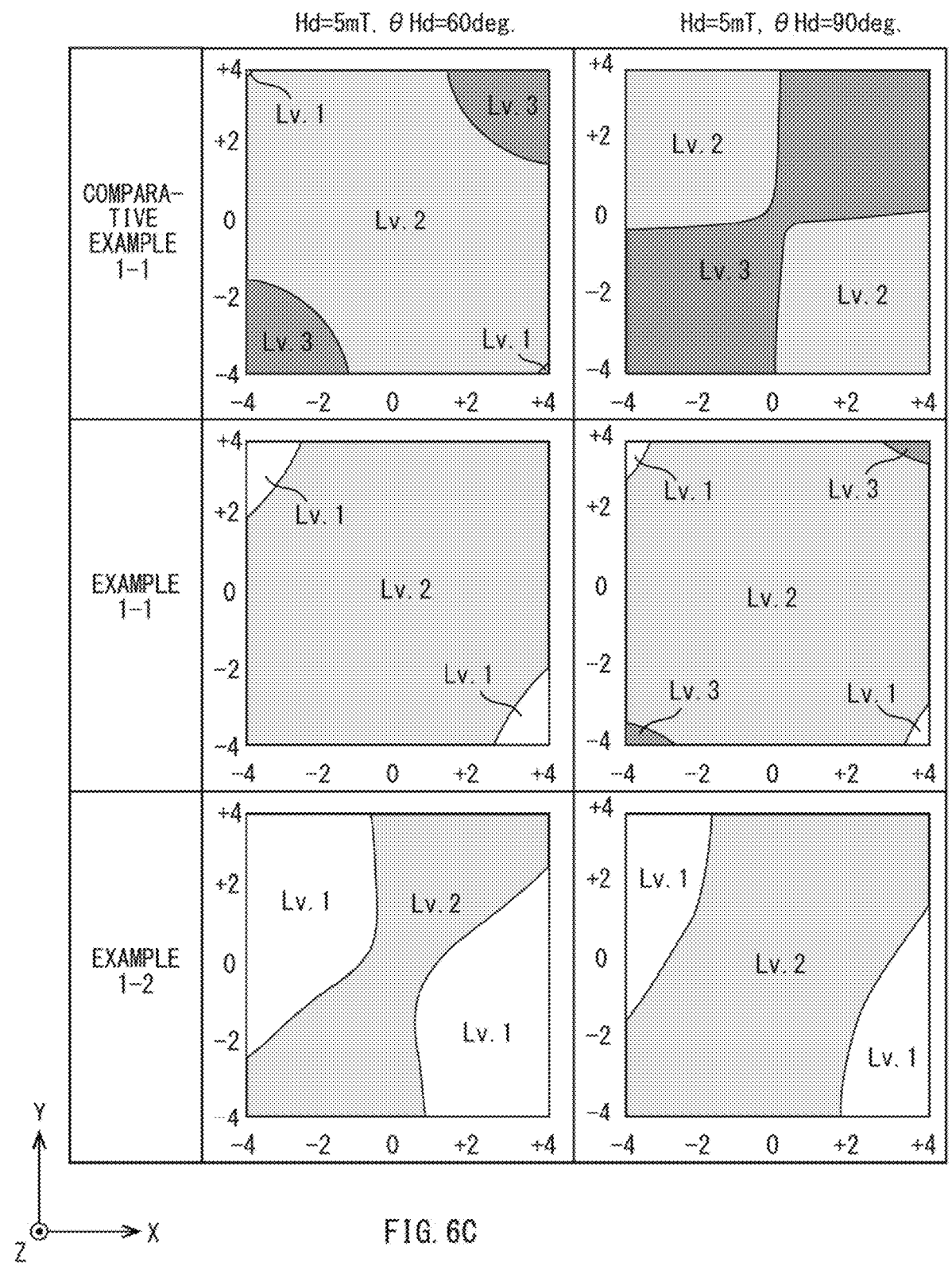
FIG. 6C is a third characteristic diagram illustrating the angle error distributions of the angle detection apparatuses of Examples.

In FIGS. 6A to 6C, distributions of angle error in the calculation-target region AR calculated for Examples 1-1 and 1-2 and Comparative Example 1-1 are illustrated in two-dimensional maps for each angle θHd of the disturbance magnetic field Hd. Here, the cases where the disturbance magnetic field Hd was not applied are also illustrated as a reference. In FIGS. 6A to 6C, the angle error distributions are illustrated in three levels, i.e., Lv1 to Lv3. Lv1 represents an angle error of less than 1 degree in absolute value, Lv2 represents an angle error of 1 degree or more and less than 3 degrees in absolute value, and Lv3 represents an angle error of 3 degrees or more and less than 5 degrees in absolute value.

FIGS. 6A to 6C indicate that the angle error was reduced over a wider range of the calculation-target region AR in Examples 1-1 and 1-2 than in Comparative Example 1-1, irrespective of the presence or absence of the disturbance magnetic field Hd, and irrespective of the angle θHd of the disturbance magnetic field Hd. For Comparative Example 1-1, in particular, the angle error tended to increase with increasing angle θHd of the disturbance magnetic field Hd. In contrast, Examples 1-1 and 1-2 were able to suppress an increase in angle error over a wider range even in a case where the angle θHd was large. This is presumably an effect of the presence of the first yoke 21 and the second yoke 22. Thus, in a case where the placement position of the sensor module 1 with respect to the magnetic field generation module 2 becomes misaligned due to an increase in size of the sensor module 1 relative to a size of the magnetic field generation module 2 or an error in assembling the magnetic field generation module 2 and the sensor module 1 occurring during manufacture, Examples 1-1 and 1-2 are able to suppress an increase in angle error over a wider range than Comparative Example 1-1. Accordingly, it can be said that Examples 1-1 and 1-2 are wider in allowable range of misalignment of the placement position of the sensor module 1 with respect to the magnetic field generation module 2 than Comparative Example 1-1. Further, the influence of the angle error caused by the disturbance magnetic field is smaller on Examples 1-1 and 1-2 than on Comparative Example 1-1.

Further, an increase in angle error tended to be more suppressed over the entire calculation-target region AR in Example 1-2 than in Example 1-1, irrespective of the presence or absence of the disturbance magnetic field Hd, and irrespective of the angle θHd of the disturbance magnetic field Hd. This is presumably because Example 1-2 was greater in occupancy area of the first yoke 21 and the second yoke 22 than Example 1-1. Thus, in the case where the placement position of the sensor module 1 with respect to the magnetic field generation module 2 becomes misaligned, Example 1-2 is able to suppress an increase in angle error over a wider range than Example 1-1. Accordingly, it can be said that Example 1-2 is wider in allowable range of misalignment of the placement position of the sensor module 1 with respect to the magnetic field generation module 2 than Example 1-1. In view of the foregoing, it can thus be said that the angle error due to deterioration in accuracy of the placement position of the sensor module 1 with respect to the magnetic field generation module 2 is suppressed more in Example 1-1 than in Comparative Example 1-1, and more in Example 1-2 than in Example 1-1. Further, the influence of the angle error caused by the disturbance magnetic field is smaller on Example 1-2 than on Example 1-1.

3. APPLICATION EXAMPLES

First Application Example

Figure 7A:
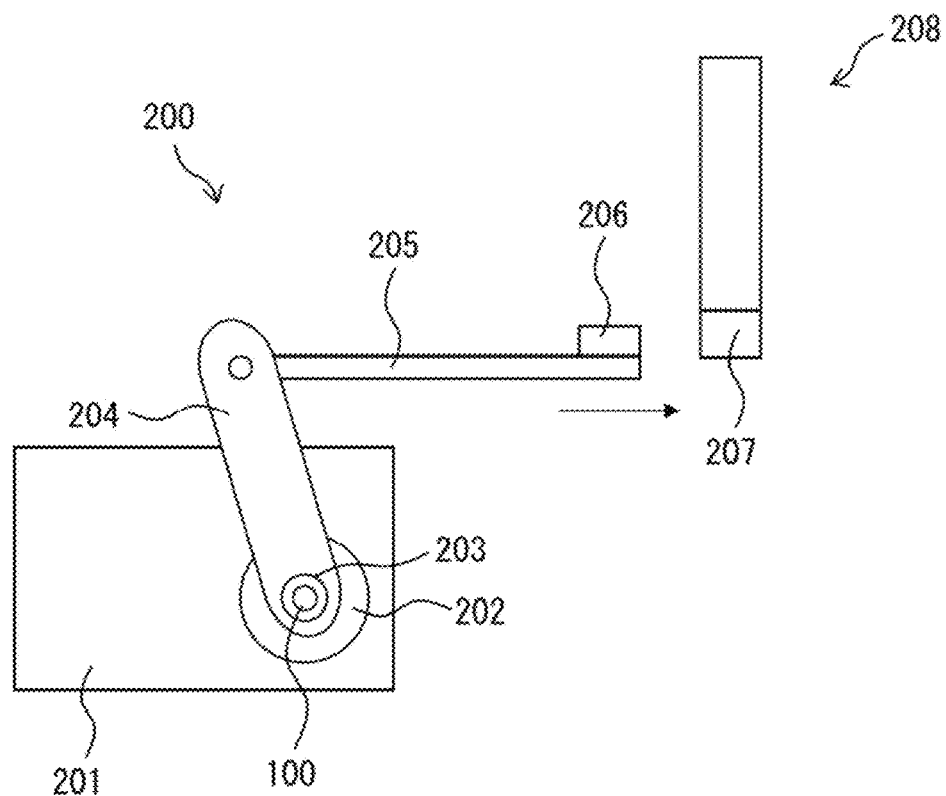
FIG. 7A is a first schematic view of a park lock system according to one application example to which the angle detection apparatus of the example embodiment of the technology is applied.
Figure 7B:
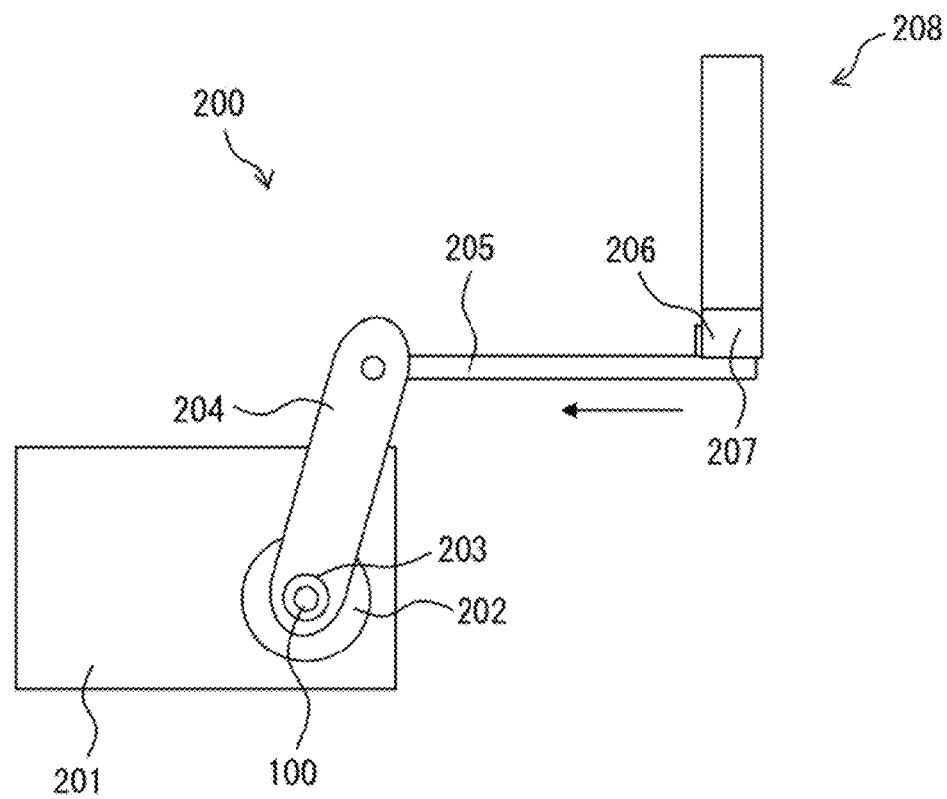
FIG. 7B is a second schematic view of the park lock system according to the application example to which the angle detection apparatus of the example embodiment of the technology is applied.

FIGS. 7A and 7B are schematic view of a park lock system 200 including the angle detection system 100 according to the example embodiment described above. The park lock system 200 is a mechanism that may be installed in, for example, a vehicle such as an automobile to prevent unintentional movement of the vehicle once a shift lever has been shifted to a parking-mode position by a driver when the driver parks the vehicle in a parking lot or the like. FIG. 7A illustrates an unlocked state, and FIG. 7B illustrates a locked state. The park lock system 200 may include, for example, a motor 202 provided inside a housing 201, a shaft 203, a lever 204, a rod 205, an engagement part 206, and a parking gear 208 with gear teeth 207. The shaft 203 may extend in a direction perpendicular to the plane of the paper, for example, and may be rotatable by the motor 202. The angle detection system 100 according to the foregoing example embodiment may be provided at an end of the shaft 203 to detect the rotation angle of the shaft 203. The lever 204 may extend parallel to the plane of the paper and have a proximal end fixed to the shaft 203. The lever 204 may be driven by the motor 202 to pivot along the plane of the paper. A proximal end of the rod 205 may be attached to a distal end of the lever 204. Pivoting of the lever 204 may cause the rod 205 to move in a horizontal direction in the plane of the paper. The engagement part 206 may be provided at a distal end of the rod 205 and configured to be engaged with and disengaged from the gear teeth 207. In the park lock system 200, rotation of the parking gear 208 may be restricted by a shift from the unlocked state illustrated in FIG. 7A to the locked state illustrated in FIG. 7B. In a more specific but non-limiting example, upon rotation of the shaft 203 and the lever 204 in a clockwise direction in the plane of the paper caused by rotation of the motor 202, the rod 205 may slide rightward in the plane of the paper to cause the engagement part 206 to be engaged with the gear teeth 207 to thereby lock the parking gear 208. The restriction of rotation of the parking gear 208 may be released by a shift from the locked state illustrated in FIG. 7B to the unlocked state illustrated in FIG. 7A. In a more specific but non-limiting example, upon rotation of the shaft 203 and the lever 204 in a counterclockwise direction in the plane of the paper caused by rotation of the motor 202, the rod 205 may slide leftward in the plane of the paper to cause the engagement part 206 to be separated from the gear teeth 207 to thereby unlock the parking gear 208. Here, the angle detection system 100 according to the foregoing example embodiment is able to identify whether the parking gear 208 is in the locked state or in the unlocked state with high accuracy by detecting the rotation angle of the shaft 203.

Second Application Example

Figure 8A:
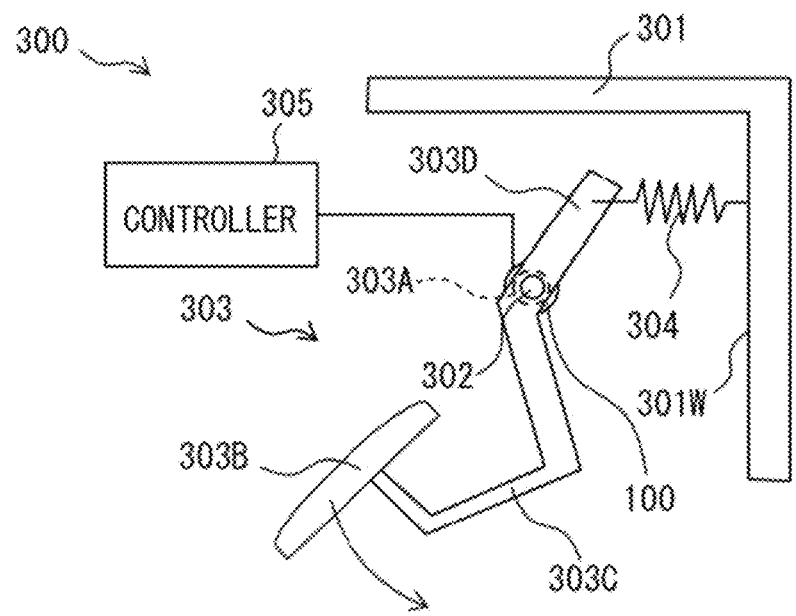
FIG. 8A is a first schematic view of a pedal system according to one application example to which the angle detection apparatus of the example embodiment of the technology is applied.
Figure 8B:
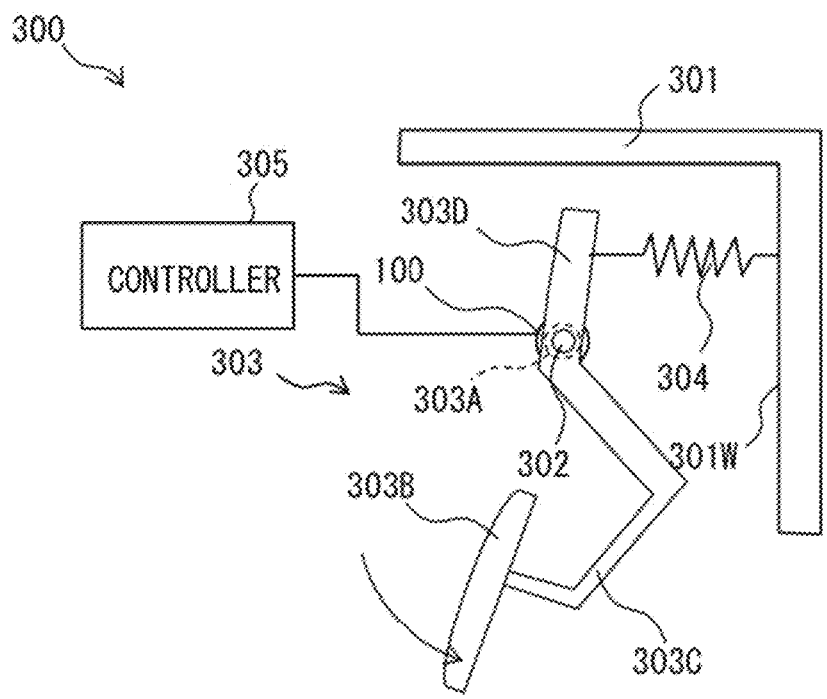
FIG. 8B is a second schematic view of the pedal system according to the application example to which the angle detection apparatus of the example embodiment of the technology is applied.

FIGS. 8A and 8B are schematic view of a pedal system 300 including the angle detection system 100 according to the foregoing example embodiment. FIG. 8A illustrates an initial state in which a pad 303B (described later) of a pedal 303 is unoperated. FIG. 8B illustrates a depressed state in which the pad 303B is operated.

The pedal system 300 may include, for example, a housing 301, a shaft 302 fixed to the housing 301, the pedal 303, and a biasing member 304 such as a tension spring. The pedal 303 may include a bearing 303A inside which the shaft 302 is to be disposed. The bearing 303A allows the pedal 303 to be rotationally movable about the shaft 302.

The pedal 303 may further include, for example, the pad 303B to be operated by a foot of a driver, an arm 303C coupling the pad 303B and the bearing 303A to each other, and a lever 303D provided on the opposite side from the arm 303C with the bearing 303A therebetween. The lever 303D may be coupled to the biasing member 304 and configured to be biased by the biasing member 304 toward a wall 301W of the housing 301.

The angle detection system 100 may be provided near the bearing 303A and configured to accurately detect the rotation angle of the arm 303C rotatable about the shaft 302, and to transmit a voltage signal (a proportional signal) corresponding to the rotation angle to a controller 305. The controller 305 may analyze the voltage signal and control opening and closing operations of a throttle valve to achieve a throttle valve position corresponding to the voltage signal.

In the pedal system 300, when the pad 303B in the initial state illustrated in FIG. 8A is depressed by the driver, the pedal 303 rotates counterclockwise about the shaft 302 in the plane of the paper to shift to a depressed state illustrated in FIG. 8B. At this time, the degree of opening of the throttle valve increases. In contrast, when the driver decreases the amount of depressing of the pad 303B or stops depressing the pad 303B, the depressed state illustrated in FIG. 8B shifts to the initial state illustrated in FIG. 8A. At this time, the degree of opening of the throttle valve decreases.

As described above, in the pedal system 300, the angle detection system 100 according to the foregoing example embodiment is able to detect the rotation angle of the arm 303C accurately. This makes it possible to adjust the throttle valve position with high accuracy.

5. OTHER MODIFICATION EXAMPLES

The technology has been described hereinabove with reference to the example embodiment. However, the technology is not limited thereto, and may be modified in a variety of ways. For example, in embodiments of the technology, the magnetic detection element may be any element having a function of detecting a magnetic field. The term "magnetic detection element" conceptually encompasses magnetoresistive effect (MR) elements including, for example, an anisotropic magnetoresistive effect (AMR) element, a spin-valve giant magnetoresistive effect (GMR) element, and a tunneling magnetoresistive effect (TMR) element, and also various kinds of Hall elements including a vertical Hall element and a horizontal Hall element. In a case of using the MR element or the Hall element, the resistance or output of the element changes in accordance with a change in orientation and/or intensity of a magnetic field in a plane orthogonal to the rotation axis J1. According to at least one embodiment of the technology, it is possible to reduce unevenness of a magnetic field intensity distribution (a magnetic flux density distribution) not only in a rotation-axis direction but also in a plane orthogonal to the rotation axis; therefore, a magnetic detection element that detects changes in orientation and/or intensity of a magnetic field in a plane orthogonal to the rotation axis J1, such as the MR element, is considered to be applicable. Further, the size of each component and the layout of the components are mere examples and are non-limiting.

Figure 9A:
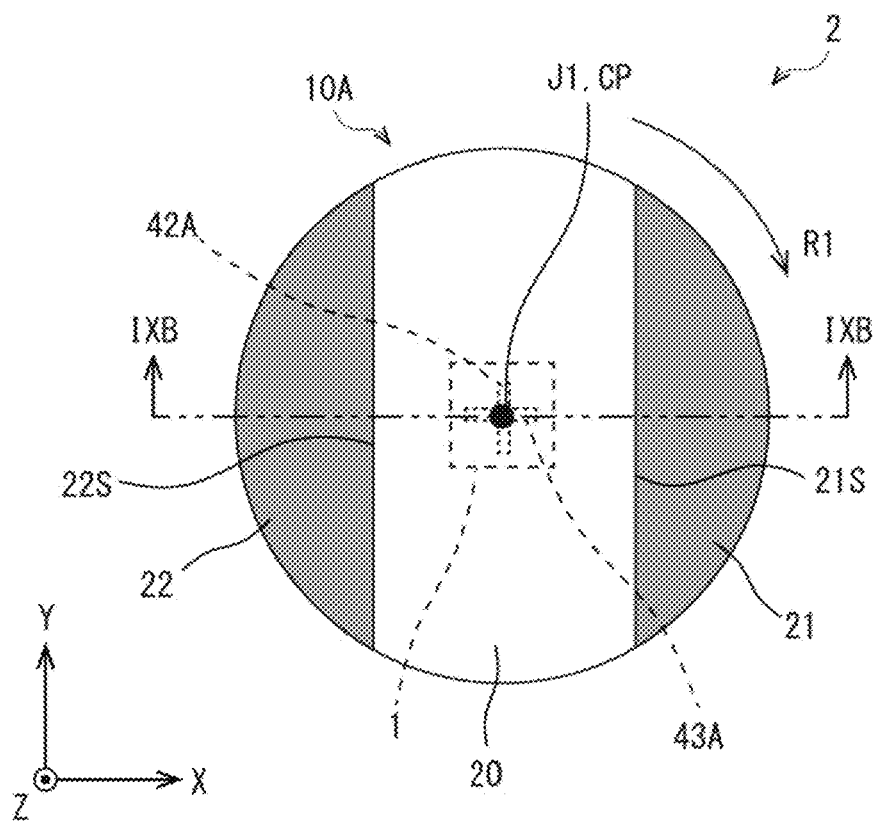
FIG. 9A is a schematic plan view of an angle detection apparatus including a sensor module that includes a horizontal Hall element as a magnetic detection element.
Figure 9B:
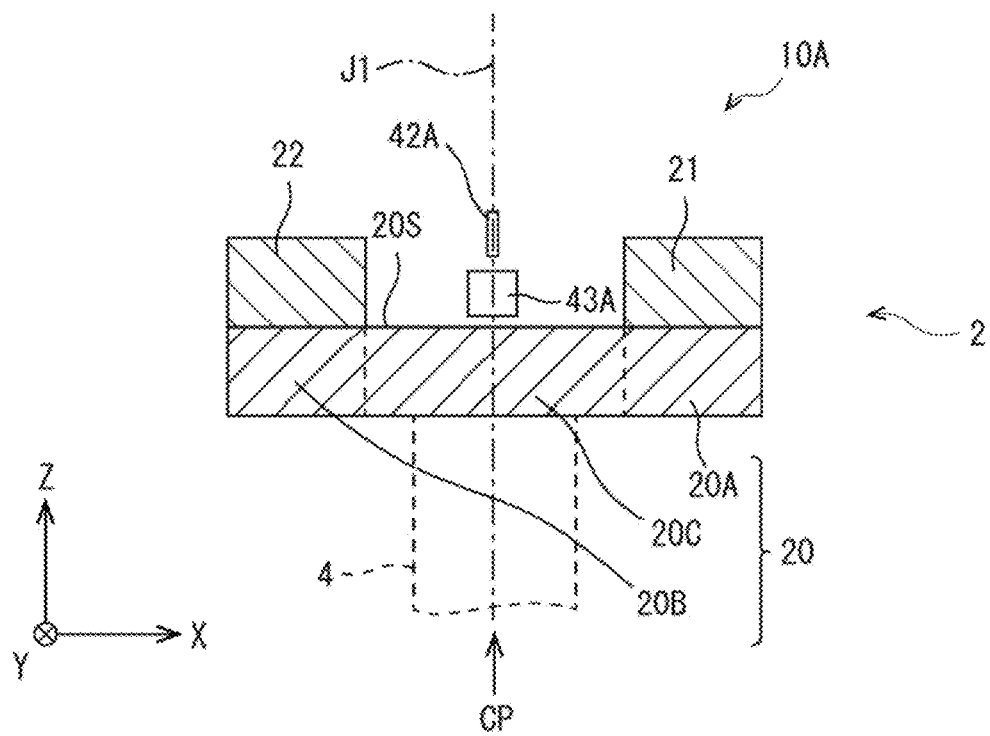
FIG. 9B is a schematic cross-sectional view of the angle detection apparatus illustrated in FIG. 9A.
Figure 10A:
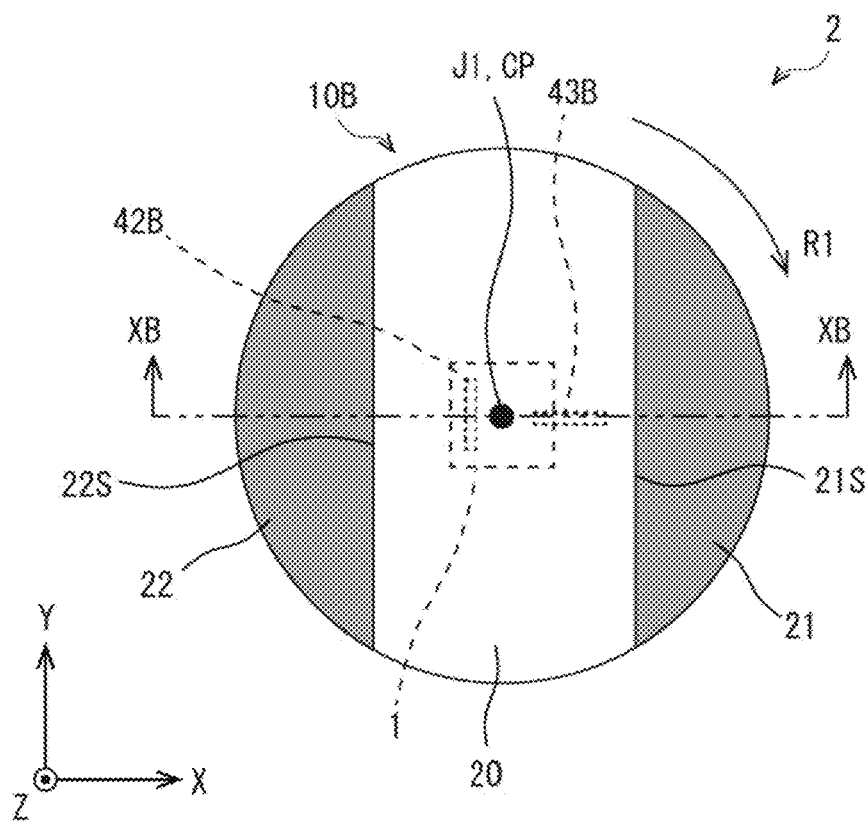
FIG. 10A is a schematic plan view of an angle detection apparatus including a sensor module that includes a horizontal Hall element as the magnetic detection element.
Figure 10B:
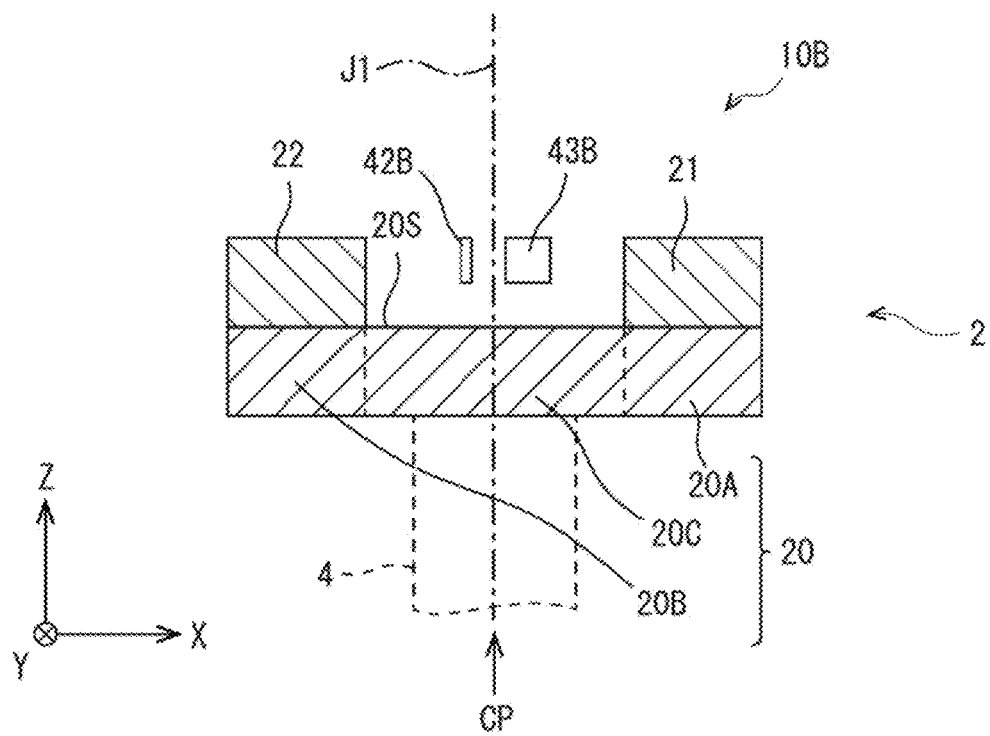
FIG. 10B is a schematic cross-sectional view of the angle detection apparatus illustrated in FIG. 10A.

In some embodiments of the technology, the horizontal Hall element may be used as the magnetic detection element. For example, FIGS. 9A and 9B illustrate an angle detection apparatus 10A in which the sensor module 1 may include two horizontal Hall elements 42A and 43A as the magnetic detection elements. Further, FIGS. 10A and 10B illustrate an angle detection apparatus 10B in which the sensor module 1 may include two horizontal Hall elements 42B and 43B as the magnetic detection elements. In the angle detection apparatus 10A illustrated in FIGS. 9A and 9B, the horizontal Hall element 42A having a magnetosensitive surface parallel to a YZ plane orthogonal to the X-axis and the horizontal Hall element 43A having a magnetosensitive surface parallel to an XZ plane orthogonal to the Y-axis may be disposed adjacent to each other along the Z-axis. The horizontal Hall element 42A changes in output in accordance with the intensity of the detection-target magnetic field in the X-axis direction perpendicular to the magnetosensitive surface. The horizontal Hall element 43A changes in output in accordance with the intensity of the detection-target magnetic field in the Y-axis direction perpendicular to the magnetosensitive surface. In the angle detection apparatus 10A, the sensor module 1 may be configured to combine the output of the horizontal Hall element 42A and the output of the horizontal Hall element 43A to thereby detect an angle to be detected. Note that in the angle detection apparatus 10A, for example, as long as the horizontal Hall element 42A is located between the first yoke 21 and the second yoke 22 in the X-axis direction, the horizontal Hall element 42A may be at a position deviated, in a direction away from the magnet 20, from a region overlapping the first yoke 21 and the second yoke 22 in the X-axis direction. In FIGS. 10A and 10B, the horizontal Hall element 42B having a magnetosensitive surface parallel to the YZ plane and the horizontal Hall element 43B having a magnetosensitive surface parallel to the XZ plane may be disposed adjacent to each other in the X-axis direction with the rotation axis J1 along the Z-axis direction therebetween. The horizontal Hall element 42B changes in output in accordance with the intensity of the detection-target magnetic field in the X-axis direction perpendicular to the magnetosensitive surface. The horizontal Hall element 43B changes in output in accordance with the intensity of the detection-target magnetic field in the Y-axis direction perpendicular to the magnetosensitive surface. In the angle detection apparatus 10B, the sensor module 1 may be configured to combine the output of the horizontal Hall element 42B and the output of the horizontal Hall element 43B to thereby detect the angle to be detected. Note that in the angle detection apparatus 10B, as long as the horizontal Hall elements 42B and 43B are located between the first yoke 21 and the second yoke 22, the horizontal Hall elements 42B and 43B do not have to be opposed to each other with the rotation axis J1 centered therebetween.

The foregoing example embodiment has been described with reference to an example case in which the sensor module 1 including the magnetic detection element 41 is fixed whereas the magnetic field generation module 2 is rotatable; however, the technology is not limited thereto. In some embodiments of the technology, for example, the magnet, the first soft magnetic body, and the second soft magnetic body may be fixed, and the magnetic detection element may be rotatable around the rotation axis. Alternatively, both the magnetic detection element and the combination of the magnet and the first and second soft magnetic bodies may be rotatable around the same rotation axis.

Further, the foregoing example embodiment has been described with reference to an example case in which the sensor module 1 of the angle detection apparatus 10 includes the single magnetic detection element 41; however, the technology is not limited thereto. In some embodiments of the technology, the angle detection apparatus may include two or more magnetic detection elements, for example. In such a case, all the two or more magnetic detection elements may be disposed on the rotation axis, or some or all of the two or more magnetic detection elements may be disposed around the rotation axis. In other words, the two or more magnetic detection elements may be disposed around the rotation axis at mutually different positions in a plane orthogonal to the rotation-axis direction along the rotation axis. In one example, a center position located at equal distances from the two or more magnetic detection elements may coincide with the position of the rotation axis. In a case of disposing the two or more magnetic detection elements around the rotation axis, the magnetic detection elements may each be disposed between the rotation axis and the soft magnetic body in an in-plane direction along the plane orthogonal to the rotation axis.

Figure 11A:
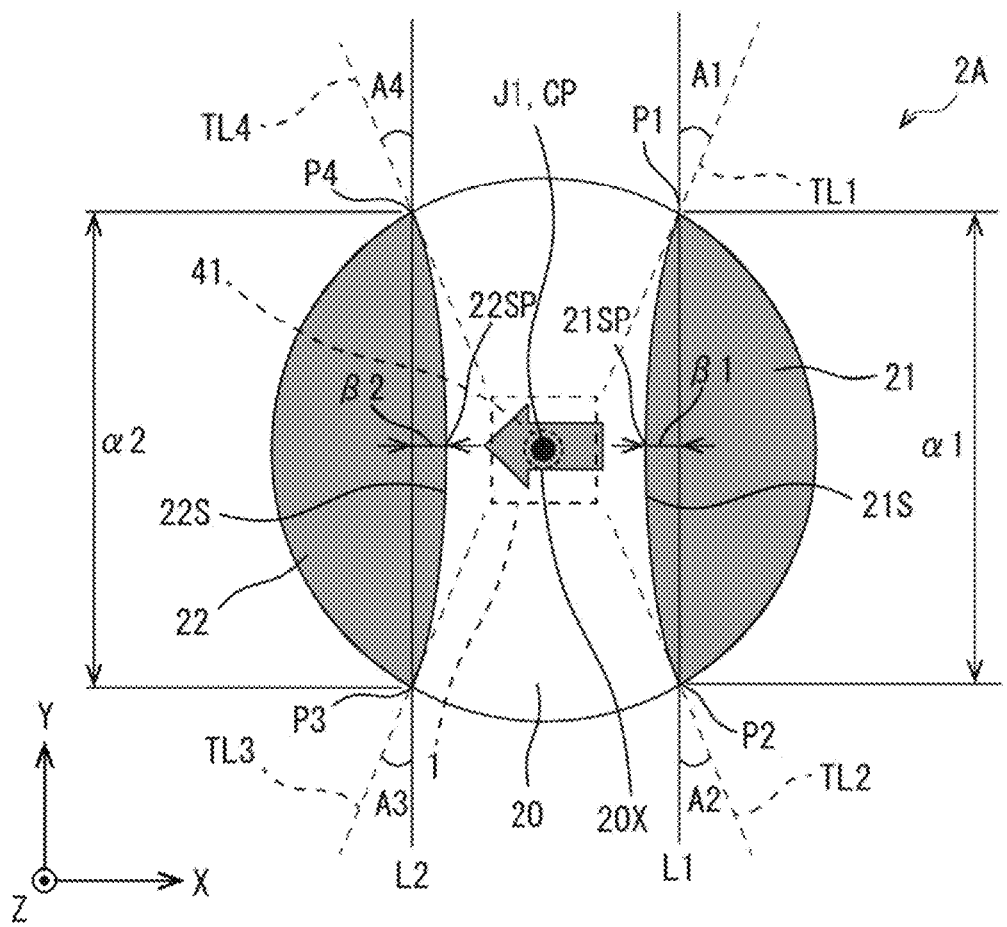
FIG. 11A is a schematic plan view of a magnetic field generation module according to one modification example of the technology.
Figure 11B:
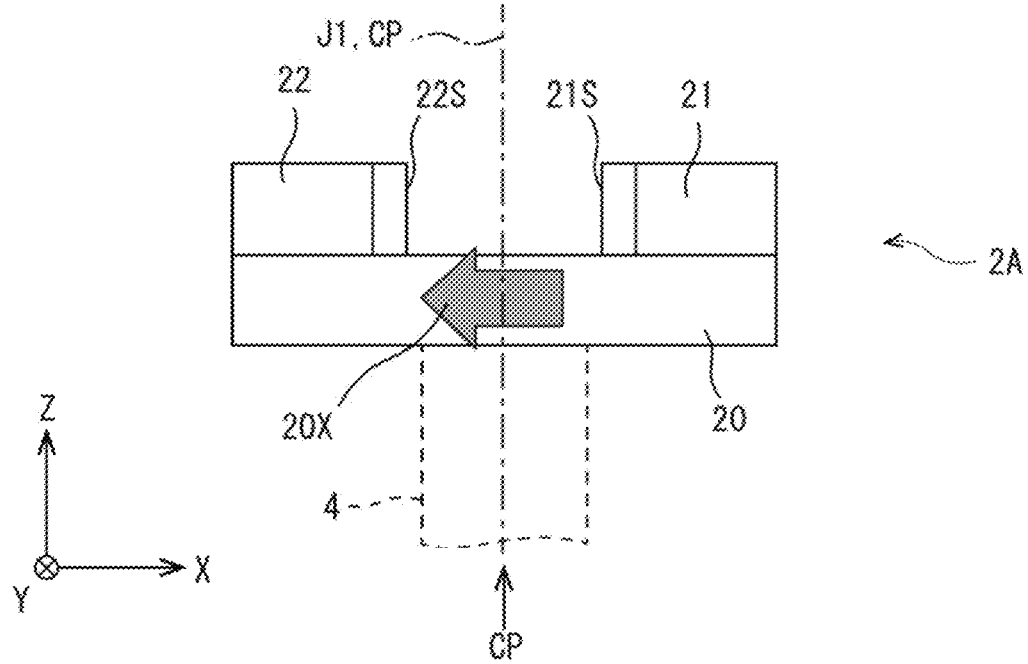
FIG. 11B is a front view of the magnetic field generation module according to the modification example illustrated in FIG. 11A.

Further, in the foregoing example embodiment, the first opposed surface 21S of the first yoke 21 and the second opposed surface 22S of the second yoke 22 may be parallel to each other. However, in some embodiments, the first opposed surface and the second opposed surface may be non-parallel to each other. Alternatively, in some embodiments, the first opposed surface and the second opposed surface may each be curved into a substantially arc shape in a cross section orthogonal to the first direction, i.e., in the XY plane. In other words, the first opposed surface and the second opposed surface may be curved to protrude toward each other, or curved to be recessed away from each other. For example, FIGS. 11A and 11B illustrate a magnetic field generation module 2A according to a first modification example of the technology. In the magnetic field generation module 2A, the first opposed surface 21S and the second opposed surface 22S may be curved to protrude toward each other. In the magnetic field generation module 2A, the magnet 20 may be magnetized along the X-axis direction, for example, as indicated by the arrow 20X. Note that FIG. 11A is a schematic plan view of the magnetic field generation module 2A according to the first modification example of the technology, and illustrates the magnetic field generation module 2A as viewed in a −Z direction. Further, FIG. 11B is a front view of the magnetic field generation module 2A and illustrates the magnetic field generation module 2A as viewed in a +Y direction. In the magnetic field generation module 2A, the first opposed surface 21S includes the first endpoint P1 and the second endpoint P2. The first endpoint P1 and the second endpoint P2 are located at opposite ends of the first yoke 21 in the Y-axis direction. A first tangent TL1 to the first opposed surface 21S at the first endpoint P1 may form a first angle A1 with respect to the Y-axis direction. A second tangent TL2 to the first opposed surface 21S at the second endpoint P2 may form a second angle A2 with respect to the Y-axis direction. Further, the second opposed surface 22S includes the third endpoint P3 and the fourth endpoint P4. The third endpoint P3 and the fourth endpoint P4 are located at opposite ends of the second yoke 22 in the Y-axis direction. A third tangent TL3 to the second opposed surface 22S at the third endpoint P3 may form a third angle A3 with respect to the Y-axis direction. A fourth tangent TL4 to the second opposed surface 22S at the fourth endpoint P4 may form a fourth angle A4 with respect to the Y-axis direction. Here, the first to fourth tangents TL1 to TL4 may be the best straight-line approximations of the opposed surfaces at the first to fourth endpoints P1 to P4, respectively. Thus, the first tangent TL1 represents a slope of the first opposed surface 21S at the first endpoint P1, and the second tangent TL2 represents a slope of the first opposed surface 21S at the second endpoint P2. Further, the third tangent TL3 represents a slope of the second opposed surface 22S at the third endpoint P3, and the fourth tangent TL4 represents a slope of the second opposed surface 22S at the fourth endpoint P4.

Figure 12A:
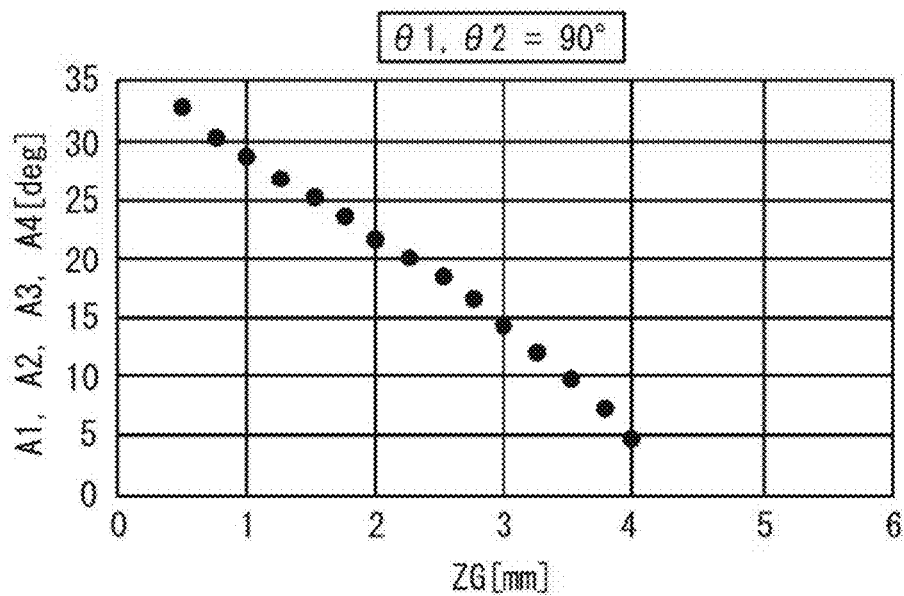
FIG. 12A is a first characteristic diagram illustrating an angle error of the magnetic field generation module according to the modification example illustrated in FIG. 11A.
Figure 12B:
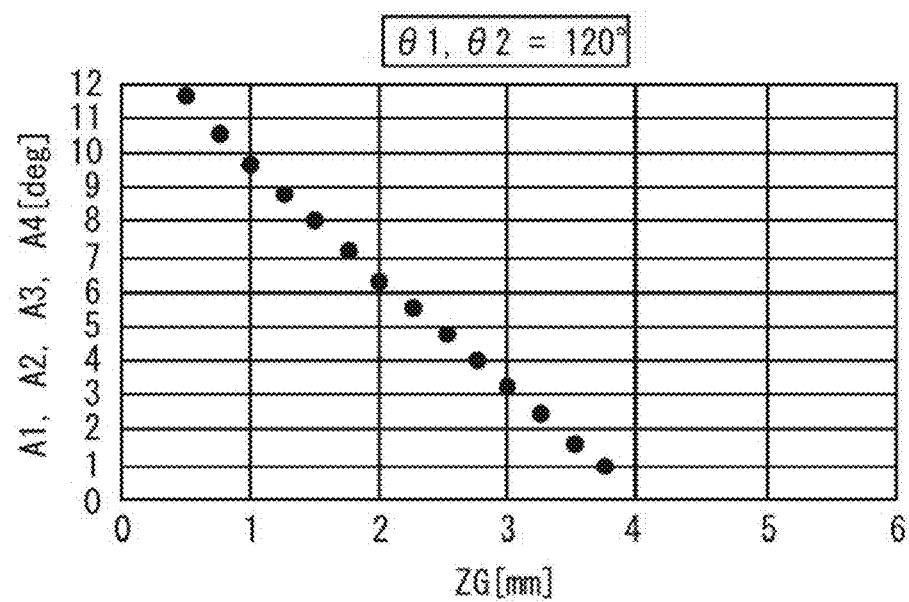
FIG. 12B is a second characteristic diagram illustrating an angle error of the magnetic field generation module according to the modification example illustrated in FIG. 11A.

A relationship between the magnitude of the first to fourth angles A1 to A4 and the angle error to be detected at the sensor module 1 was examined by simulation in the angle detection apparatus 10 including the magnetic field generation module 2A illustrated in FIGS. 11A and 11B. The results are presented in FIGS. 12A and 12B. In FIGS. 12A and 12B, the vertical axis represents the first to fourth angles A1 to A4 [deg], and the horizontal axis represents a distance ZG in the Z-axis direction from the top surface 20S of the magnet 20 to a position where the in-plane magnetic flux density and the applied magnetic field direction are to be calculated. The plots in FIGS. 12A to 12B represent combinations of a value of the first to fourth angles A1 to A4 and a value of the distance ZG that result in the same angle errors as those in a reference case where the first to fourth angles A1 to A4 are zero, that is, a case with the angle detection apparatus 10 including the magnetic field generation module 2 of the foregoing example embodiment (FIG. 4A) in which the first opposed surface 21S and the second opposed surface 22S are parallel to each other. The angle error was determined from the in-plane magnetic flux density and the applied magnetic field direction over a 2-mm radius from the center position CP. FIG. 12A illustrates a case where the first central angle θ1 and the second central angle θ2 were both 90 degrees. FIG. 12B illustrates a case where the first central angle θ1 and the second central angle θ2 were both 120 degrees. FIGS. 12A and 12B mean that if the first to fourth angles A1 to A4 have a value smaller than a value of the first to fourth angles A1 to A4 at any of the plotted positions and greater than 0 degrees, the resulting angle error is smaller than that in the case with the magnetic field generation module 2 (FIG. 4A) in which the first opposed surface 21S and the second opposed surface 22S are parallel to each other. Note that the angle detection apparatus 10 including the magnetic field generation module 2A used in this simulation had a configuration similar to that of the angle detection apparatus 10 including the magnetic field generation module 2 described in relation to Example 1-1 above, except that the first opposed surface 21S and the second opposed surface 22S were curved.

As indicated in FIG. 12A, in a case where the first central angle θ1 and the second central angle θ2 are 90 degrees and where the magnetic detection element 41 is disposed at, for example, a position 2 mm away in the +Z direction from the top surface 20S of the magnet 20, the first to fourth angles A1 to A4 are all preferably greater than 0 degrees and less than 23 degrees. Such a range of the first to fourth angles A1 to A4 makes it possible to further reduce the angle error as compared with the case where the first opposed surface 21S and the second opposed surface 22S are parallel to each other, that is, the case where the first to fourth angles A1 to A4 are 0 degrees. Further, as indicated in FIG. 12B, in a case where the first central angle θ1 and the second central angle θ2 are 120 degrees and where the magnetic detection element 41 is disposed at, for example, the position 2 mm away in the +Z direction from the top surface 20S of the magnet 20, the first to fourth angles A1 to A4 are all preferably greater than 0 degrees and less than 6 degrees. From the simulation results presented in FIGS. 12A and 12B, it is seen that in a case where the first opposed surface 21S of the first yoke 21 and the second opposed surface 22S of the second yoke 22 are curved, the smaller the first yoke 21 and the second yoke 22 are in size, that is, the smaller the first central angle θ1 and the second central angle θ2 are, the more it is possible to reduce the angle error as compared with the case where the first opposed surface 21S and the second opposed surface 22S are parallel to each other, even if the first opposed surface 21S and the second opposed surface 22S are curved greatly.

Figure 13A:
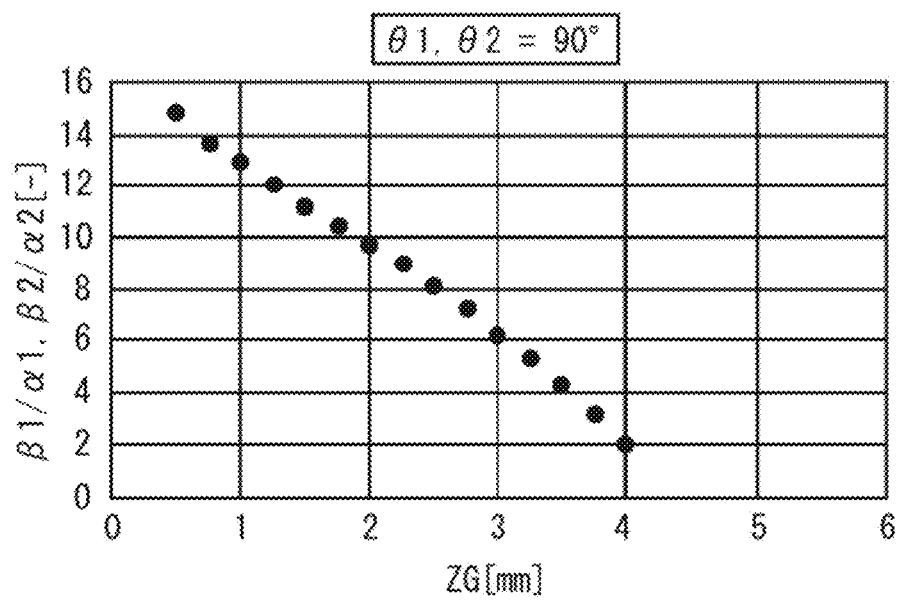
FIG. 13A is a third characteristic diagram illustrating an angle error of the magnetic field generation module according to the modification example illustrated in FIG. 11A.
Figure 13B:
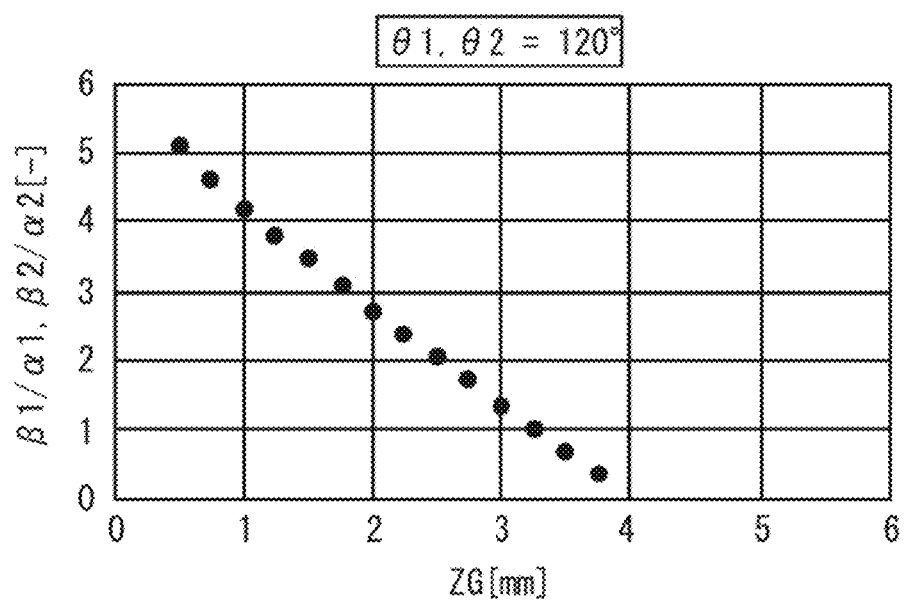
FIG. 13B is a fourth characteristic diagram illustrating an angle error of the magnetic field generation module according to the modification example illustrated in FIG. 11A.

From the simulation results presented in FIGS. 12A and 12B, it is further seen that the smaller the distance ZG from the top surface 20S of the magnet 20 to the magnetic detection element 41 is, the more it is possible to obtain an effect of reducing the angle error even if the curve of the opposed surface of each yoke is made large. For example, in a case where the first central angle θ1 and the second central angle θ2 are both 90 degrees and where the magnetic detection element 41 is disposed at a distance ZG of 4 mm, a further reduction in angle error is achievable as compared with the case where the first opposed surface 21S and the second opposed surface 22S are parallel to each other, if the first to fourth angles A1 to A4 are greater than 0 degrees and less than 5 degrees (FIG. 12A). In contrast, for example, in a case where the first central angle θ1 and the second central angle θ2 are both 90 degrees and where the magnetic detection element 41 is disposed at a distance ZG of 1 mm, a further reduction in angle error as compared with the case where the first opposed surface 21S and the second opposed surface 22S are parallel to each other is achievable over a wider range of the first to fourth angles A1 to A4, that is, a range greater than 0 degrees and less than 28 degrees (FIG. 12A). FIGS. 13A and 13B illustrate such a relationship from a different viewpoint. FIGS. 12A and 12B described above illustrate the combinations of the first to fourth angles A1 to A4 and the distance ZG that result in the same angle errors as those of the angle detection apparatus 10 including the magnetic field generation module 2 (FIG. 4A) serving as the reference. In contrast, FIGS. 13A and 13B illustrate combinations of aspect ratios β1/α1 and β2/α2 and the distance ZG that result in the same angle errors as those of the angle detection apparatus 10 including the magnetic field generation module 2 (FIG. 4A) serving as the reference. In FIGS. 13A and 13B, the vertical axis represents the aspect ratios β1/α1 and β2/α2. Note that α1 represents a distance between the first endpoint P1 and the second endpoint P2; β1 represents a distance between a first straight line L1 and a first point 21SP in the X-axis direction, the first straight line L1 passing through the first endpoint P1 and the second endpoint P2, the first point 21SP lying on the first opposed surface 21S and farthest from the first straight line L1; α2 represents a distance between the third endpoint P3 and the fourth endpoint P4; and β2 represents a distance between a second straight line L2 and a second point 22SP in the X-axis direction, the second straight line L2 passing through the third endpoint P3 and the fourth endpoint P4, the second point 22SP lying on the second opposed surface 22S and farthest from the second straight line L2. FIGS. 13A and 13B are similar to FIGS. 12A and 12B, respectively, except that the parameter on the vertical axis is different.

Based upon the simulation results described above, in a case where the first central angle θ1 and the second central angle θ2 are both 90 degrees and where the magnetic detection element 41 is disposed at the position 2 mm away in the +Z direction from the top surface 20S of the magnet 20, the magnetic field generation module 2A may satisfy conditional expressions (1) and (2) below. If the magnetic field generation module 2A satisfies the conditional expressions (1) and (2) below, it is possible to further reduce the angle error as compared with the case where first to fourth angles A1 to A4 are 0 degrees, that is, the case where the first opposed surface 21S and the second opposed surface 22S are parallel to each other.

$$0<(\beta 1/\alpha 1)<10 \tag{1}$$

$$0<(\beta 2/\alpha 2)<10 \tag{2}$$

Likewise, based upon the simulation results described above, in a case where the first central angle θ1 and the second central angle θ2 are both 120 degrees and where the magnetic detection element 41 is disposed at the position 2 mm away in the +Z direction from the top surface 20S of the magnet 20, the magnetic field generation module 2A may satisfy conditional expressions (3) and (4) below. If the magnetic field generation module 2A satisfies the conditional expressions (3) and (4) below, it is possible to further reduce the angle error as compared with the case where first to fourth angles A1 to A4 are 0 degrees, that is, the case where the first opposed surface 21S and the second opposed surface 22S are parallel to each other.

$$0<(\beta 1/\alpha 1)<3 \tag{3}$$

$$0<(\beta 2/\alpha 2)<3 \tag{4}$$

Figure 14A:
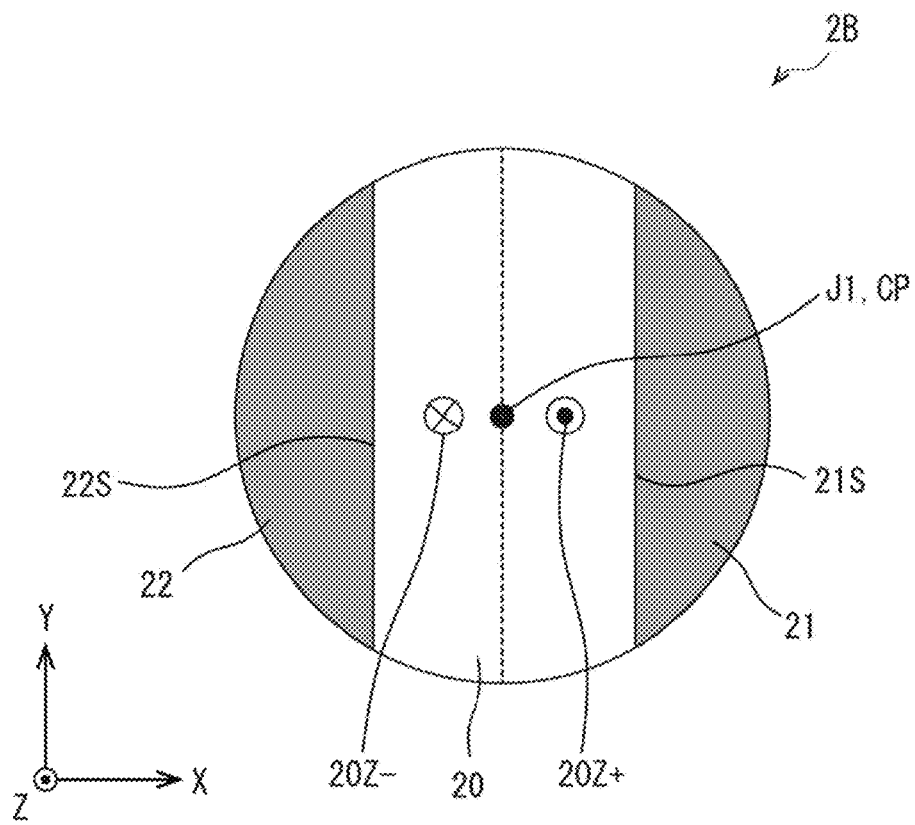
FIG. 14A is a schematic plan view of a magnetic field generation module according to one modification example of the technology.
Figure 14B:
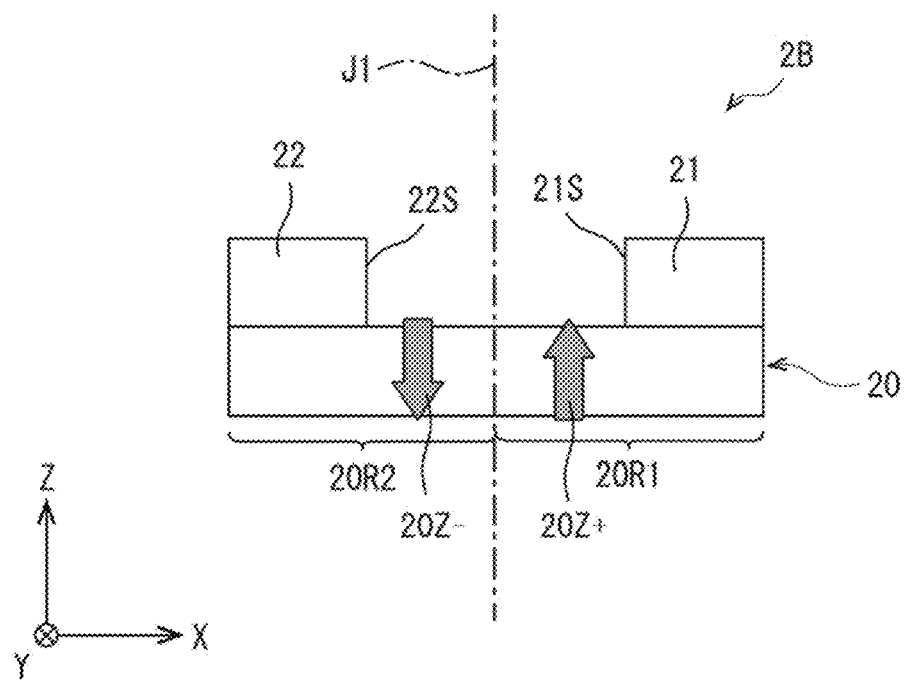
FIG. 14B is a front view of the magnetic field generation module according to the modification example illustrated in FIG. 14A.

In the foregoing example embodiment, as illustrated in FIG. 2, for example, the magnetic field generation module 2 including the magnet 20 magnetized in the X-axis direction has been described as an example. However, the technology is not limited thereto. For example, FIGS. 14A and 14B illustrate a magnetic field generation module 2B according to a second modification example of the technology. In the magnetic field generation module 2B, the magnet 20 may include a first region 20R1 and a second region 20R2. The first region 20R1 and the second region 20R2 may be adjacent to each other in the X-axis direction. The first region 20R1 may be magnetized in the +Z direction along the Z-axis, as indicated by an arrow 20Z+. The second region 20R2 may be magnetized in the −Z direction opposite to the +Z direction, as indicated by an arrow 20Z−. Here, the +Z direction may correspond to a specific but non-limiting example of a "first orientation" according to one embodiment of the technology, and the −Z direction may correspond to a specific but non-limiting example of a "second orientation" according to one embodiment of the technology. Note that FIG. 14A is a schematic plan view of the magnetic field generation module 2B according to the second modification example of the technology, illustrating the magnetic field generation module 2B as viewed in the −Z direction. FIG. 14B is a front view of the magnetic field generation module 2B, illustrating the magnetic field generation module 2B as viewed in the +Y direction.

Figure 15A:
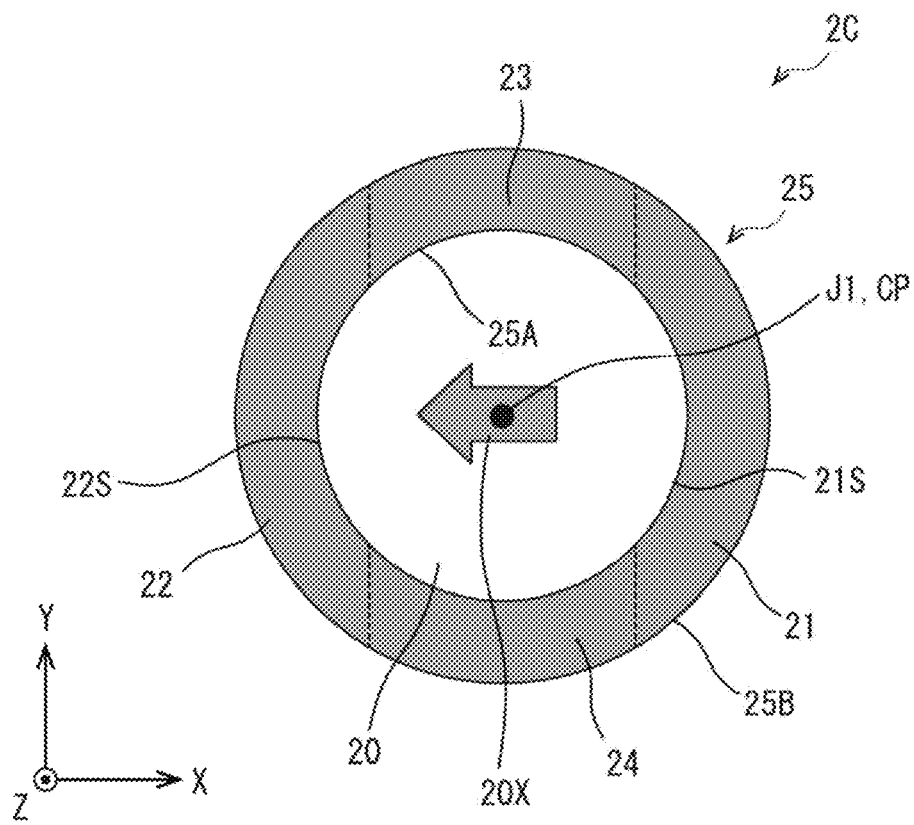
FIG. 15A is a schematic plan view of a magnetic field generation module according to one modification example of the technology.
Figure 15B:
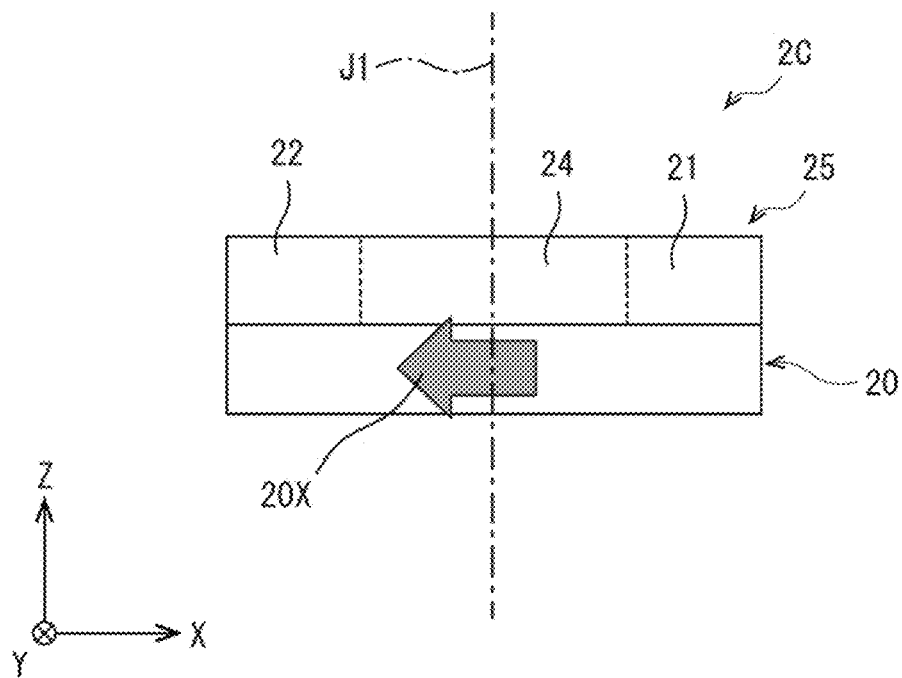
FIG. 15B is a front view of the magnetic field generation module according to the modification example illustrated in FIG. 15A.

In the foregoing example embodiment, as illustrated in FIG. 2, for example, the magnetic field generation module 2 including the first yoke 21 and the second yoke 22 spaced from and opposed to each other in the X-axis direction has been described as an example. However, the technology is not limited thereto. For example, FIGS. 15A and 15B illustrate a magnetic field generation module 2C according to a third modification example of the technology. In the magnetic field generation module 2C, the first yoke 21 and the second yoke 22 may be coupled to and integrated with each other by a third yoke 23 and a fourth yoke 24. Thus, in the magnetic field generation module 2C, the first yoke 21, the third yoke 23, the second yoke 22, and the fourth yoke 24 may be coupled in order, thereby configuring one soft magnetic body unit 25 having an annular shape as a whole. The soft magnetic body unit 25 may include an inner peripheral surface 25A and an outer peripheral surface 25B each having a substantially circular shape in a plan view as viewed in the Z-axis direction.

The third yoke 23 may correspond to a specific but non-limiting example of a "third soft magnetic body" according to one embodiment of the technology. The fourth yoke 24 may correspond to a specific but non-limiting example of a "fourth soft magnetic body" according to one embodiment of the technology. In the magnetic field generation module 2C, the magnet 20 may be magnetized along the X-axis direction, for example, as indicated by the arrow 20X.

Figure 16A:
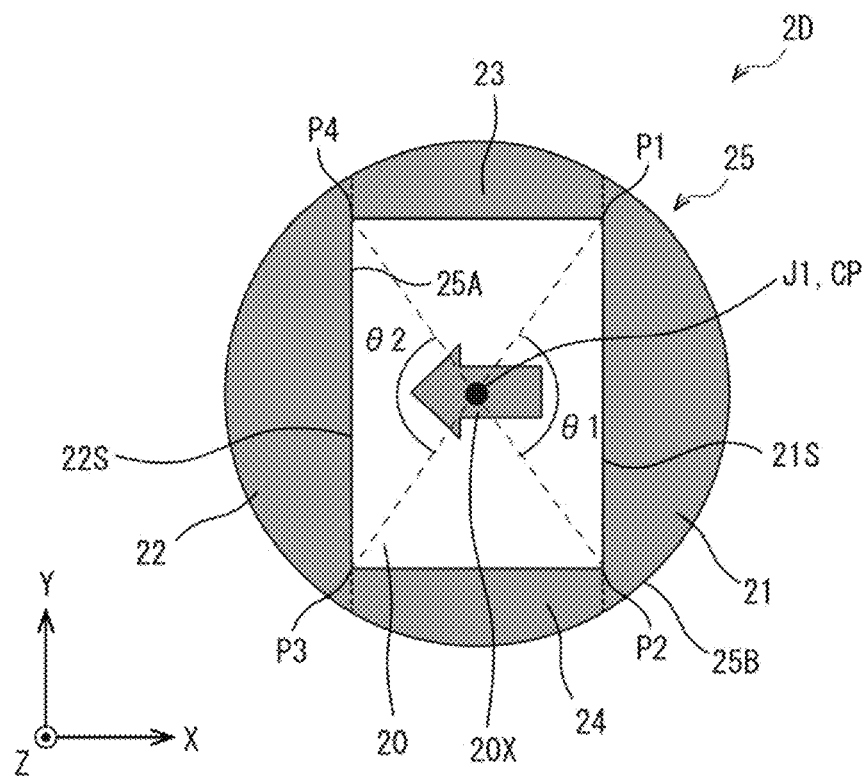
FIG. 16A is a schematic plan view of a magnetic field generation module according to one modification example of the technology.
Figure 16B:
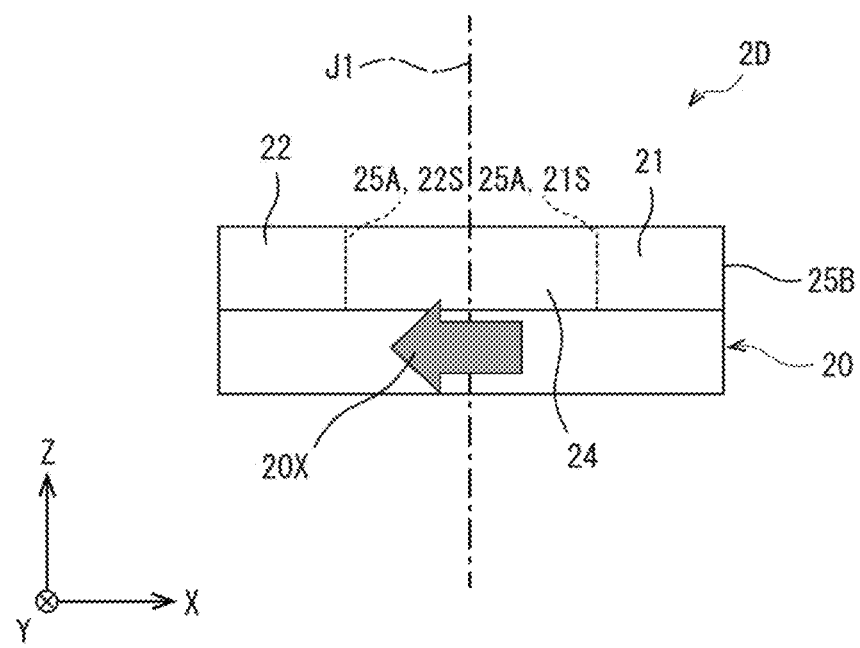
FIG. 16B is a front view of the magnetic field generation module according to the modification example illustrated in FIG. 16A.

Further, FIGS. 16A and 16B illustrate a magnetic field generation module 2D according to a fourth modification example of the technology. In the magnetic field generation module 2D, for example, the soft magnetic body unit 25 may include an inner peripheral surface 25A having a substantially rectangular shape in a plan view as viewed in the Z-axis direction. In the magnetic field generation module 2D, the first opposed surface 21S and the second opposed surface 22S may each constitute a portion of the inner peripheral surface 25A. Accordingly, in the magnetic field generation module 2D, the first to fourth endpoints P1 to P4 may constitute four vertexes of the inner peripheral surface 25A which is substantially rectangular in shape. Note that in the magnetic field generation module 2D, the magnet 20 may be magnetized along the X-axis direction, for example, as indicated by the arrow 20X. Further, in the magnetic field generation module 2D also, the first central angle θ1 and the second central angle θ2 may be greater than or equal to 90 degrees and less than 180 degrees, for example. In some embodiments, the first central angle θ1 and the second central angle θ2 may be greater than or equal to 110 degrees and less than 180 degrees.

Figure 17A:
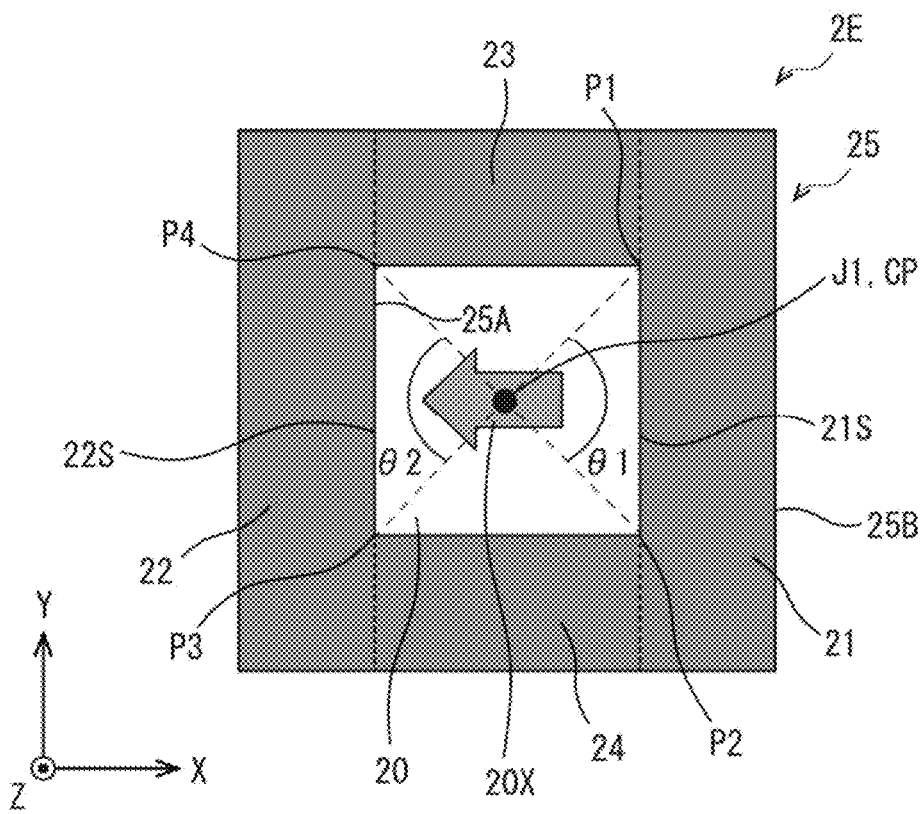
FIG. 17A is a schematic plan view of a magnetic field generation module according to one modification example of the technology.
Figure 17B:
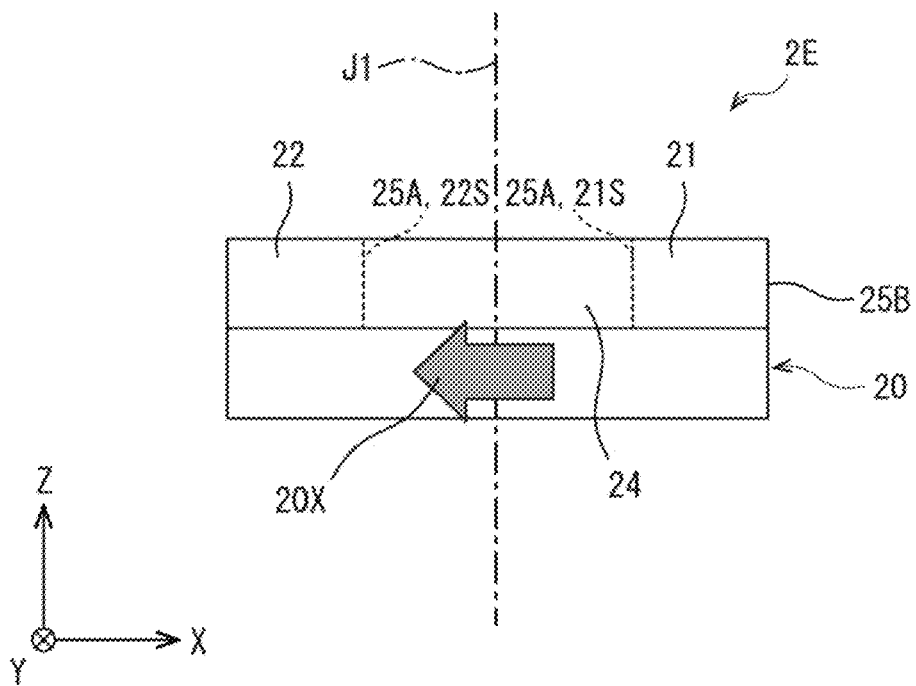
FIG. 17B is a front view of the magnetic field generation module according to the modification example illustrated in FIG. 17A.

Further, FIGS. 17A and 17B illustrate a magnetic field generation module 2E according to a fifth modification example of the technology. In the magnetic field generation module 2E, for example, the soft magnetic body unit 25 may include an inner peripheral surface 25A and an outer peripheral surface 25B each having a substantially rectangular shape in a plan view as viewed in the Z-axis direction. In the magnetic field generation module 2E also, the first opposed surface 21S and the second opposed surface 22S may each constitute a portion of the inner peripheral surface 25A. Accordingly, in the magnetic field generation module 2E also, the first to fourth endpoints P1 to P4 may constitute the four vertexes of the inner peripheral surface 25A which is substantially rectangular in shape. Note that in the magnetic field generation module 2E, the magnet 20 may have a rectangular planar shape coinciding with the outer peripheral surface 25B in a plan view. In the magnetic field generation module 2E, the magnet 20 may be magnetized along the X-axis direction, for example, as indicated by the arrow 20X. Further, in the magnetic field generation module 2E also, as illustrated in FIG. 17A, the first central angle θ1 and the second central angle θ2 may be greater than or equal to 90 degrees and less than 180 degrees, for example. In some embodiments, the first central angle θ1 and the second central angle θ2 may be greater than or equal to 110 degrees and less than 180 degrees.

Figure 18A:
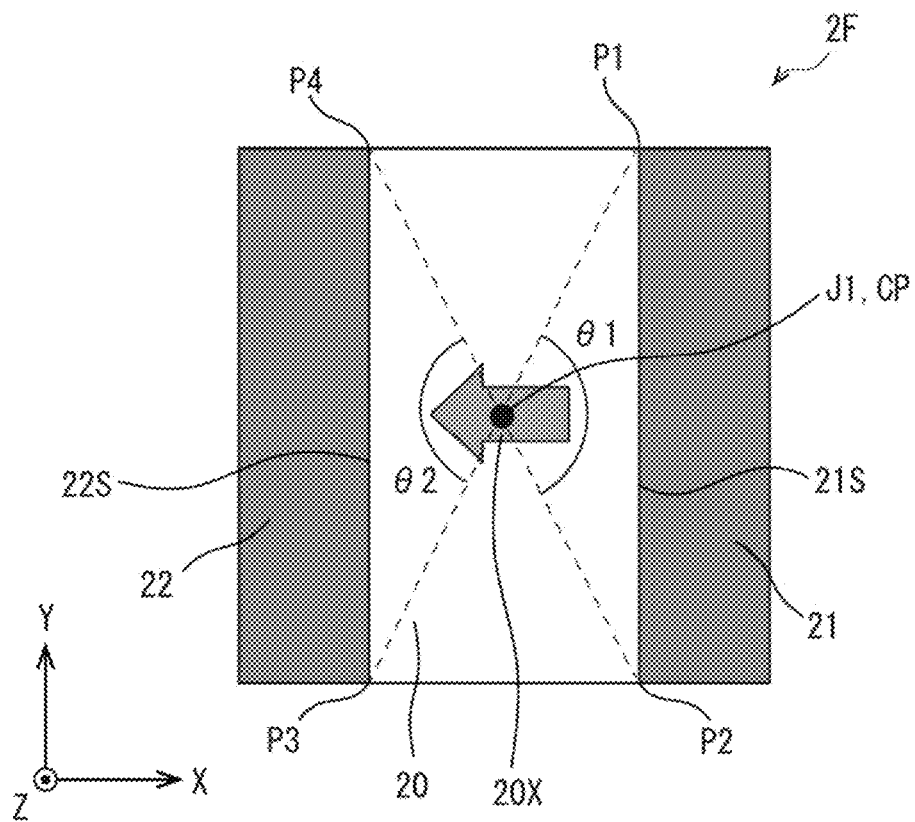
FIG. 18A is a schematic plan view of a magnetic field generation module according to one modification example of the technology.
Figure 18B:
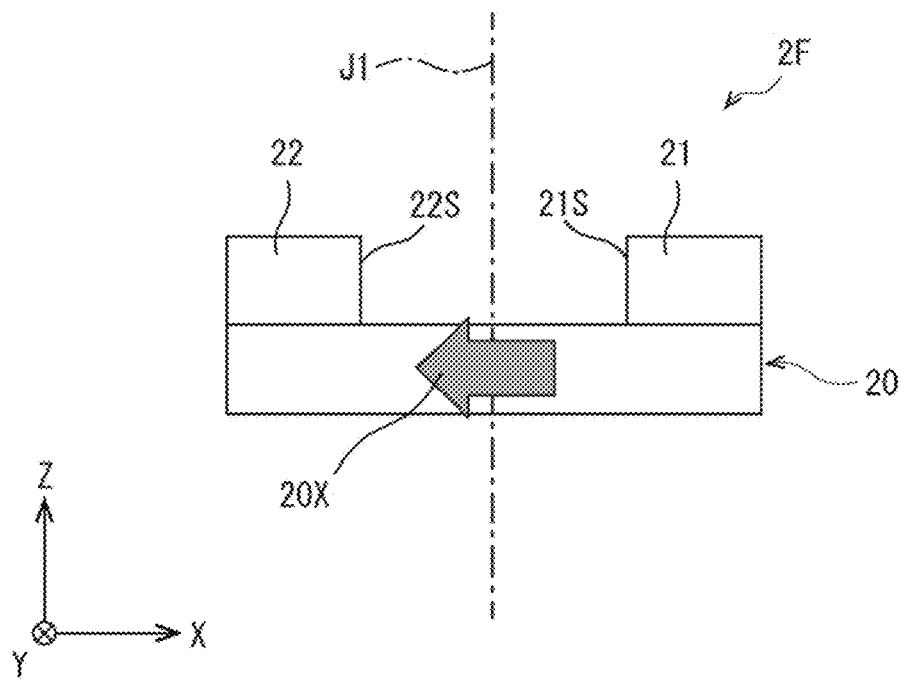
FIG. 18B is a front view of the magnetic field generation module according to the modification example illustrated in FIG. 18A.
Figure 19A:
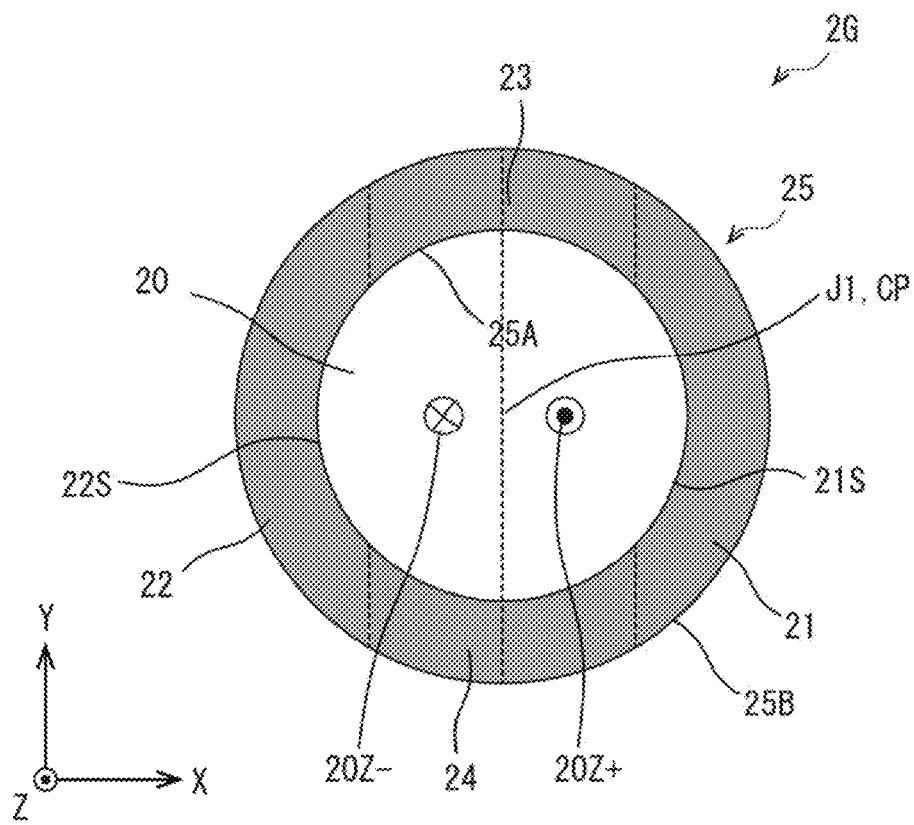
FIG. 19A is a schematic plan view of a magnetic field generation module according to one modification example of the technology.
Figure 19B:
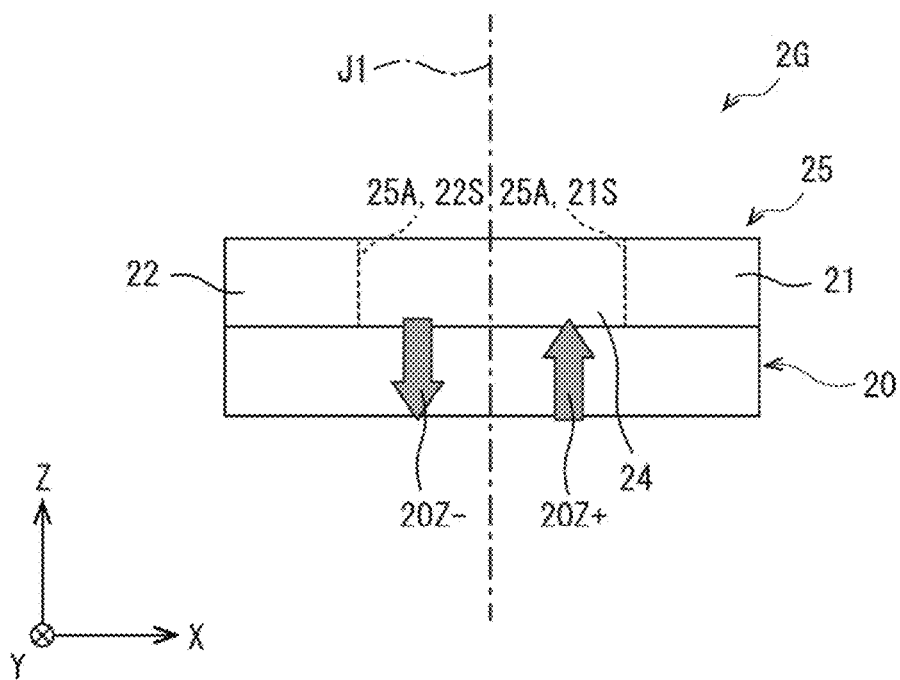
FIG. 19B is a front view of the magnetic field generation module according to the modification example illustrated in FIG. 19A.

Further, FIGS. 18A and 18B illustrate a magnetic field generation module 2F according to a sixth modification example of the technology. In the magnetic field generation module 2F, for example, the magnet 20 may have a rectangular shape in a plan view, and the first yoke 21 and the second yoke 22 may be spaced from and opposed to each other in the X-axis direction. Note that in the magnetic field generation module 2F, the magnet 20 may be magnetized along the X-axis direction, for example, as indicated by the arrow 20X. Further, in the magnetic field generation module 2F also, as illustrated in FIG. 18A, the first central angle θ1 and the second central angle θ2 may be greater than or equal to 90 degrees and less than 180 degrees, for example. In some embodiments, the first central angle θ1 and the second central angle θ2 may be greater than or equal to 110 degrees and less than 180 degrees.

Figure 20A:
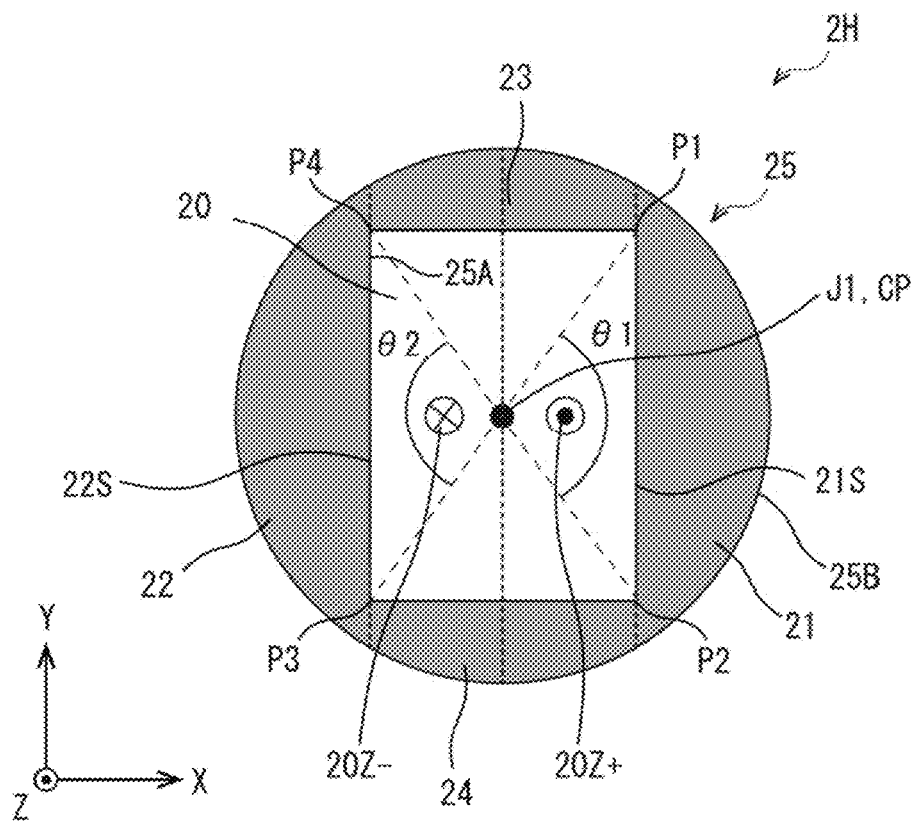
FIG. 20A is a schematic plan view of a magnetic field generation module according to one modification example of the technology.
Figure 20B:
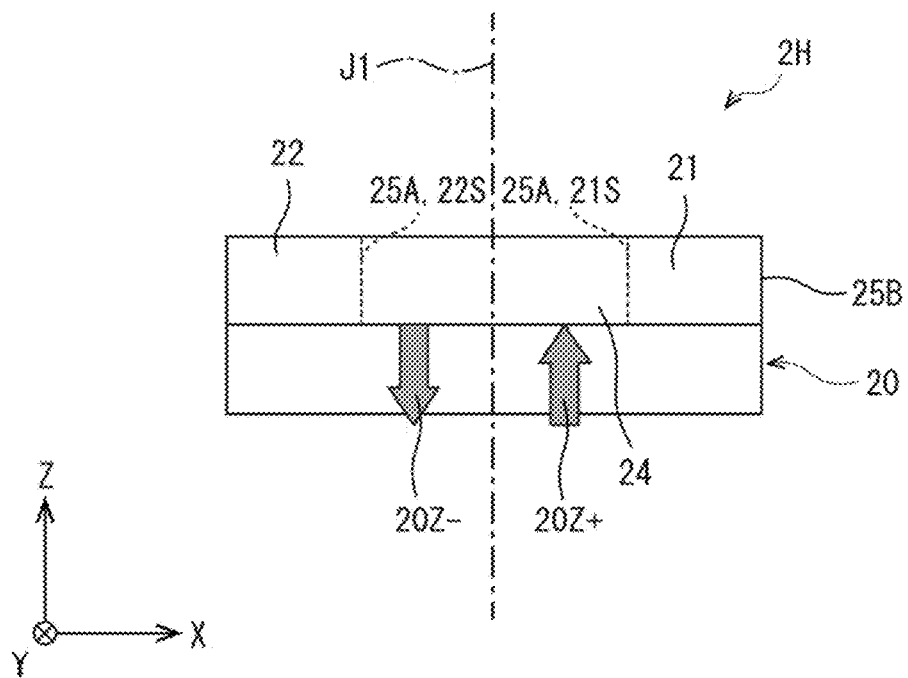
FIG. 20B is a front view of the magnetic field generation module according to the modification example illustrated in FIG. 20A.
Figure 21A:
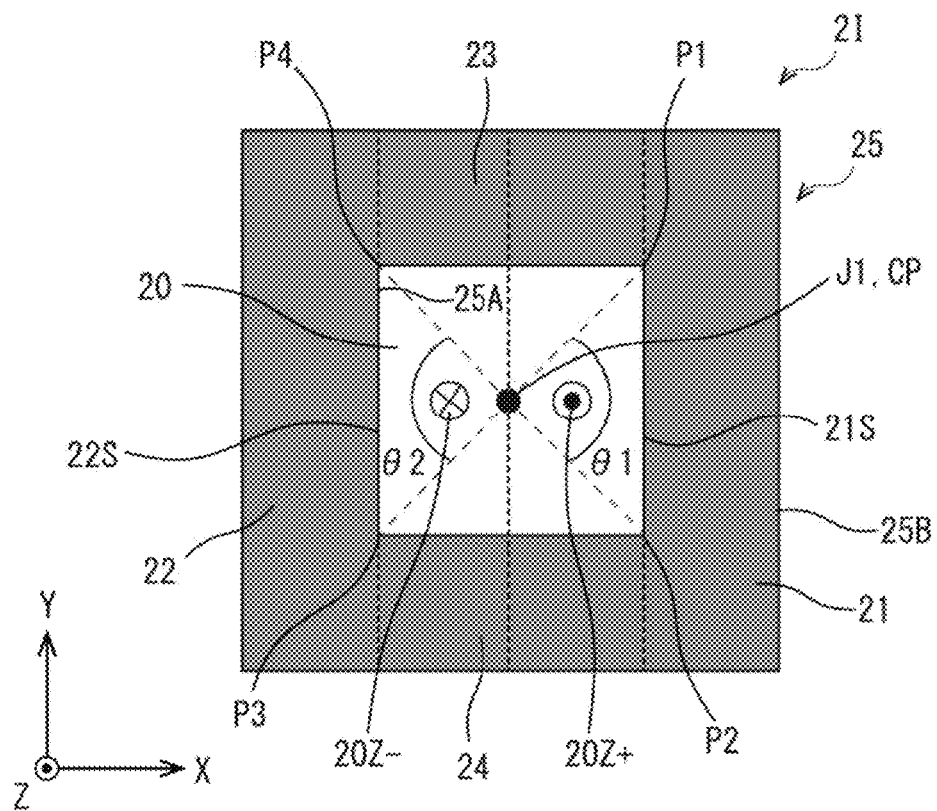
FIG. 21A is a schematic plan view of a magnetic field generation module according to one modification example of the technology.
Figure 21B:
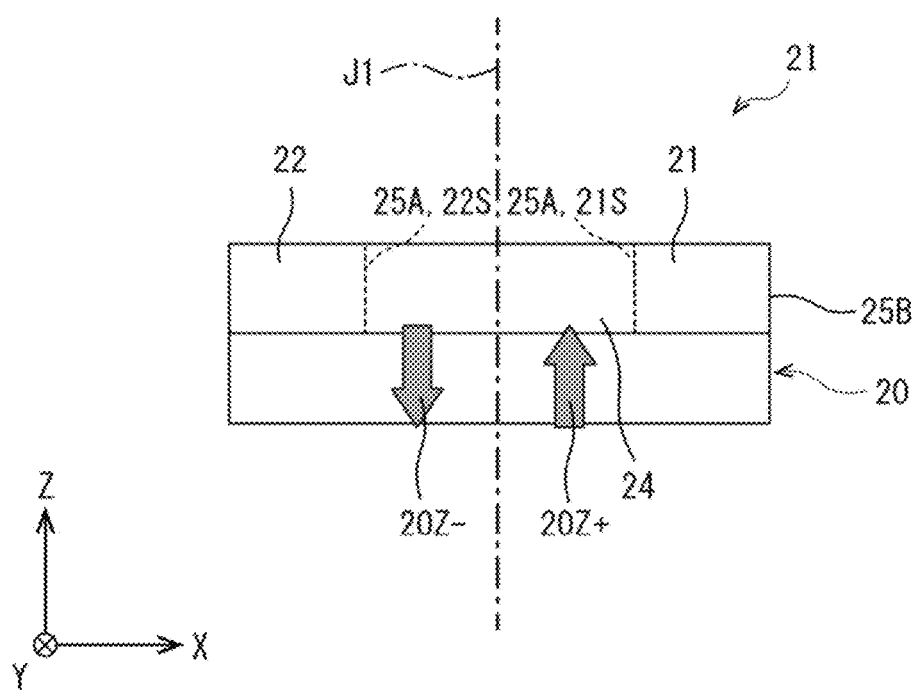
FIG. 21B is a front view of the magnetic field generation module according to the modification example illustrated in FIG. 21A.
Figure 22A:
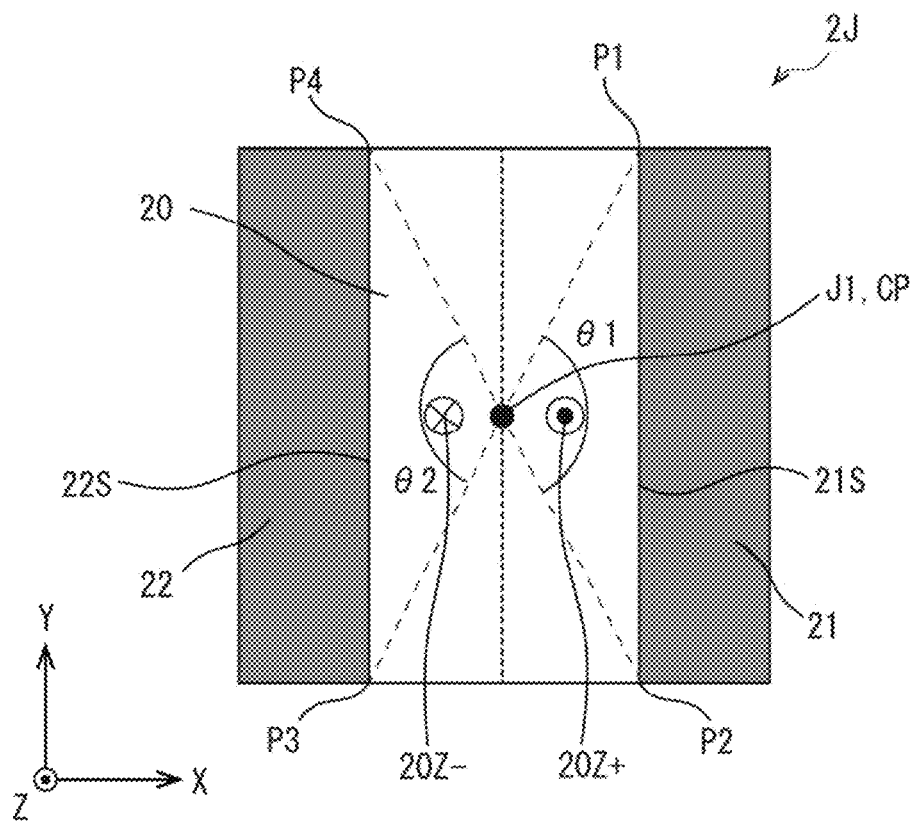
FIG. 22A is a schematic plan view of a magnetic field generation module according to one modification example of the technology.
Figure 22B:
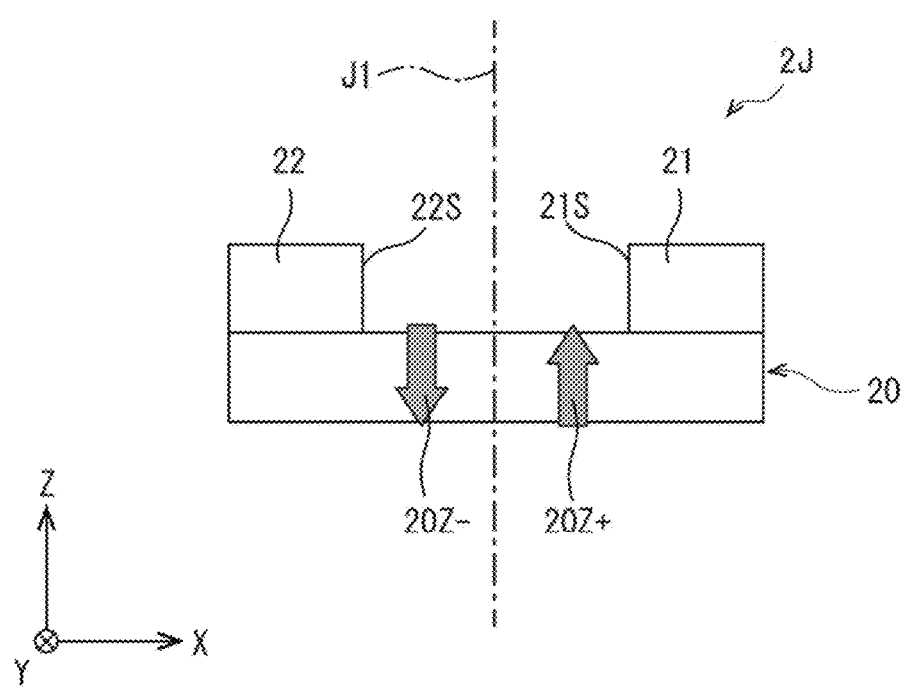
FIG. 22B is a front view of the magnetic field generation module according to the modification example illustrated in FIG. 22A.

In the magnetic field generation modules 2C to 2F according to the third to sixth modification examples described above, the magnet 20 may be magnetized along the X-axis direction; however, the technology is not limited thereto. FIGS. 19A to 22B illustrate magnetic field generation modules 2G to 2J according to seventh to tenth modification examples. In each of the magnetic field generation modules 2G to 2J, for example, the magnet 20 may be magnetized along the Z-axis direction. Note that in the magnetic field generation modules 2H, 2I, and 2J also, as illustrated in FIGS. 20A, 21A, and 22A, respectively, the first central angle θ1 and the second central angle θ2 may be greater than or equal to 90 degrees and less than 180 degrees, for example. In some embodiments, the first central angle θ1 and the second central angle θ2 may be greater than or equal to 110 degrees and less than 180 degrees.

Figure 23A:
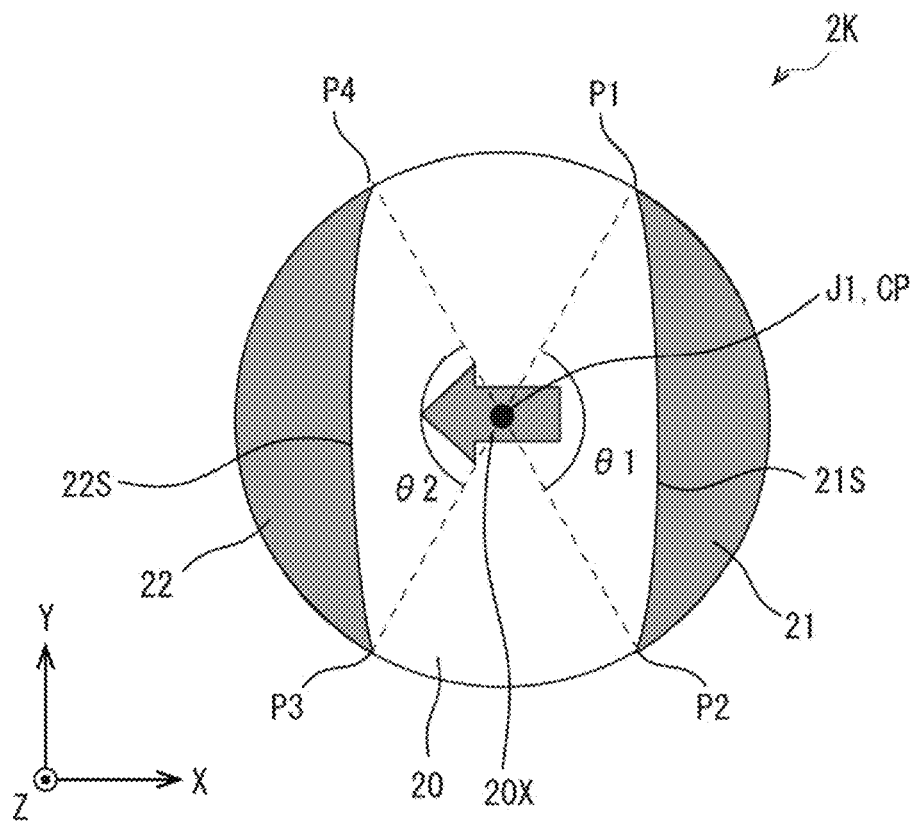
FIG. 23A is a schematic plan view of a magnetic field generation module according to one modification example of the technology.
Figure 23B:
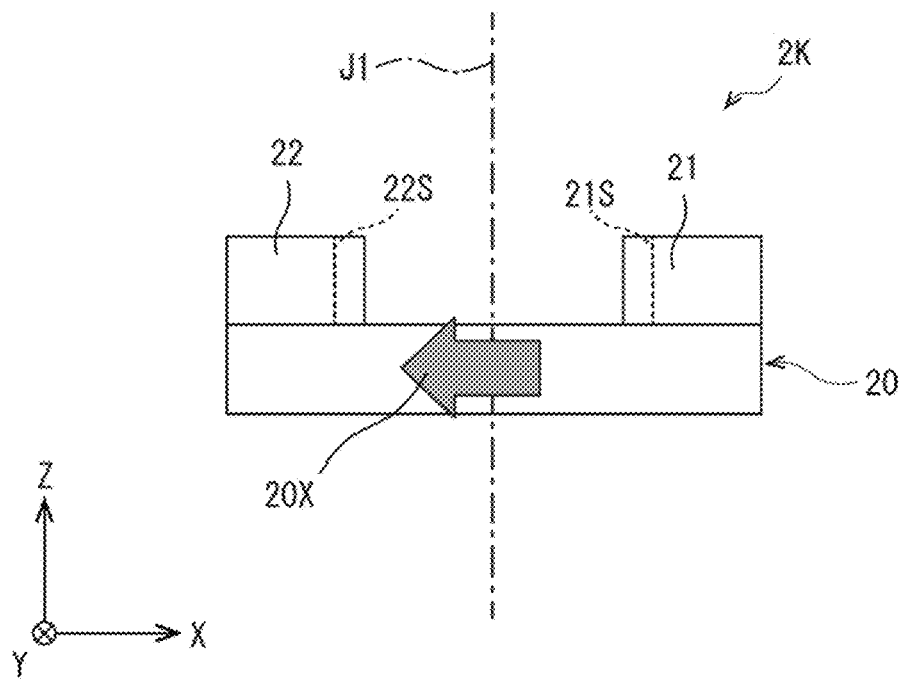
FIG. 23B is a front view of the magnetic field generation module according to the modification example illustrated in FIG. 23A.
Figure 24A:
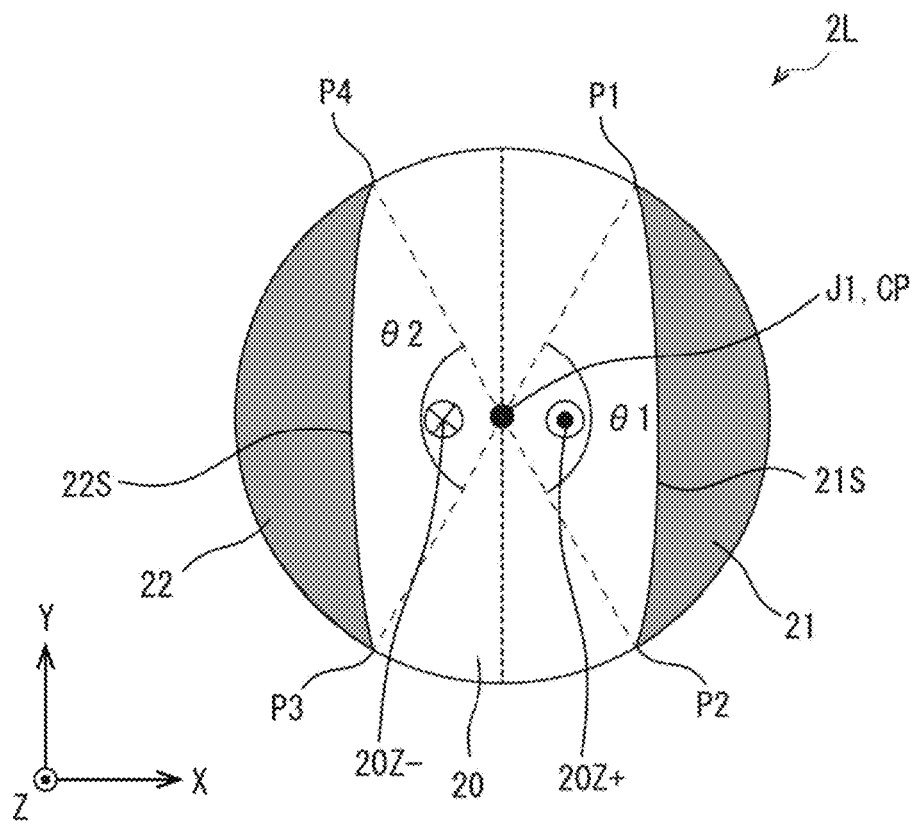
FIG. 24A is a schematic plan view of a magnetic field generation module according to one modification example of the technology.
Figure 24B:
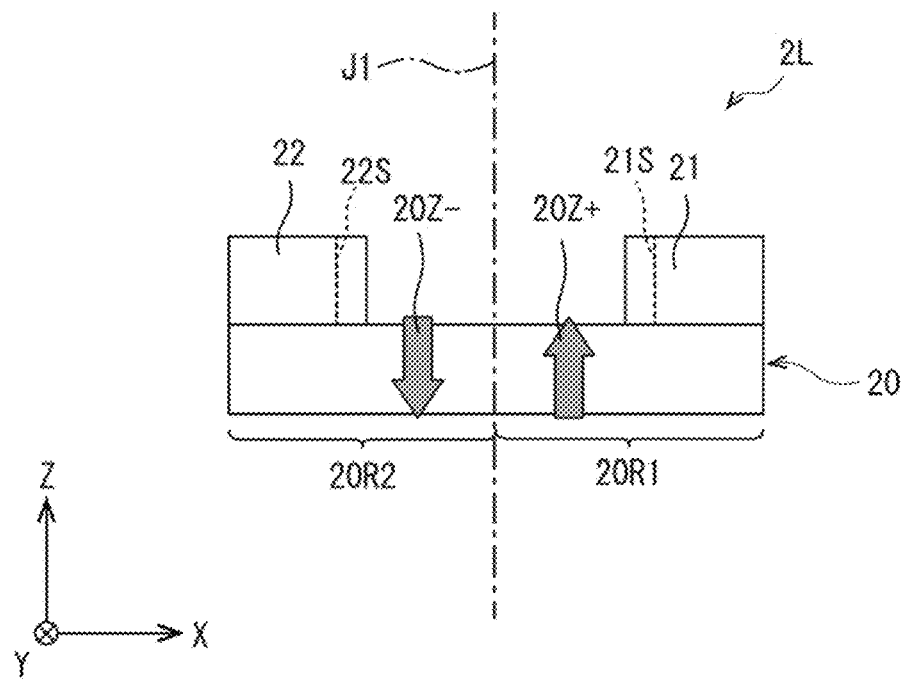
FIG. 24B is a front view of the magnetic field generation module according to the modification example illustrated in FIG. 24A.

In the magnetic field generation module 2A (FIGS. 11A and 11B) according to the first modification example described above, the first opposed surface 21S and the second opposed surface 22S may be curved to protrude toward each other; however, the technology is not limited thereto. FIGS. 23A and 23B illustrate a magnetic field generation module 2K according to an eleventh modification example, and FIGS. 24A and 24B illustrate a magnetic field generation module 2L according to a twelfth modification example. In each of the magnetic field generation module 2K and 2L, for example, the first opposed surface 21S and the second opposed surface 22S may be curved to be recessed away from each other. Note that in the magnetic field generation module 2K (FIGS. 23A and 23B), the magnet 20 may be magnetized in the X-axis direction. In the magnetic field generation module 2L (FIGS. 24A and 24B), the magnet 20 may be magnetized in the Z-axis direction. Further, in the magnetic field generation modules 2K and 2L also, as illustrated in FIGS. 23A and 24A, respectively, the first central angle θ1 and the second central angle θ2 may be greater than or equal to 90 degrees and less than 180 degrees, for example. In some embodiments, the first central angle θ1 and the second central angle θ2 may be greater than or equal to 110 degrees and less than 180 degrees.

Figure 25A:
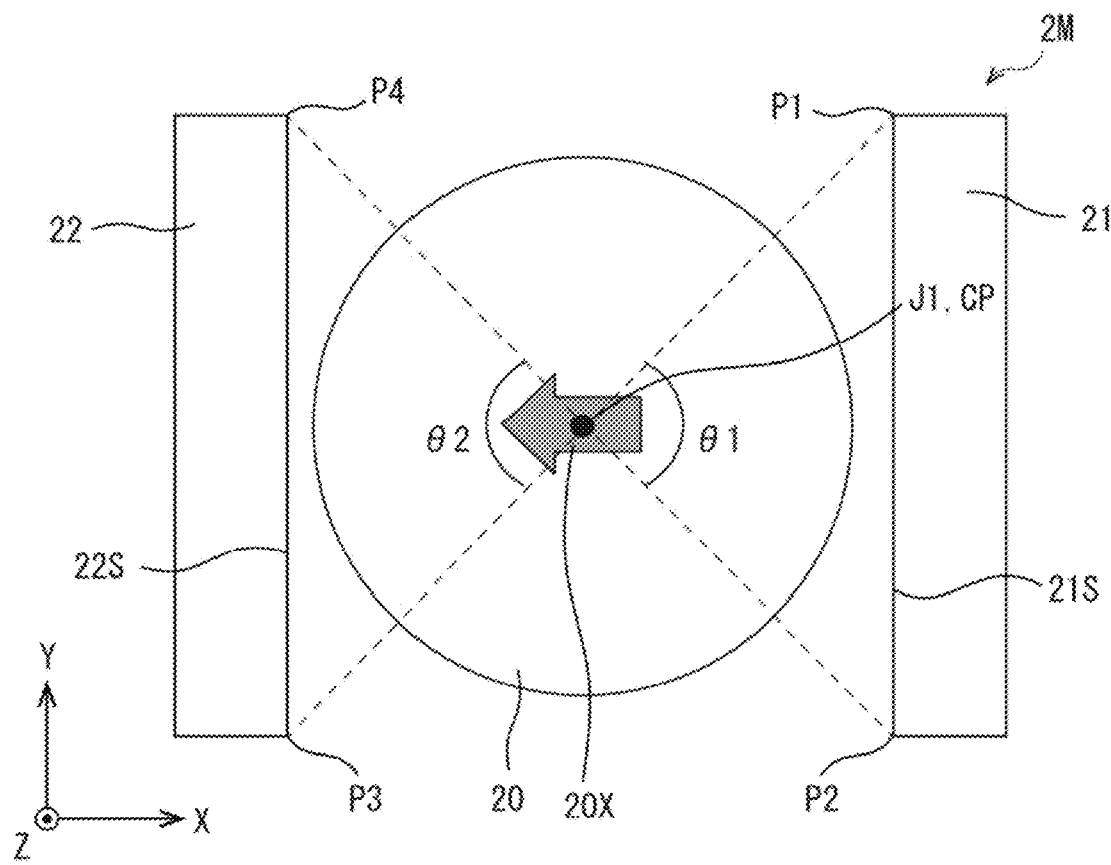
FIG. 25A is a schematic plan view of a magnetic field generation module according to one modification example of the technology.
Figure 25B:
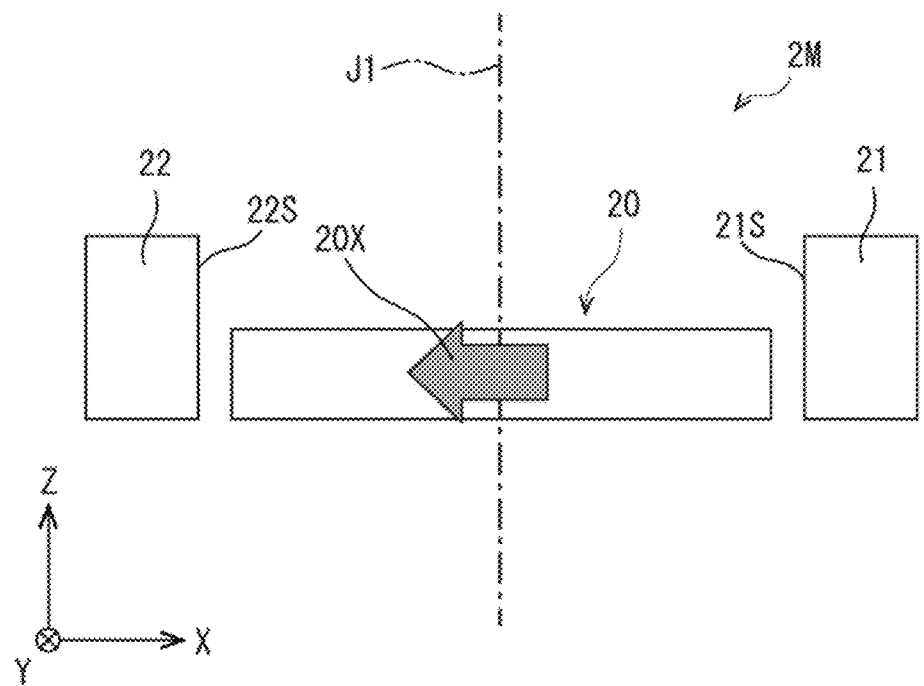
FIG. 25B is a front view of the magnetic field generation module according to the modification example illustrated in FIG. 25A.
Figure 26A:
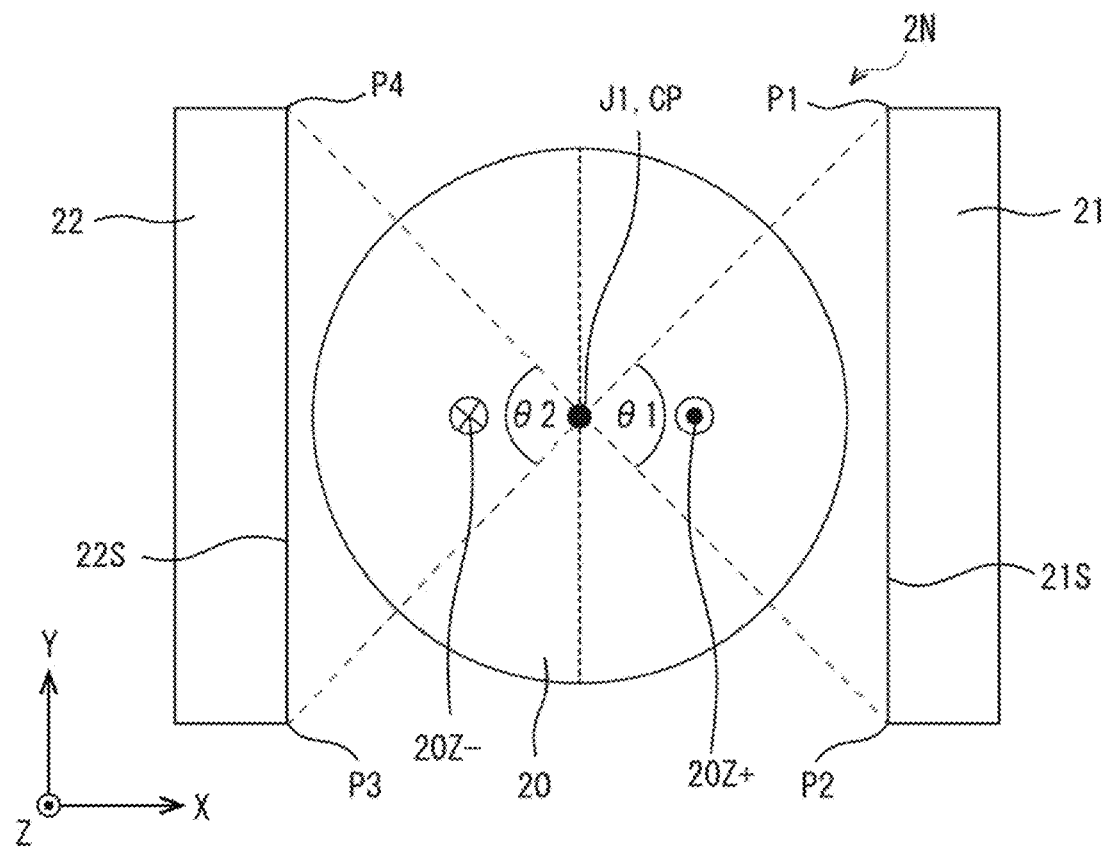
FIG. 26A is a schematic plan view of a magnetic field generation module according to one modification example of the technology.
Figure 26B:
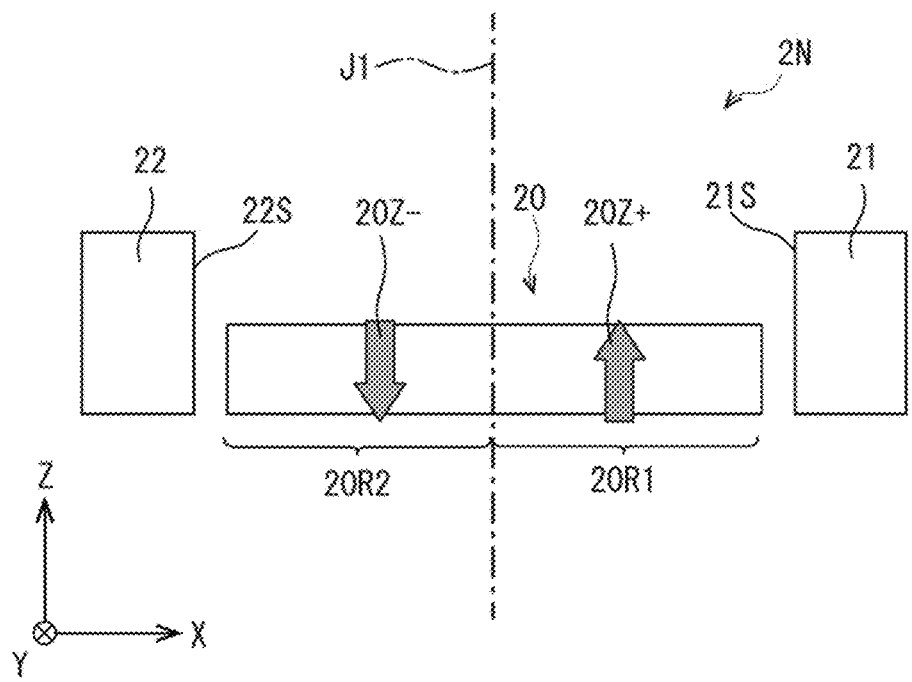
FIG. 26B is a front view of the magnetic field generation module according to the modification example illustrated in FIG. 26A.

In the magnetic field generation module 2A (FIGS. 11A and 11B) according to the first modification example described above, the first yoke 21 and the second yoke 22 overlap the magnet 20 in the Z-axis direction; however, the technology is not limited thereto. FIGS. 25A and 25B illustrate a magnetic field generation module 2M according to a thirteenth modification example, and FIGS. 26A and 26B illustrate a magnetic field generation module 2N according to a fourteenth modification example. In each of the magnetic field generation modules 2M and 2N, for example, the magnet 20 may be provided between the first yoke 21 and the second yoke 22. In each of the magnetic field generation modules 2M and 2N, the magnet 20 may be disposed to overlap the first yoke 21 and the second yoke 22 in the X-axis direction. Note that in the magnetic field generation module 2M (FIGS. 25A and 25B), the magnet 20 may be magnetized along the X-axis direction. In the magnetic field generation module 2N (FIGS. 26A and 26B), the magnet 20 may be magnetized along the Z-axis direction. Further, in the magnetic field generation modules 2M and 2N also, as illustrated in FIGS. 25A and 26A, respectively, the first central angle θ1 and the second central angle θ2 may be greater than or equal to 90 degrees and less than 180 degrees, for example. In some embodiments, the first central angle θ1 and the second central angle θ2 may be greater than or equal to 110 degrees and less than 180 degrees.

Figure 27A:
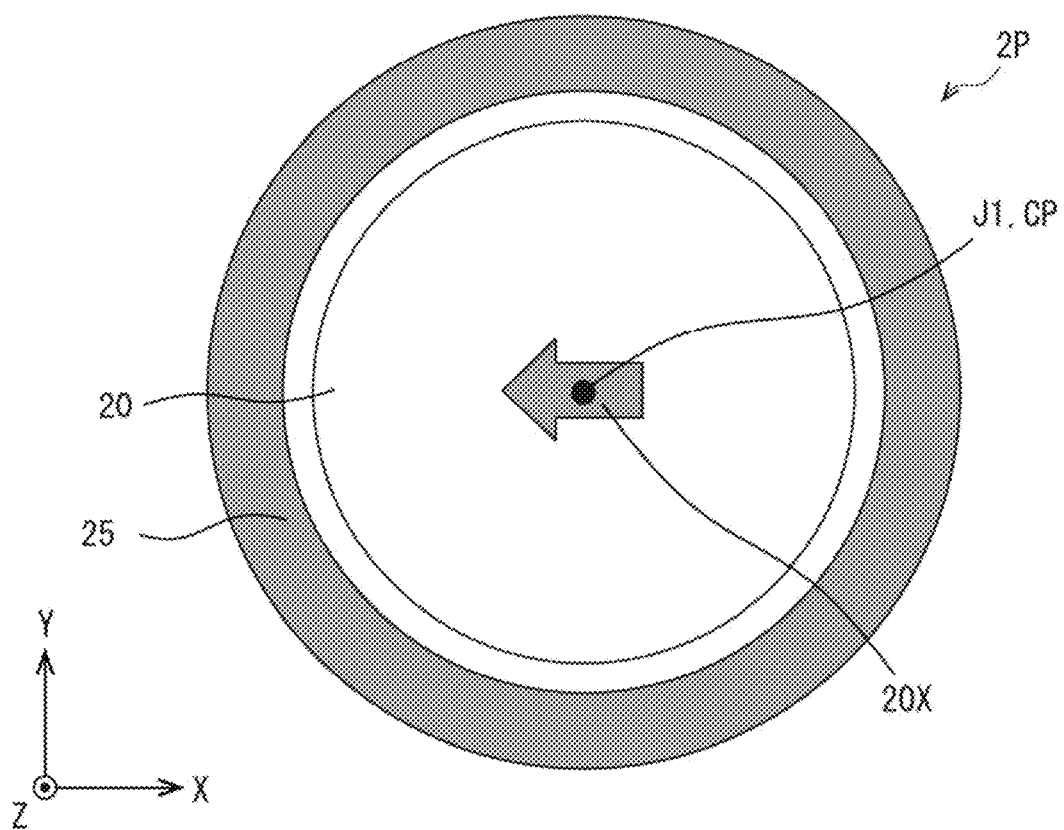
FIG. 27A is a schematic plan view of a magnetic field generation module according to one modification example of the technology.
Figure 27B:
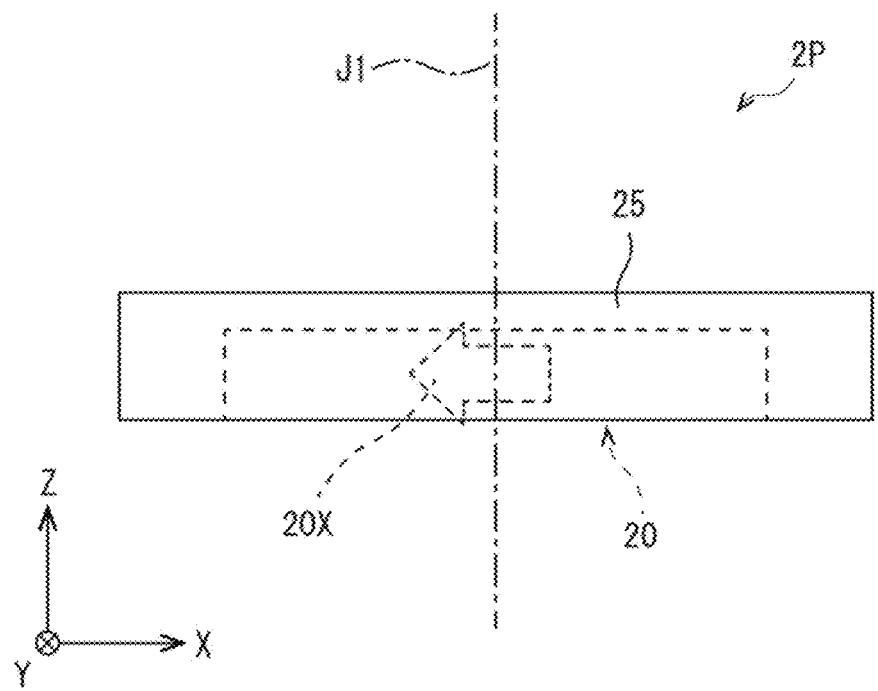
FIG. 27B is a front view of the magnetic field generation module according to the modification example illustrated in FIG. 27A.
Figure 28A:
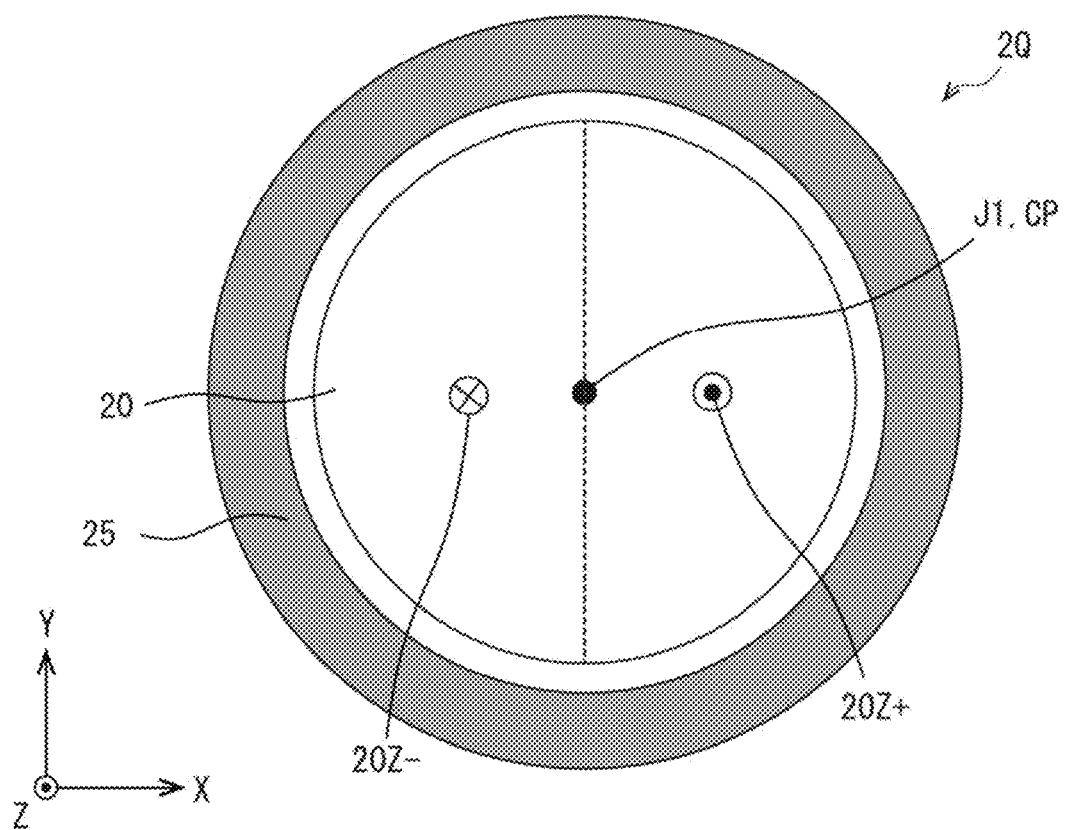
FIG. 28A is a schematic plan view of a magnetic field generation module according to one modification example of the technology.
Figure 28B:
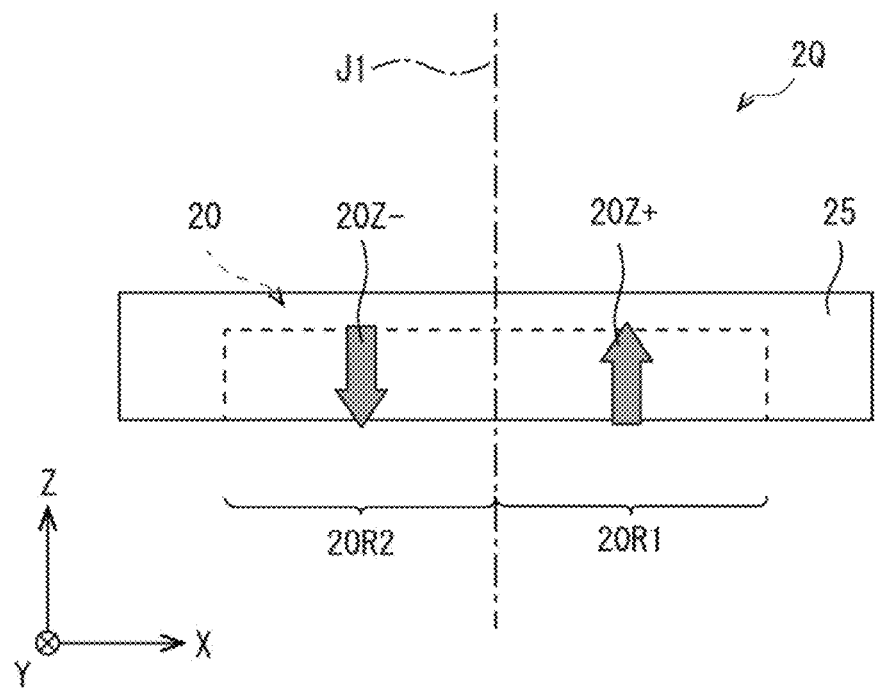
FIG. 28B is a front view of the magnetic field generation module according to the modification example illustrated in FIG. 28A.

Further, FIGS. 27A and 27B illustrate a magnetic field generation module 2P according to a fifteenth modification example, and FIGS. 28A and 28B illustrate a magnetic field generation module 2Q according to a sixteenth modification example. In each of the magnetic field generation modules 2P and 2Q, the magnet 20 may be surrounded by the annular soft magnetic body unit 25 with a spacing therebetween. In each of the magnetic field generation modules 2P and 2Q, the magnet 20 may be disposed to overlap the first yoke 21 and the second yoke 22 in the X-axis direction. Note that in the magnetic field generation module 2P (FIGS. 27A and 27B), the magnet 20 may be magnetized along the X-axis direction. In the magnetic field generation module 2Q (FIGS. 28A and 28B), the magnet 20 may be magnetized along the Z-axis direction.

An embodiment of the technology may include an example in which the magnetic field generator, the first soft magnetic body, and the second soft magnetic body overlap each other in the first direction and an example in which the magnetic field generator, the first soft magnetic body, and the second soft magnetic body do not overlap each other in the first direction. The former example makes it possible to achieve a further reduction in dimension along a plane orthogonal to the first direction, as compared with the latter example. As a result, it is possible to reduce a rotational moment in a case where the magnetic field generation module rotates, and to thereby reduce, for example, misalignment between the magnetic field generation module and the sensor module during rotation.

Figure 29:
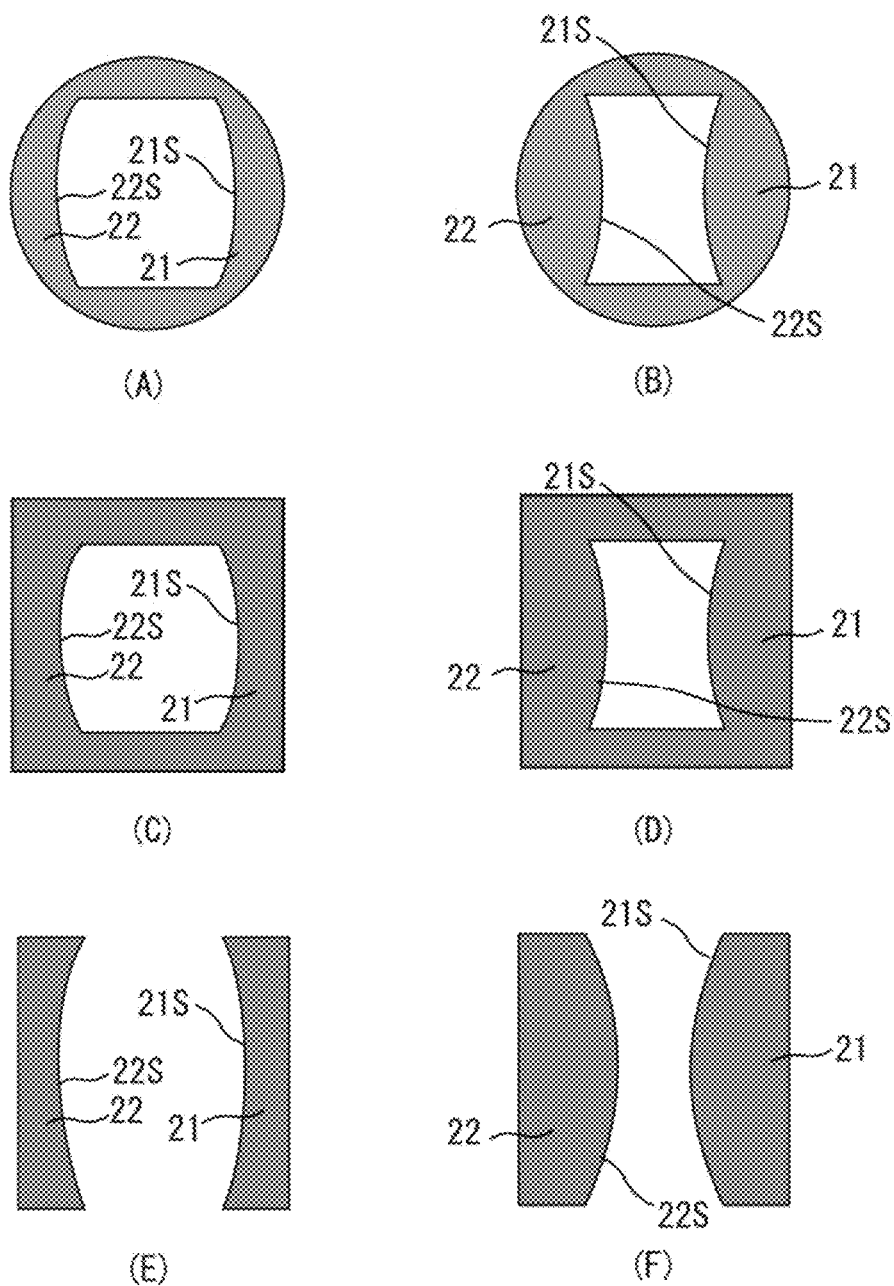
FIG. 29 is a schematic diagram illustrating modification examples of a first soft magnetic body and a second soft magnetic body of the example embodiment of the technology.

The foregoing example embodiment and at least some of the modification examples have been described with reference to an example case in which the first opposed surface 21S of the first yoke 21 and the second opposed surface 22S of the second yoke 22 are flat surfaces parallel to each other. However, in the displacement detection apparatus according to one example embodiment of the technology, as illustrated in parts (A) to (F) of FIG. 29, for example, the first opposed surface 21S and the second opposed surface 22S may be curved surfaces protruding toward each other, or may be curved surfaces recessed away from each other.

Further, the foregoing example embodiment and at least some of the modification examples have been described with reference to an example case in which the first soft magnetic body and the second soft magnetic body are provided on the magnetic field generator; however, this is not limitative. The technology encompasses also a case in which one of the first soft magnetic body or the second soft magnetic body is provided on the magnetic field generator.

It is possible to achieve at least the following configurations from the foregoing embodiments and modification examples of the technology.

(1)
A displacement detection apparatus including:
a magnetic field generator extending along a plane orthogonal to a first direction, and including a first portion and a second portion;
a first soft magnetic body disposed to entirely overlap the first portion in the first direction;
a second soft magnetic body disposed to entirely overlap the second portion in the first direction; and
a magnetic detection element disposed in a region between the first soft magnetic body and the second soft magnetic body, and configured to be subjected to a magnetic field generated by the magnetic field generator, in which
the magnetic field generator, the first soft magnetic body, and the second soft magnetic body are provided to be integrally rotatable, with respect to the magnetic detection element, around a rotation axis extending in the first direction.

(2)
The displacement detection apparatus according to (1), in which
the first soft magnetic body and the second soft magnetic body are opposed to each other in a second direction along the plane, and
the magnetic detection element is positioned to overlap both the first soft magnetic body and the second soft magnetic body in the second direction.

(3)
The displacement detection apparatus according to (1) or (2), in which the magnetic detection element is spaced from all of the magnetic field generator, the first soft magnetic body, and the second soft magnetic body.

(4)
The displacement detection apparatus according to any one of (1) to (3), in which the first soft magnetic body and the second soft magnetic body are substantially identical in material, shape, and size.

(5)
The displacement detection apparatus according to any one of (1) to (4), in which
the first soft magnetic body includes a first opposed surface opposed to the second soft magnetic body,
the first opposed surface includes a first endpoint and a second endpoint located at opposite ends of the first opposed surface in a third direction orthogonal to both the first direction and the second direction,
a first central angle formed by the first endpoint, a center position of the magnetic field generator in the plane, and the second endpoint is greater than or equal to 90 degrees and less than 180 degrees,
the second soft magnetic body includes a second opposed surface opposed to the first soft magnetic body,
the second opposed surface includes a third endpoint and a fourth endpoint located at opposite ends of the second opposed surface in the third direction, and
a second central angle formed by the third endpoint, the center position of the magnetic field generator in the plane, and the fourth endpoint is greater than or equal to 90 degrees and less than 180 degrees.

(6)
The displacement detection apparatus according to (5), in which the first central angle and the second central angle are greater than or equal to 110 degrees and less than 180 degrees.

(7)
The displacement detection apparatus according to (5) or (6), in which the first central angle and the second central angle are substantially equal.

(8)
The displacement detection apparatus according to any one of (1) to (7), in which
the first soft magnetic body and the second soft magnetic body are opposed to each other in a second direction orthogonal to the first direction,
the first soft magnetic body includes a first opposed surface opposed to the second soft magnetic body,
the second soft magnetic body includes a second opposed surface opposed to the first soft magnetic body, and
the first opposed surface and the second opposed surface are curved to protrude toward each other, or curved to be recessed away from each other.

(9)

The displacement detection apparatus according to (8), in which the first opposed surface and the second opposed surface are curved to protrude toward each other, the first opposed surface includes a first endpoint and a second endpoint located at opposite ends of the first opposed surface in a third direction orthogonal to both the first direction and the second direction, the second opposed surface includes a third endpoint and a fourth endpoint located at opposite ends of the second opposed surface in the third direction, a first tangent to the first opposed surface at the first endpoint forms a first angle with respect to the third direction, a second tangent to the first opposed surface at the second endpoint forms a second angle with respect to the third direction, a third tangent to the second opposed surface at the third endpoint forms a third angle with respect to the third direction, a fourth tangent to the second opposed surface at the fourth endpoint forms a fourth angle with respect to the third direction, and the first to fourth angles are all greater than 0 degrees and less than 23 degrees.

(10)

The displacement detection apparatus according to (8) or (9), in which the first opposed surface and the second opposed surface are both curved in a substantially arc shape in a cross section orthogonal to the first direction.

(11)

The displacement detection apparatus according to (8), in which the first opposed surface and the second opposed surface are curved to protrude toward each other, the first opposed surface includes a first endpoint and a second endpoint located at opposite ends of the first opposed surface in a third direction orthogonal to both the first direction and the second direction, the second opposed surface includes a third endpoint and a fourth endpoint located at opposite ends of the second opposed surface in the third direction, and conditional expressions (1) and (2) below are satisfied:

$$0<(\beta 1/\alpha 1)<10 \qquad (1); \text{ and}$$

$$0<(\beta 2/\alpha 2)<10 \qquad (2)$$

where

α1 represents a distance between the first endpoint and the second endpoint,

β1 represents a distance between a first straight line and a first point in the second direction, the first straight line passing through the first endpoint and the second endpoint, the first point lying on the first opposed surface and farthest from the first straight line, α2 represents a distance between the third endpoint and the fourth endpoint, and β2 represents a distance between a second straight line and a second point in the second direction, the second straight line passing through the third endpoint and the fourth endpoint, the second point lying on the second opposed surface and farthest from the second straight line.

(12)

The displacement detection apparatus according to any one of (1) to (8), in which the first soft magnetic body and the second soft magnetic body are opposed to each other in a second direction orthogonal to the first direction, the first soft magnetic body includes a first opposed surface opposed to the second soft magnetic body, the second soft magnetic body includes a second opposed surface opposed to the first soft magnetic body, and the first opposed surface and the second opposed surface are parallel to each other.

(13)

A displacement detection apparatus including:

a magnetic field generator extending along a plane orthogonal to a first direction, and including a first portion and a second portion;

a first soft magnetic body magnetically coupled to the first portion;

a second soft magnetic body magnetically coupled to the second portion; and a magnetic detection element disposed in a region between the first soft magnetic body and the second soft magnetic body, and configured to be subjected to a magnetic field generated by the magnetic field generator, in which the magnetic field generator, the first soft magnetic body, and the second soft magnetic body are provided to be integrally rotatable, with respect to the magnetic detection element, around a rotation axis extending in the first direction, the first soft magnetic body includes a first opposed surface opposed to the second soft magnetic body in a second direction orthogonal to the first direction, the first opposed surface includes a first endpoint and a second endpoint located at opposite ends of the first opposed surface in a third direction orthogonal to both the first direction and the second direction, a first central angle formed by the first endpoint, the rotation axis, and the second endpoint is greater than or equal to 90 degrees and less than 180 degrees, the second soft magnetic body includes a second opposed surface opposed to the first soft magnetic body in the second direction, the second opposed surface includes a third endpoint and a fourth endpoint located at opposite ends of the second opposed surface in the third direction, and a second central angle formed by the third endpoint, the rotation axis, and the fourth endpoint is greater than or equal to 90 degrees and less than 180 degrees.

(14)

The displacement detection apparatus according to (13), in which the first central angle and the second central angle are greater than or equal to 110 degrees and less than 180 degrees.

(15)

A displacement detection apparatus including:

a magnetic field generator extending along a plane orthogonal to a first direction, and including a first portion and a second portion;

a first soft magnetic body magnetically coupled to the first portion;

a second soft magnetic body magnetically coupled to the second portion; and a magnetic detection element disposed in a region between the first soft magnetic body and the second soft magnetic body, and configured to be subjected to a magnetic field generated by the magnetic field generator, in which the magnetic field generator, the first soft magnetic body, and the second soft magnetic body are provided to be integrally rotatable, with respect to the magnetic detection element, around a rotation axis extending in the first direction, the first soft magnetic body includes a first opposed surface opposed to the second soft magnetic body in a second direction orthogonal to the first direction, the second soft magnetic body includes a second opposed surface opposed to the first soft magnetic body in the second direction, and the first opposed surface and the second opposed surface are curved to protrude toward each other, or curved to be recessed away from each other.

(16)

The displacement detection apparatus according to any one of (1) to (15), further including a third soft magnetic body and a fourth soft magnetic body, in which the first soft magnetic body and the second soft magnetic body are coupled to each other by the third soft magnetic body and the fourth soft magnetic body to thereby configure one soft magnetic body unit.

(17)

The displacement detection apparatus according to (16), in which the soft magnetic body unit includes an inner peripheral surface having a substantially circular shape or a substantially polygonal shape in a plan view as viewed in the first direction.

(18)

The displacement detection apparatus according to (16) or (17), in which the soft magnetic body unit includes an outer peripheral surface having a substantially circular shape or a substantially polygonal shape in a plan view as viewed in the first direction.

(19)

The displacement detection apparatus according to any one of (1) to (18), in which the first soft magnetic body and the second soft magnetic body are opposed to each other in a second direction along the plane, the magnetic field generator includes a first region magnetized in a first orientation along the first direction, and a second region magnetized in a second orientation opposite to the first orientation, and the first region and the second region are adjacent to each other in the second direction.

(20)

The displacement detection apparatus according to any one of (1) to (18), in which the magnetic field generator is magnetized in a second direction along the plane, and the first soft magnetic body and the second soft magnetic body are opposed to each other in the second direction.

(21)

The displacement detection apparatus according to any one of (1) to (20), in which an outer edge of the first soft magnetic body and an outer edge of the second soft magnetic body overlap a portion of an outer edge of the magnetic field generator in the first direction.

(22)

The displacement detection apparatus according to any one of (1) to (21), in which an outer edge of the magnetic field generator in the plane has a circular shape.

(23)

A displacement detection system including:

the displacement detection apparatus according to any one of (1) to (22);

a first support supporting the magnetic field generator; and a second support supporting the magnetic detection element.

(24)

A park lock system including the displacement detection system according to (23).

(25)

A pedal system including the displacement detection system according to (23).

According to the displacement detection apparatus, the displacement detection system, the park lock system, and the pedal system of at least one embodiment of the technology, it is possible to achieve high accuracy of displacement detection even if a misalignment occurs between relative positions of the magnetic field generator and the magnetic detection element with respect to each other.

Although the technology has been described hereinabove in terms of the example embodiment and modification examples, the technology is not limited thereto. It should be appreciated that variations may be made in the described example embodiment and modification examples by those skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. The use of the terms first, second, etc. do not denote any order or importance, but rather the terms first, second, etc. are used to distinguish one element from another. The term "substantially" and its variants are defined as being largely but not necessarily wholly what is specified as understood by one of ordinary skill in the art. The term "disposed on/provided on/formed on" and its variants as used herein refer to elements disposed directly in contact with each other or indirectly by having intervening structures therebetween. The term "preferably", "preferred" or the like is non-exclusive and means "preferably", but not limited to. Moreover, no element or component in this disclosure is intended to be dedicated to the public regardless of whether the element or component is explicitly recited in the following claims.

What is claimed is:

1. A displacement detection apparatus comprising:

a magnetic field generator extending along a plane orthogonal to a first direction, and including a first portion and a second portion that define respective regions in the plane where soft magnetic bodies are disposed;

a first soft magnetic body as one of the soft magnetic bodies, the first soft magnetic body having a first surface parallel to the plane and being disposed to allow all of the first surface to be in contact with the first portion;

a second soft magnetic body as another one of the soft magnetic bodies, the second soft magnetic body having a second surface parallel to the plane and being disposed to allow all of the second surface to be in contact with the second portion; and a magnetic detection element disposed in a region between the first soft magnetic body and the second soft magnetic body, and configured to be subjected to a magnetic field generated by the magnetic field generator, wherein the magnetic field generator, the first soft magnetic body, and the second soft magnetic body are provided to be integrally rotatable, with respect to the magnetic detection element, around a rotation axis extending in the first direction.

2. The displacement detection apparatus according to claim 1, wherein the first soft magnetic body and the second soft magnetic body are opposed to each other in a second direction along the plane, and the magnetic detection element is positioned to overlap both the first soft magnetic body and the second soft magnetic body in the second direction.

3. The displacement detection apparatus according to claim 1, wherein the magnetic detection element is spaced from all of the magnetic field generator, the first soft magnetic body, and the second soft magnetic body.

4. The displacement detection apparatus according to claim 1, wherein the first soft magnetic body and the second soft magnetic body are substantially identical in material, shape, and size.

5. The displacement detection apparatus according to claim 1, wherein the first soft magnetic body includes a first opposed surface opposed to the second soft magnetic body, the first opposed surface includes a first endpoint and a second endpoint located at opposite ends of the first opposed surface in a third direction orthogonal to both the first direction and a second direction along the plane, a first central angle formed by the first endpoint, a center position of the magnetic field generator in the plane, and the second endpoint is greater than or equal to 90 degrees and less than 180 degrees, the second soft magnetic body includes a second opposed surface opposed to the first soft magnetic body, the second opposed surface includes a third endpoint and a fourth endpoint located at opposite ends of the second opposed surface in the third direction, and a second central angle formed by the third endpoint, the center position of the magnetic field generator in the plane, and the fourth endpoint is greater than or equal to 90 degrees and less than 180 degrees.

6. The displacement detection apparatus according to claim 5, wherein the first central angle and the second central angle are greater than or equal to 110 degrees and less than 180 degrees.

7. The displacement detection apparatus according to claim 5, wherein the first central angle and the second central angle are substantially equal.

8. The displacement detection apparatus according to claim 1, wherein the first soft magnetic body and the second soft magnetic body are opposed to each other in a second direction orthogonal to the first direction, the first soft magnetic body includes a first opposed surface opposed to the second soft magnetic body, the second soft magnetic body includes a second opposed surface opposed to the first soft magnetic body, and the first opposed surface and the second opposed surface are curved to be recessed away from each other.

9. The displacement detection apparatus according to claim 1, wherein the first soft magnetic body and the second soft magnetic body are opposed to each other in a second direction orthogonal to the first direction, the first soft magnetic body includes a first opposed surface opposed to the second soft magnetic body, the second soft magnetic body includes a second opposed surface opposed to the first soft magnetic body, the first opposed surface and the second opposed surface are curved to protrude toward each other, the first opposed surface includes a first endpoint and a second endpoint located at opposite ends of the first opposed surface in a third direction orthogonal to both the first direction and the second direction, the second opposed surface includes a third endpoint and a fourth endpoint located at opposite ends of the second opposed surface in the third direction, a first tangent to the first opposed surface at the first endpoint forms a first angle with respect to the third direction, a second tangent to the first opposed surface at the second endpoint forms a second angle with respect to the third direction, a third tangent to the second opposed surface at the third endpoint forms a third angle with respect to the third direction, a fourth tangent to the second opposed surface at the fourth endpoint forms a fourth angle with respect to the third direction, and the first to fourth angles are all greater than 0 degrees and less than 23 degrees.

10. The displacement detection apparatus according to claim 8, wherein the first opposed surface and the second opposed surface are both curved in a substantially arc shape in a cross section orthogonal to the first direction.

11. The displacement detection apparatus according to claim 1, wherein the first soft magnetic body and the second soft magnetic body are opposed to each other in a second direction orthogonal to the first direction, the first soft magnetic body includes a first opposed surface opposed to the second soft magnetic body, the second soft magnetic body includes a second opposed surface opposed to the first soft magnetic body, the first opposed surface and the second opposed surface are curved to protrude toward each other, the first opposed surface includes a first endpoint and a second endpoint located at opposite ends of the first opposed surface in a third direction orthogonal to both the first direction and the second direction, the second opposed surface includes a third endpoint and a fourth endpoint located at opposite ends of the second opposed surface in the third direction, and conditional expressions (1) and (2) below are satisfied:

$$0 < (\beta 1/\alpha 1) < 10 \quad (1); \text{ and}$$

$$0 < (\beta 2/\alpha 2) < 10 \quad (2)$$

where $\alpha 1$ represents a distance between the first endpoint and the second endpoint, $\beta 1$ represents a distance between a first straight line and a first point in the second direction, the first straight line passing through the first endpoint and the second endpoint, the first point lying on the first opposed surface and farthest from the first straight line, $\alpha 2$ represents a distance between the third endpoint and the fourth endpoint, and β2 represents a distance between a second straight line and a second point in the second direction, the second straight line passing through the third endpoint and the fourth endpoint, the second point lying on the second opposed surface and farthest from the second straight line.

12. The displacement detection apparatus according to claim 1, wherein
the first soft magnetic body and the second soft magnetic body are opposed to each other in a second direction orthogonal to the first direction,
the first soft magnetic body includes a first opposed surface opposed to the second soft magnetic body,
the second soft magnetic body includes a second opposed surface opposed to the first soft magnetic body, and
the first opposed surface and the second opposed surface are parallel to each other.

13. The displacement detection apparatus according to claim 1, further comprising a third soft magnetic body and a fourth soft magnetic body, wherein
the first soft magnetic body and the second soft magnetic body are coupled to each other by the third soft magnetic body and the fourth soft magnetic body to thereby configure one soft magnetic body unit.

14. The displacement detection apparatus according to claim 13, wherein the soft magnetic body unit includes an inner peripheral surface having a substantially circular shape in a plan view as viewed in the first direction.

15. The displacement detection apparatus according to claim 13, wherein the soft magnetic body unit includes an outer peripheral surface having a substantially circular shape in a plan view as viewed in the first direction.

16. The displacement detection apparatus according to claim 1, wherein
the first soft magnetic body and the second soft magnetic body are opposed to each other in a second direction along the plane,
the magnetic field generator includes a first region magnetized in a first orientation along the first direction, and a second region magnetized in a second orientation opposite to the first orientation, and
the first region and the second region are adjacent to each other in the second direction.

17. The displacement detection apparatus according to claim 1, wherein
the magnetic field generator is magnetized in a second direction along the plane, and
the first soft magnetic body and the second soft magnetic body are opposed to each other in the second direction.

18. The displacement detection apparatus according to claim 1, wherein an outer edge of the first soft magnetic body and an outer edge of the second soft magnetic body overlap a portion of an outer edge of the magnetic field generator in the first direction.

19. The displacement detection apparatus according to claim 1, wherein an outer edge of the magnetic field generator in the plane has a circular shape.

20. A displacement detection system including:
the displacement detection apparatus according to claim 1;
a first support supporting the magnetic field generator; and
a second support supporting the magnetic detection element.

21. A park lock system comprising:
a housing;
a motor provided inside the housing;
a shaft rotatable by the motor;
a lever having a proximal end fixed to the shaft;
a rod having a proximal end attached to a distal end of the lever;
an engagement part provided at a distal end of the rod;
a parking gear with gear teeth, the gear teeth being configured to be engaged with and disengaged from the engagement part; and
the displacement detection system according to claim 20, the displacement detection system being provided at an end of the shaft.

22. A pedal system comprising:
a housing;
a shaft fixed to the housing;
a bearing inside which the shaft is disposed;
a pedal that is rotationally movable about the shaft by the bearing;
a biasing member having a first end coupled to the housing and a second end coupled to the pedal; and
the displacement detection system according to claim 20, the displacement detection system being provided near the bearing.

23. A displacement detection apparatus comprising:
a magnetic field generator extending along a plane orthogonal to a first direction, and including a first portion and a second portion that define respective regions in the plane where soft magnetic bodies are disposed;
a first soft magnetic body as one of the soft magnetic bodies, the first soft magnetic body being magnetically coupled to the first portion;
a second soft magnetic body as another one of the soft magnetic bodies, the second soft magnetic body being magnetically coupled to the second portion; and
a magnetic detection element disposed in a region between the first soft magnetic body and the second soft magnetic body, and configured to be subjected to a magnetic field generated by the magnetic field generator, wherein
the magnetic field generator, the first soft magnetic body, and the second soft magnetic body are provided to be integrally rotatable, with respect to the magnetic detection element, around a rotation axis extending in the first direction,
the first soft magnetic body includes a first opposed surface opposed to the second soft magnetic body in a second direction orthogonal to the first direction,
the first opposed surface includes a first endpoint and a second endpoint located at opposite ends of the first opposed surface in a third direction orthogonal to both the first direction and the second direction,
a first central angle formed by the first endpoint, the rotation axis, and the second endpoint is greater than or equal to 90 degrees and less than 180 degrees,
the second soft magnetic body includes a second opposed surface opposed to the first soft magnetic body in the second direction,
the second opposed surface includes a third endpoint and a fourth endpoint located at opposite ends of the second opposed surface in the third direction, and
a second central angle formed by the third endpoint, the rotation axis, and the fourth endpoint is greater than or equal to 90 degrees and less than 180 degrees.

24. The displacement detection apparatus according to claim 23, wherein the first central angle and the second central angle are greater than or equal to 110 degrees and less than 180 degrees.

25. A displacement detection apparatus comprising:
- a magnetic field generator extending along a plane orthogonal to a first direction, and including a first portion and a second portion that define respective regions in the plane where soft magnetic bodies are disposed;
- a first soft magnetic body as one of the soft magnetic bodies, the first soft magnetic body having a first surface parallel to the plane and being magnetically coupled to the first portion to allow all of the first surface to be in contact with the first portion;
- a second soft magnetic body as another one of the soft magnetic bodies, the second soft magnetic body having a second surface parallel to the plane and being magnetically coupled to the second portion to allow all of the second surface to be in contact with the second portion; and
- a magnetic detection element disposed in a region between the first soft magnetic body and the second soft magnetic body, and configured to be subjected to a magnetic field generated by the magnetic field generator, wherein the magnetic field generator, the first soft magnetic body, and the second soft magnetic body are provided to be integrally rotatable, with respect to the magnetic detection element, around a rotation axis extending in the first direction, the first soft magnetic body includes a first opposed surface opposed to the second soft magnetic body in a second direction orthogonal to the first direction, the second soft magnetic body includes a second opposed surface opposed to the first soft magnetic body in the second direction, and the first opposed surface and the second opposed surface are curved to be recessed away from each other.

* * * * *